(12) United States Patent
Yamamoto

(10) Patent No.: US 9,219,130 B2
(45) Date of Patent: Dec. 22, 2015

(54) METHOD OF MANUFACTURING SEMICONDUCTOR DEVICE

(71) Applicant: Renesas Electronics Corporation, Kawasaki-Shi (JP)

(72) Inventor: Yoshiki Yamamoto, Kanagawa (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/469,371

(22) Filed: Aug. 26, 2014

(65) Prior Publication Data

US 2015/0140768 A1 May 21, 2015

(30) Foreign Application Priority Data

Nov. 18, 2013 (JP) ................................. 2013-238325

(51) Int. Cl.
*H01L 21/02* (2006.01)
*H01L 29/66* (2006.01)

(52) U.S. Cl.
CPC .............................. *H01L 29/66477* (2013.01)

(58) Field of Classification Search
USPC ........................................................ 438/300
See application file for complete search history.

(56) References Cited

U.S. PATENT DOCUMENTS

| 6,855,589 B2 | 2/2005 | Mori |
| 2003/0059995 A1 | 3/2003 | Hsu |
| 2004/0041216 A1 | 3/2004 | Mori |
| 2005/0121719 A1 | 6/2005 | Mori |
| 2009/0311836 A1* | 12/2009 | Cartier et al. ................. 438/163 |
| 2013/0011975 A1* | 1/2013 | Cheng et al. .................. 438/151 |

FOREIGN PATENT DOCUMENTS

| JP | 2003-158200 A | 5/2003 |
| JP | 2004-095639 A | 3/2004 |

* cited by examiner

*Primary Examiner* — Asok K Sarkar
(74) *Attorney, Agent, or Firm* — McGinn IP Law Group, PLLC.

(57) ABSTRACT

A performance of a semiconductor device is improved. A gate electrode is formed on an SOI substrate via a gate insulating film, and a laminated film including an insulating film IL2 and an insulating film IL3 on the insulating film IL2 is formed on the SOI substrate so as to cover the gate electrode, and then, a sidewall spacer formed of the laminated film is formed on a side wall of the gate electrode by etching back the laminated film. Then, a semiconductor layer is epitaxially grown on a semiconductor layer of the SOI substrate SUB which is not covered with the gate electrode and the sidewall spacer but is exposed, and then, an oxide film is formed on a surface of the semiconductor layer by oxidizing the surface of the semiconductor layer. Then, the insulating film IL3 forming the sidewall spacer is removed.

20 Claims, 32 Drawing Sheets

US 9,219,130 B2

METHOD OF MANUFACTURING SEMICONDUCTOR DEVICE

CROSS-REFERENCE TO RELATED APPLICATION

The present application claims priority from Japanese Patent Application No. 2013-238325 filed on Nov. 18, 2013, the content of which is hereby incorporated by reference into this application.

TECHNICAL FIELD OF THE INVENTION

The present invention relates to a method of manufacturing a semiconductor device, and can be suitably utilized for, for example, a method of manufacturing a semiconductor device provided with a MISFET.

BACKGROUND

A MISFET is formed by forming a gate electrode on a substrate via a gate insulating film and by forming a source/drain region on the substrate.

There is also a technique of forming a MISFET by growing an epitaxial semiconductor layer for a source/drain on a substrate.

Japanese Patent Application Laid-Open Publication No. 2004-95639 (Patent Document 1) and Japanese Patent Application Laid-Open Publication No. 2003-158200 (Patent Document 2) disclose techniques related to a semiconductor device in which a MISFET is formed by growing an epitaxial layer for a source/drain.

SUMMARY

It is desired to improve a performance of a semiconductor device in which an epitaxial semiconductor layer for a source/drain of a MISFET is grown on a substrate as much as possible. Alternatively, it is desired to improve a manufacturing yield of the semiconductor device. Alternatively, it is desired to improve reliability of the semiconductor device. Alternatively, it is desired to achieve two or three of them described above.

Other preferred aims and novel characteristics will be apparent from the description of the present specification and the accompanying drawings.

According to one embodiment, a method of manufacturing a semiconductor device includes: a step of forming a gate electrode on a semiconductor substrate via a gate insulating layer; a step of forming, on the semiconductor substrate, a laminated film including a first insulating film and a second insulating film on the first insulating film so as to cover the gate electrode; and a step of forming a first side wall insulating film formed of the laminated film on side walls of the gate electrode by etching back the laminated film. The method of manufacturing the semiconductor device further includes: a step of epitaxially growing a semiconductor layer on the semiconductor substrate that is not covered by the gate electrode and the first side wall insulating film but is exposed; a step of forming an oxide film on a surface of the semiconductor layer by oxidizing the surface of the semiconductor layer; and a step of removing the second insulating film forming the first side wall insulating film after the step of forming the oxide film.

According to one embodiment, the performance of the semiconductor device can be improved. Alternatively, the manufacturing yield of the semiconductor device can be improved. Alternatively, the reliability of the semiconductor device can be improved. Alternatively, two or three of them described above can be achieved.

BRIEF DESCRIPTIONS OF THE DRAWINGS

DETAILED DESCRIPTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments will be described in detail based on drawings. Note that components having the same function are denoted by the same reference symbols throughout all drawings for describing the embodiments, and the repetitive description thereof will be omitted. Note that components having the same function are denoted by the same reference symbols throughout all drawings for describing the embodiments, and the repetitive description thereof is omitted. In addition, in the following embodiments, the description of the same or similar portions is not repeated unless particularly required.

Also, in drawings used in the embodiments, hatching is omitted even in a cross-sectional view in some cases so as to make the drawings easy to see. Also, hatching is used even in a plan view in some cases so as to make the drawings easy to see.

Embodiment

Method of Manufacturing Semiconductor Device

Steps of manufacturing a semiconductor device according to the present embodiment will be explained with reference to the drawings. The semiconductor device according to the present embodiment is a semiconductor device provided with a MISFET (Metal Insulator Semiconductor Field Effect Transistor), and a method of manufacturing the semiconductor device according to the present embodiment is a method of manufacturing the semiconductor device provided with the MISFET.

Figure 1:
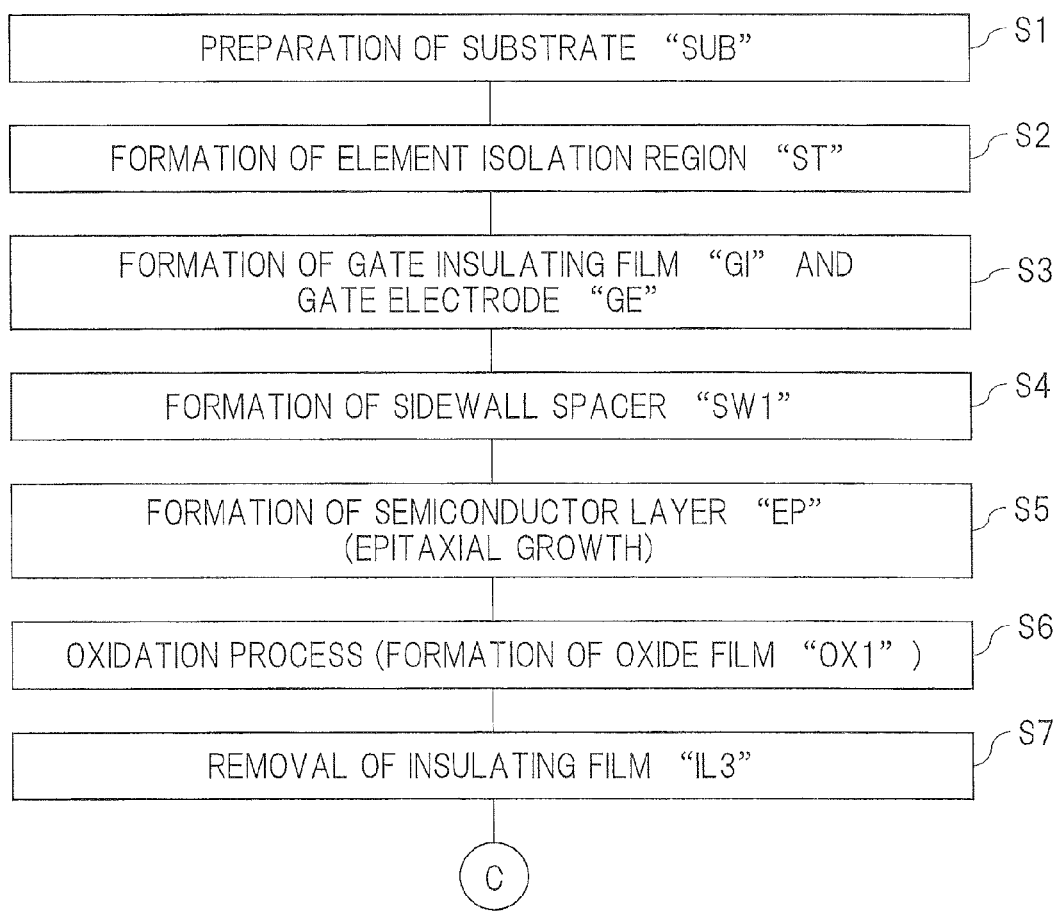
FIG. 1 is a process flowchart illustrating a step of manufacturing a semiconductor device according to one embodiment.
Figure 2:
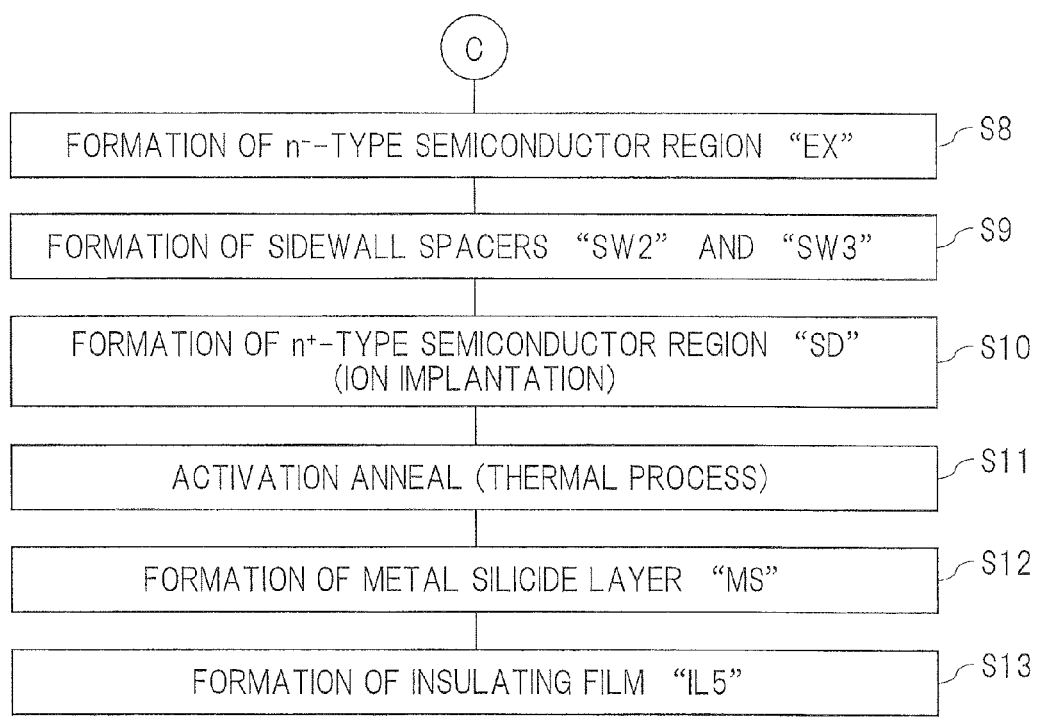
FIG. 2 is a process flowchart illustrating a step of manufacturing the semiconductor device according to one embodiment.

FIG. 1 and FIG. 2 are process flowcharts illustrating steps of manufacturing the semiconductor device according to the present embodiment. The process flow of FIG. 2 is performed after the process flow of FIG. 1. FIG. 3 to FIG. 39 are cross-sectional views of a principal part or plan views of a principal part during steps of manufacturing a semiconductor device according to the present embodiment. From among FIG. 3 to FIG. 39, FIG. 5, FIG. 8 and FIG. 25 are the plan views of the principal part, and FIG. 3, FIG. 4, FIG. 6, FIG. 7, FIG. 9 to FIG. 24 and FIG. 26 to FIG. 39 are the cross-sectional views of the principal part.

Figure 3:
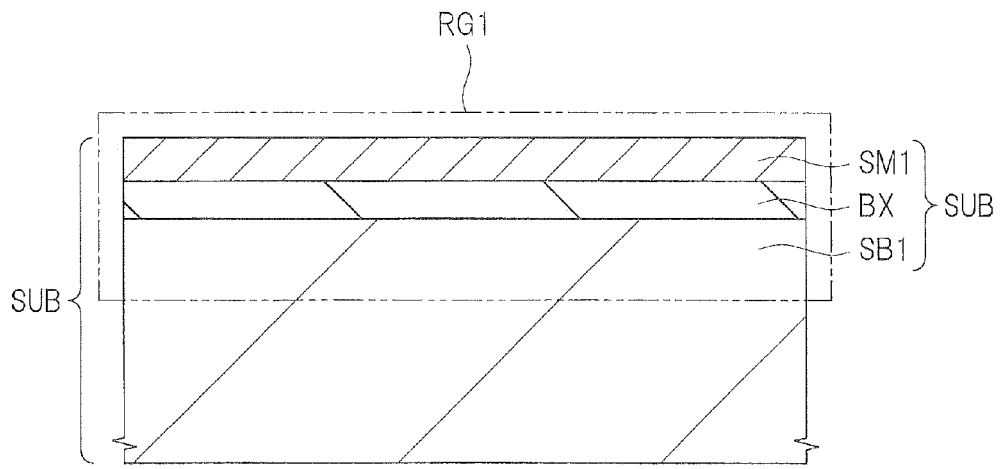
FIG. 3 is a cross-sectional view of a principal part during steps of manufacturing the semiconductor device according to one embodiment.

First, as illustrated in FIG. 3, an SOI (SOI: Silicon On Insulator) substrate SUB is prepared as a semiconductor substrate (step S1 of FIG. 1).

The SOI substrate SUB includes: a substrate (semiconductor substrate, supporting substrate) SB1 made of single crystal silicon or others serving as a supporting substrate; an insulating layer (buried insulating film, buried oxide film, BOX (buried oxide) layer) BX formed on a main surface of the substrate SB1 and made of silicon oxide or others; and a semiconductor layer (SOI layer) SM1 formed on an upper surface of the insulating layer BX and made of single crystal silicon or others. The substrate SB1 is a supporting substrate that supports the insulating layer EX and structures upper than the insulating layer. The SOI substrate SUB is formed of the substrate SB1, the insulating layer EX and the semiconductor layer SM1. The SOI substrate SUB includes the semiconductor layer SM1 in the most upper layer thereof, and a semiconductor element such as the MISFET is formed on the semiconductor layer SM1, and therefore, the SIO substrate can be regarded as one type of a semiconductor substrate.

A thickness of the semiconductor layer SM1 is smaller than a thickness of the substrate SB1 which is the supporting substrate. The thickness of the semiconductor layer SM1 can be, for example, about 3 to 20 nm.

The SOI substrate SUB can be manufactured by using various methods. For example, the SOI substrate SUB can be formed by adhering and bonding a semiconductor substrate (silicon substrate) formed with an oxide film on a surface thereof and another semiconductor substrate (silicon substrate) by applying high heat and pressure thereto, and then, thinning either one silicon layer (silicon substrate). Alternatively, the SOI substrate SUB can be formed by a SIMOX (Silicon Implanted Oxide) method of ion-implanting $O_2$ (oxygen) to a main surface of a semiconductor substrate made of Si (silicon) at high energy and bonding the Si (silicon) and the oxygen by a subsequent thermal process to form a buried oxide layer (BOX layer) at a position that is slightly deeper than the surface of the semiconductor substrate. Further, the SOI substrate SUB can be also formed by using other methods such as a smart cut process.

Figure 4:
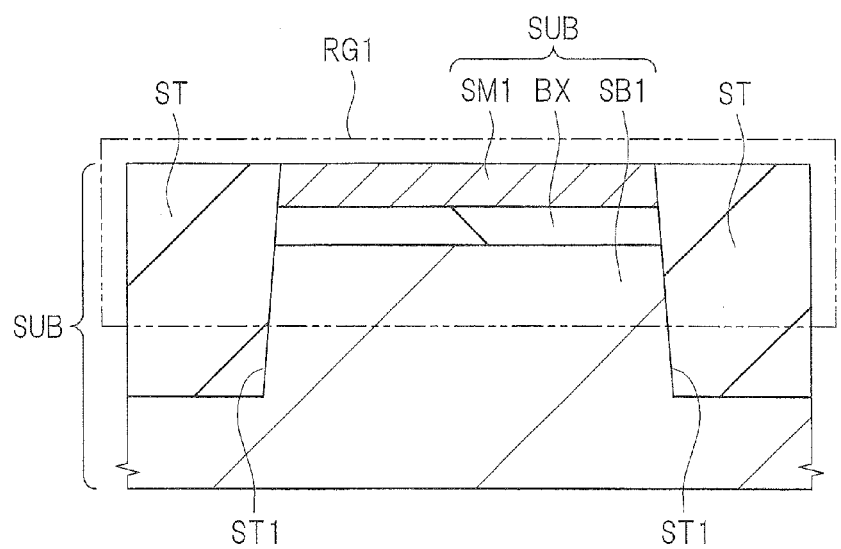
FIG. 4 is a cross-sectional view of a principal part during steps of manufacturing the semiconductor device, continued from FIG. 3.

Then, as illustrated in FIG. 4, an element isolation region (element isolation structure) ST is formed on the SOI substrate SUB (step S2 of FIG. 1).

The element isolation region ST is formed of an insulating body (for example, silicon oxide) buried into an element isolation trench (trench for element isolation) ST1. The element isolation trench ST1 and the element isolation region ST that fills the trench penetrate through the semiconductor layer SM1, bottoms of them reach the substrate SB1, and a lower portion of the element isolation region ST is positioned within the substrate SB1. That is, the element isolation region ST is buried in the element isolation trench ST1 that is formed to extend through the semiconductor layer SM1, the insulating layer BX and the substrate SB1. Therefore, the element isolation region ST is partially positioned to be lower than a lower surface of the insulating layer BX.

More specifically, the element isolation region ST can be formed as, for example, follows. That is, first, the element insulating trench ST1 is formed on the main surface of the SOI substrate SUB (semiconductor layer SM1) by using a photolithography technique, a dry etching technique and others, the element insulating trench penetrating through the semiconductor layer SM1 and the insulating layer BX so that a bottom portion of the trench reaches the substrate SB1. The element isolation trench ST1 penetrates through the semiconductor layer SM1 and the insulating layer BX so that the bottom portion of the element isolation trench ST1 reaches the substrate SB1 (the bottom portion of the element isolation trench ST1 is positioned in the middle of the thickness of the substrate SB1), and therefore, the substrate SB1 is exposed from the bottom portion of the element isolation trench ST1. Then, the element isolation region ST can be formed by filling the insulating film into the element isolation trench ST1 by using a film deposition technique, a CMP technique, and others. For example, the element isolation region ST formed of the insulating film filled in the element isolation trench ST1 can be formed by forming the insulating film to fill the element isolation trench ST1 on the main surface of the SOI substrate SUB, and then, removing a part of the insulating film outside of the element isolation trench ST1 by the CMP (Chemical Mechanical Polishing) method or others. As described below, the MISFET is formed on the semiconductor layer SM1 configuring an active region that is surrounded by the element isolation region ST when seen in a plan view. Note that, in the SOI substrate SUB, the active region defined (surrounded when viewed in the plan view) by the element isolation region ST has a structure in which the insulating layer EX and the semiconductor layer SM1 are sequentially laminated onto the substrate SB1 from the bottom. The semiconductor layer SM1 that is defined (surrounded when viewed in the plan view) by the element isolation region ST can be also regarded as the active region.

Figure 5:
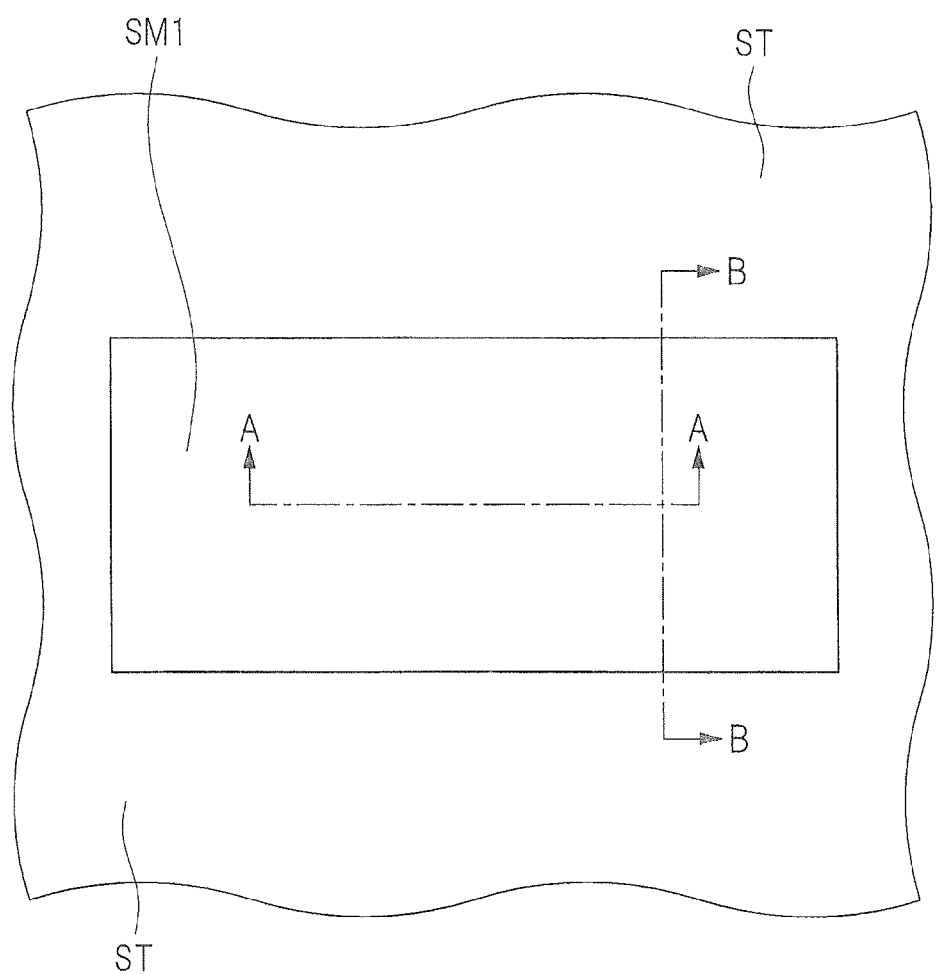
FIG. 5 is a plan view of a principal part during steps of manufacturing the semiconductor device as the same as FIG. 4.
Figure 6:
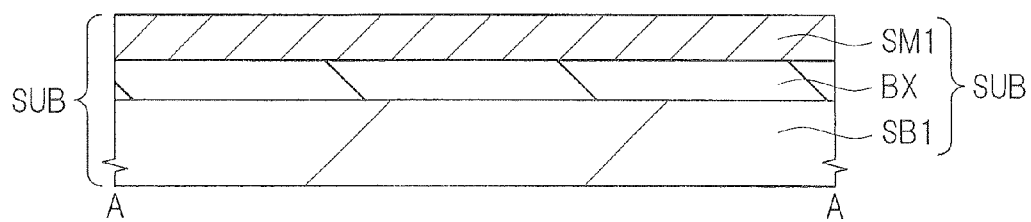
FIG. 6 is a cross-sectional view A-A during steps of manufacturing the semiconductor device as the same as FIG. 4.
Figure 7:
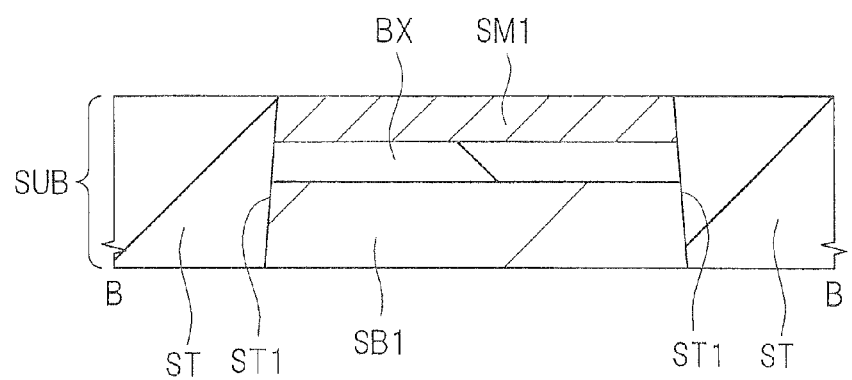
FIG. 7 is a cross-sectional view B-B during steps of manufacturing the semiconductor device as the same as FIG. 4.

FIG. 5 to FIG. 7 are the plan view of the principal part (FIG. 5) or the cross-sectional views of the principal part (FIG. 6 and FIG. 7) at a stage of the formation of the element isolation region ST in step S2. Among them, FIG. 5 is a plan view of a principal part, FIG. 6 is a cross-sectional view at a position of line A-A in FIG. 5, and FIG. 7 is a cross-sectional view at a position of line B-B in FIG. 5. Note that a cross-sectional view at the position of the line A-A is referred to as a cross-sectional view A-A below, and FIG. 6 and later-described FIG. 9, FIG. 11, FIG. 13, FIG. 15, FIG. 17, FIG. 19, FIG. 21, FIG. 23, FIG. 26, FIG. 28, FIG. 30, FIG. 32, FIG. 34, FIG. 36 and FIG. 38 correspond to the cross-sectional views A-A. Further, a cross-sectional view at the position of the line B-B is referred to as a cross-sectional view B-B below, and FIG. 7 and later-described FIG. 10, FIG. 12, FIG. 14, FIG. 16, FIG. 18, FIG. 20, FIG. 22, FIG. 24, FIG. 27, FIG. 29, FIG. 31, FIG. 33, FIG. 35, FIG. 37 and FIG. 39 correspond to a cross-sectional view B-B. Further, later-described FIG. 8 and FIG. 25 illustrate plan views in the same region as FIG. 5.

In the cross-sectional views of FIG. 6 and the drawings after FIG. 6, the SOI substrate SUB is illustrated for a thickness range (that is, a surface layer portion of the SOI substrate SUB) of a region RG1 surrounded by a two-dot chain line in FIG. 3 and FIG. 4, but illustration for a deep region of the SOI substrate SUB (a region deeper than the region RG1 in FIG. 3 and FIG. 4) is omitted.

Next, a p-type impurity (such as boron) is introduced by using ion implantation or others for forming a p-type well (p-type semiconductor region) to the semiconductor layer SM1 in a region of the semiconductor layer SM1 where an n-channel type MISFET is to be formed.

Figure 8:
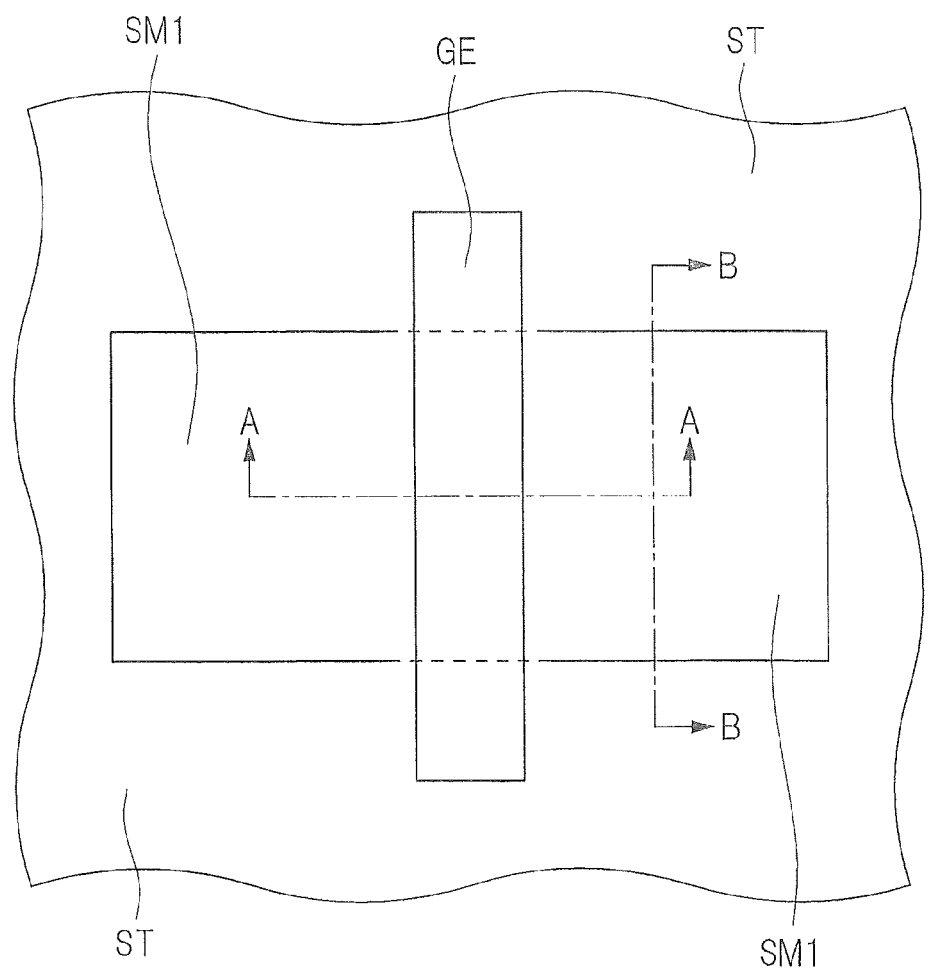
FIG. 8 is a plan view of a principal part during steps of manufacturing the semiconductor device, continued from FIGS. 5 to 7.
Figure 9:
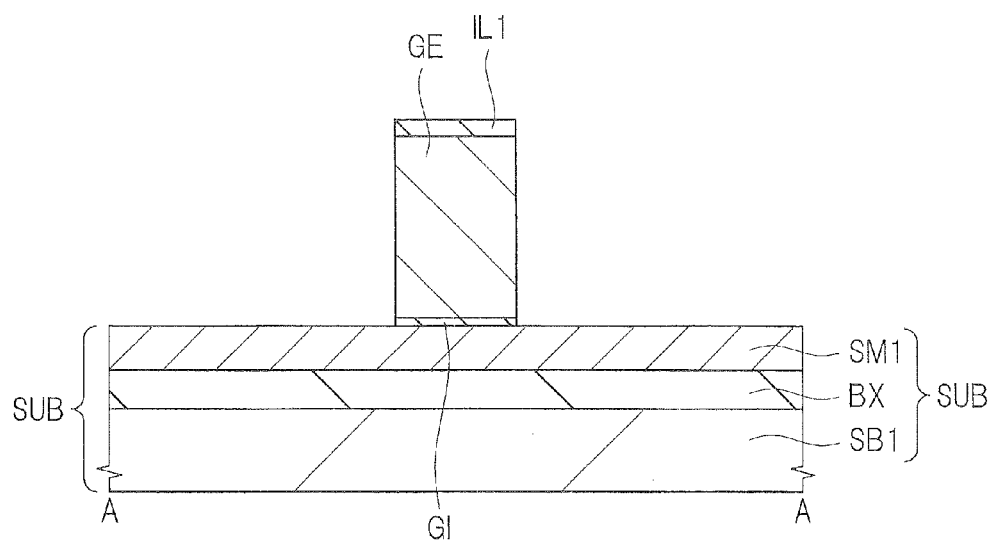
FIG. 9 is a cross-sectional view A-A during steps of manufacturing the semiconductor device as the same as FIG. 8.
Figure 10:
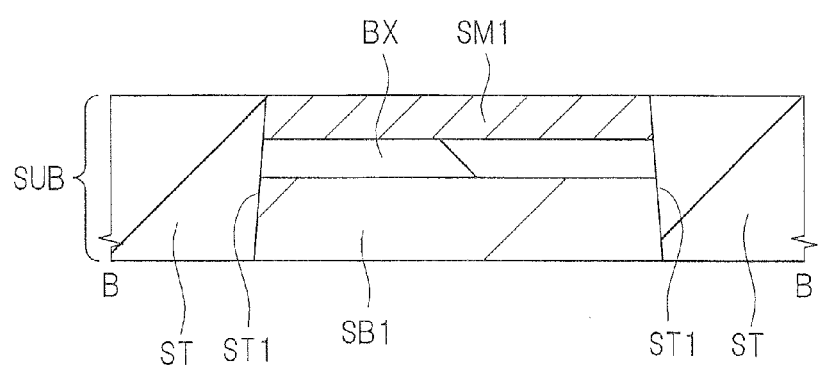
FIG. 10 is a cross-sectional view B-B during steps of manufacturing the semiconductor device as the same as FIG. 8.

Next, as illustrated in FIG. 8 (the plan view of the principal part), FIG. 9 (the cross-sectional view A-A) and FIG. 10 (the cross-sectional view B-B), a gate electrode GE is formed via a gate insulating film GI on the main surface of the SOI substrate SUB, that is, on the main surface of the semiconductor substrate SM1 (step S3 of FIG. 1).

It is preferred to form an insulating film IL1 on an upper portion of the gate electrode GE. When the insulating film IL1 is formed on the gate electrode GE, formation of the epitaxial layer on the gate electrode GE in step S5 described later can be prevented. On the other hand, when no insulating film IL1 is formed on the gate electrode GE, the epitaxial layer (an epitaxial semiconductor layer made of the same type of a semiconductor material as that of the semiconductor layer EP) can be formed on (an upper surface of) the gate electrode GE in step S5 described later if the gate electrode GE is made of a semiconductor (such as polysilicon). When the epitaxial layer is formed on (the upper surface of) the gate electrode GE, a metallic silicide layer MS is formed on an upper portion (upper layer portion) of the epitaxial layer on the gate electrode GE in step S12 described later.

A specific example of this step S3 (the step of forming the gate insulating film GI and the gate electrode GE) will be explained. First, an insulating film for the gate insulating film GI (an insulating film that is to be the gate insulating film GI later, such as a silicon oxide film) is formed on the main surface of the SOI substrate SUB, that is, the main surface of the semiconductor layer SM1, and then, a conductive film for the gate electrode GE (such as a polysilicon film) is formed on this insulating film, and the insulating film IL1 (such as a silicon nitride film) is formed on this conductive film. At this stage, on the semiconductor layer SM1, the insulating film for the gate insulating film GI, the conductive film for the gate electrode GE, and the insulating film IL1 are sequentially laminated from the bottom. Then, by patterning the laminated film of the conductive film for the gate electrode GE and the insulating film IL1 by using the photolithography technique and the etching technique, the gate electrode GE formed of the patterned conductive film (conductive film for the gate electrode GE) can be formed. The insulating film for the gate insulating film GI remains between the gate electrode GE and the semiconductor layer SM1, and becomes the gate insulating film GI. Therefore, the gate electrode GE is formed on the semiconductor layer SM1 via the gate insulating film GI. And, on the gate electrode GE, the insulating film IL1 patterned in a planar shape as almost the same as that of the gate electrode GE is formed. That is, the gate electrode GE has a laminated structure in which the insulating film IL1 is laminated on an upper portion thereof. Also, in the patterning of the conductive film for the gate electrode GE, the insulating film IL1 can be also used as a hard mask.

While the portion of the insulating film for the gate insulating film GI which is covered with the gate electrode GE remains to become the gate insulating film GI, other portion than the portion covered with the gate electrode GE can be removed by performing dry etching in the step of patterning the conductive film for the gate electrode GE or performing wet etching after the dry etching.

Next, a sidewall spacer (side walls, side wall insulating film) SW1 is formed on side walls of the gate electrode GE as a side wall insulating film (step S4 of FIG. 1). The sidewall spacer SW1 is formed of the insulating film and can be regarded as a side wall insulating film.

A step of forming the sidewall spacer SW1 can be performed as follows.

Figure 11:
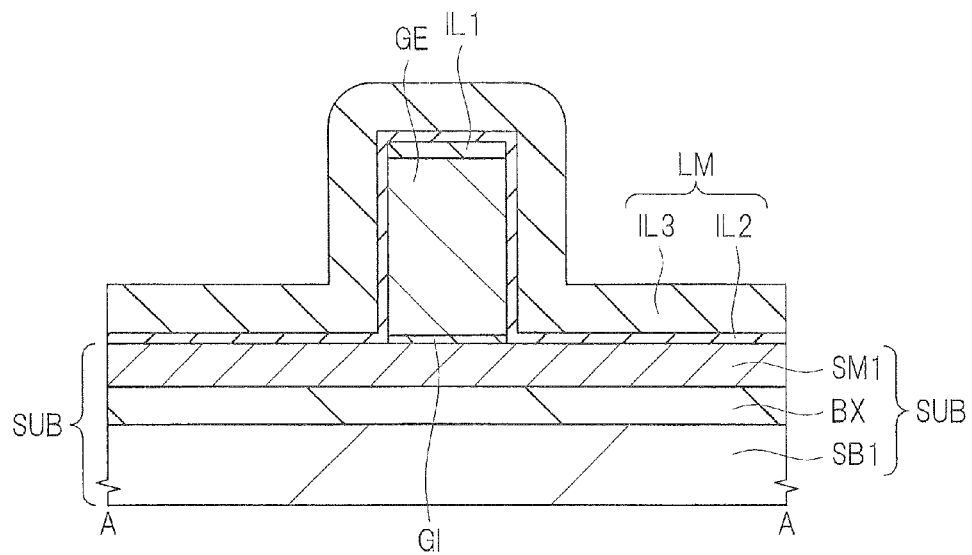
FIG. 11 is a cross-sectional view A-A during steps of manufacturing the semiconductor device, continued from FIGS. 8 to 10.
Figure 12:
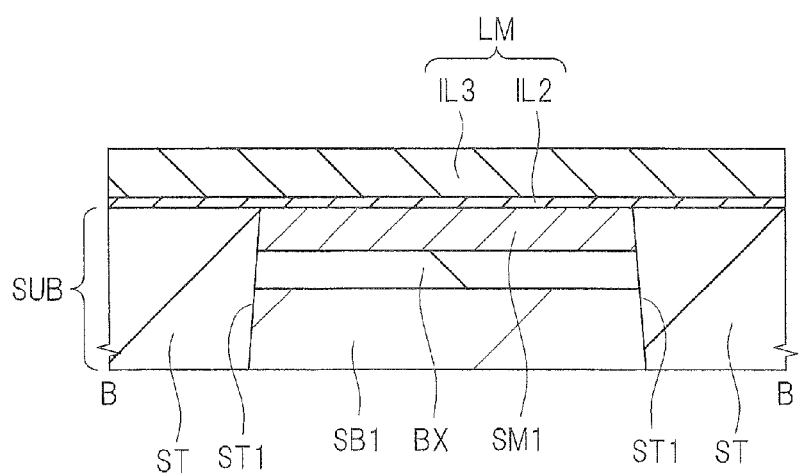
FIG. 12 is a cross-sectional view B-B during steps of manufacturing the semiconductor device as the same as FIG. 11.
Figure 13:
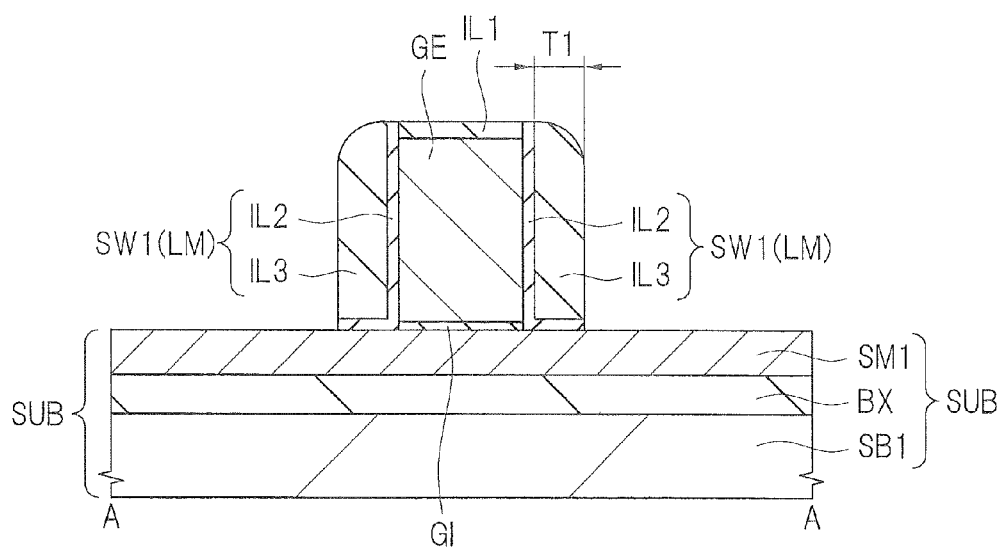
FIG. 13 is a cross-sectional view A-A during steps of manufacturing the semiconductor device, continued from FIG. 11.
Figure 14:
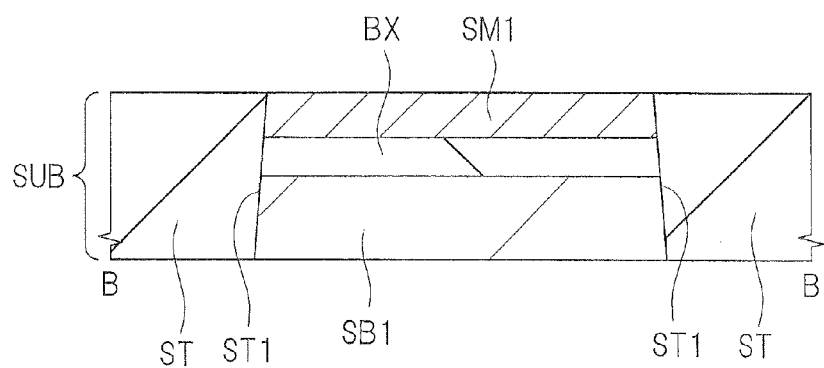
FIG. 14 is a cross-sectional view B-B during steps of manufacturing the semiconductor device as the same as FIG. 13.

First, as illustrated in FIG. 11 (the cross-sectional view A-A) and FIG. 12 (the cross-sectional view B-B), an insulating film IL2 is formed on the main surface (entire main surface) of the SOI substrate SUB, that is, on the semiconductor layer SM1 so as to cover the gate electrode GE. Then, an insulating film IL3 is formed on the main surface (entire main surface) of the SOI substrate SUB, that is, on the insulating film IL2. In this manner, a laminated film LM of the insulating film IL2 and the insulating film IL3 on the insulating film IL2 is formed on the main surface of the SOI substrate SUB so as to cover the gate electrode GE. Then, as illustrated in FIG. 13 (the cross-sectional view A-A) and FIG. 14 (the cross-sectional view B-B), by etching back (etching, dry etching, anisotropic etching) the laminated film LM (laminated film LM of the insulating film IL2 and the insulating film IL3) by using an anisotropic etching technique, a sidewall spacer SW1 is formed on both side walls of the gate electrode GE. In this etch back step, by performing anisotropic etching (etching back) of the laminated film LM by a thickness of the deposited film of the laminated film LM, the laminated film LM can be left on both side walls (side surfaces) of the gate electrode GE to become the sidewall spacer SW1, and the laminated film LM in other region is removed. In this manner, the sidewall spacer SW1 is formed of the laminated film LM remaining on both side walls of the gate electrode GE.

The sidewall spacer SW1 is formed of the laminated film LM of the insulating film IL2 and the insulating film IL3 on the insulating film IL2. More specifically, the sidewall spacer SW1 is formed of the insulating film IL2 that successively extends with an almost constant thickness from the semiconductor layer SM1 to the side walls of the gate electrode GE, and the insulating film IL3 that is separated from the semiconductor layer SM1 and the gate electrode GE via the insulating film IL2 (by the insulating film IL2). That is, the insulating film IL2 forming the sidewall spacer SW1 is interposed between the insulating film IL3 forming the sidewall spacer SW1 and the semiconductor layer SM1 and between the insulating film IL3 forming the sidewall spacer SW1 and the gate electrode GE.

The insulating film IL2 and the insulating film IL3 are made of different materials from each other. Preferably, the insulating film IL2 is formed of a silicon oxide film, and the insulating film IL3 is formed of a silicon nitride film. The insulating films IL2 and IL3 can be formed by using, for example, a CVD method or others.

Figure 15:
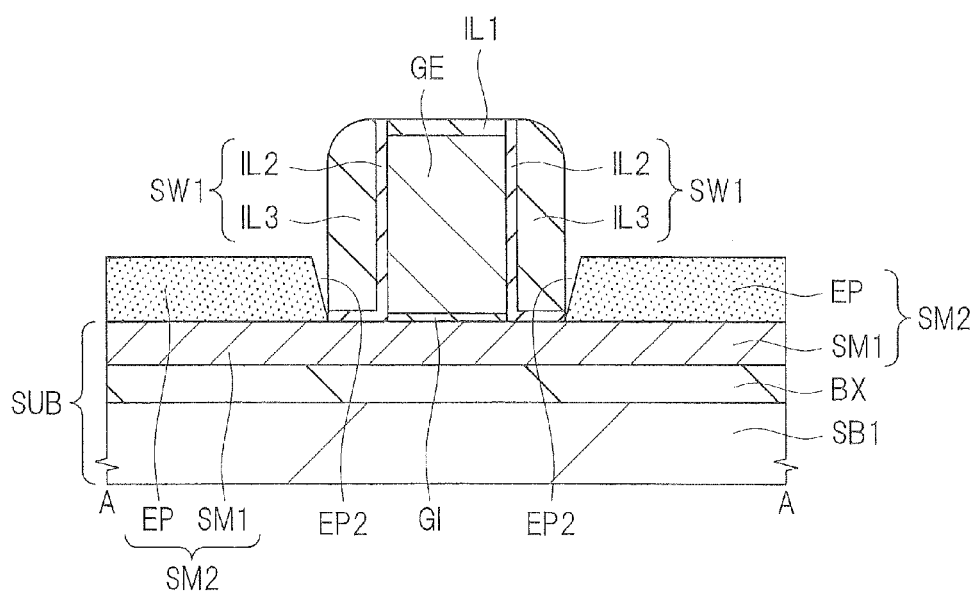
FIG. 15 is a cross-sectional view A-A during steps of manufacturing the semiconductor device, continued from FIG. 13.
Figure 16:
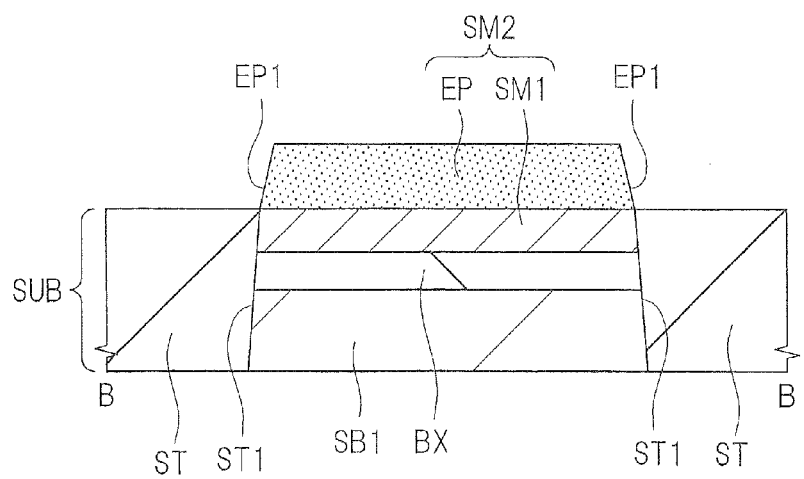
FIG. 16 is a cross-sectional view B-B during steps of manufacturing the semiconductor device as the same as FIG. 15.

Next, as illustrated in FIG. 15 (the cross-sectional view A-A) and FIG. 16 (the cross-sectional view B-B), the semiconductor layer EP which is an epitaxial layer (epitaxial growth layer, epitaxial semiconductor layer) is formed on the semiconductor layer SM1 by using an epitaxial growth method (step S5 of FIG. 1). That is, the semiconductor layer EP is epitaxially grown on the semiconductor layer SM1. In this respect, hatching with dots is provided to the semiconductor layer EP in FIG. 15 and FIG. 16.

In step S5, the epitaxial layer (semiconductor layer EP) selectively grows on an exposed surface (Si surface) of the semiconductor layer SM1 for forming the semiconductor layer EP by using the epitaxial growth method. The epitaxial layer does not grow on the insulating film. Therefore, in step S5, the epitaxial layer (the epitaxial layer that is to be the semiconductor layer EP) selectively grows on a region (exposed surface) of the main surface (front surface) of the semiconductor layer SM1, the region being not covered with the gate electrode GE and the sidewall spacer SW1.

Therefore, the semiconductor layer EP is formed on the semiconductor layer SM1 in regions on both sides of the gate electrode GE (both sides thereof in a gate length direction), and more specifically, is formed on the semiconductor layer SM1 in regions on both sides of a structural body (both sides thereof in the gate length direction) formed of the gate electrode GE and the sidewall spacer SW1 formed on side walls of the gate electrode. That is, the semiconductor layer EP is formed on both sides of the gate electrode GE (both sides thereof in the gate length direction) on the semiconductor layer SM1 so as to be adjacent to the gate electrode GE, and more specifically, the semiconductor layer EP is formed on both sides of the structural body (both sides thereof in the gate length direction) formed of the gate electrode GE and the sidewall spacer SW1 on the side walls of the gate electrode on the semiconductor layer SM1 so as to be adjacent to the structural body. The semiconductor layer EP is formed to be separated from the gate electrode GE by the sidewall spacer SW1 (to be separated in the gate length direction of the gate electrode GE). The thickness of the semiconductor layer EP can be, for example, about 20 to 40 nm.

The sidewall spacer SW1 does not function as a mask (ion implantation preventing mask) at the time of ion implantation for forming the source drain but is for separating a formation position of the semiconductor layer EP from the gate electrode GE (and thus from a channel formation region immediately below the gate electrode GE). A sidewall spacer SW2 described later functions as the mask (ion implantation preventing mask) at the time of ion implantation for forming the source/drain. Note that the ion implantation for forming the source/drain corresponds to ion implantation of step S10 described later.

The semiconductor layer EP is an epitaxial layer (epitaxial semiconductor layer) formed by using the epitaxial growth method, and is made of, for example, silicon (single crystal silicon). The semiconductor layer EP selectively grows epitaxially on the exposed surface of the semiconductor layer SM1 (that is, on an upper surface of the semiconductor layer SM1 which is not covered with the gate electrode GE and the sidewall spacer SW1), and is not formed on the sidewall spacer SW1, the insulating film IL1 and the element isolation region ST.

When the semiconductor layer EP is epitaxially grown, the upper surface of the gate electrode GE is covered with the insulating film IL1, and side surfaces (side walls) thereof are covered with the sidewall spacer SW1. Therefore, even when the gate electrode GE is formed of a polysilicon film, the formation of the epitaxial layer on the surface of the gate electrode GE can be prevented. As another embodiment, if it is desired to form the gate electrode GE of a semiconductor film (such as a polysilicon film) and to epitaxially grow a semiconductor layer of the same type as the semiconductor layer EP on an upper surface of the gate electrode GE in step S5, the formation of the insulating film IL1 on the gate electrode GE may be eliminated.

Since the semiconductor layer EP is formed on an almost-flat upper surface of the semiconductor layer SM1, the upper surface of the semiconductor layer EP is at a position that is higher than the upper surface of the semiconductor layer SM1. Accordingly, the upper surface of the semiconductor layer EP that is formed in step S5 is at a higher position than the upper surface of the semiconductor layer SM1 immediately below the gate electrode GE. Note that, when the height is mentioned, the height corresponds to a height in a direction substantially vertical to the main surface of the SOI substrate SUB.

Also, the epitaxial layer has a tendency of difficulty in the growth which results in a slow growing speed when an impurity concentration of a base semiconductor region is high. When the semiconductor layer EP is epitaxially grown, the impurity concentration of the base (here, the semiconductor layer SM1) of the semiconductor layer EP can be decreased by forming the semiconductor layer EP in step S5 prior to an ion implantation step for forming an n$^-$ type semiconductor region EX described later (corresponding to step S8 described later) and anion implantation step for forming an n$^+$ type semiconductor region SD described later (corresponding to step S10 described later). In this manner, the semiconductor layer EP can be easily grown, and the growing speed of the semiconductor layer EP can be increased.

Also, the side walls (EP1, EP2) of the semiconductor layer EP can have a substantially-vertical case to the main surface of the SOI substrate SUB (in this case, an angle formed between the side walls of the semiconductor layer EP and the upper surface of the semiconductor layer SM1 is substantially a right angle) and an inclined case thereto (in this case, an angle formed between the side walls of the semiconductor layer EP and the upper surface of the semiconductor layer SM1 is an acute angle). As an example, FIG. 15 and FIG. 16 illustrate a case in which the side walls (EP1, EP2) of the semiconductor layer EP are inclined with respect to the main surface of the SOI substrate SUB (in this case, the angle formed between the side walls of the semiconductor layer EP and the upper surface of the semiconductor layer SM1 is an acute angle).

Note that a combination body of the semiconductor layer SM1 and the semiconductor layer EP formed on the semiconductor layer SM1 is referred to as the semiconductor layer SM2 hereinafter.

Figure 17:
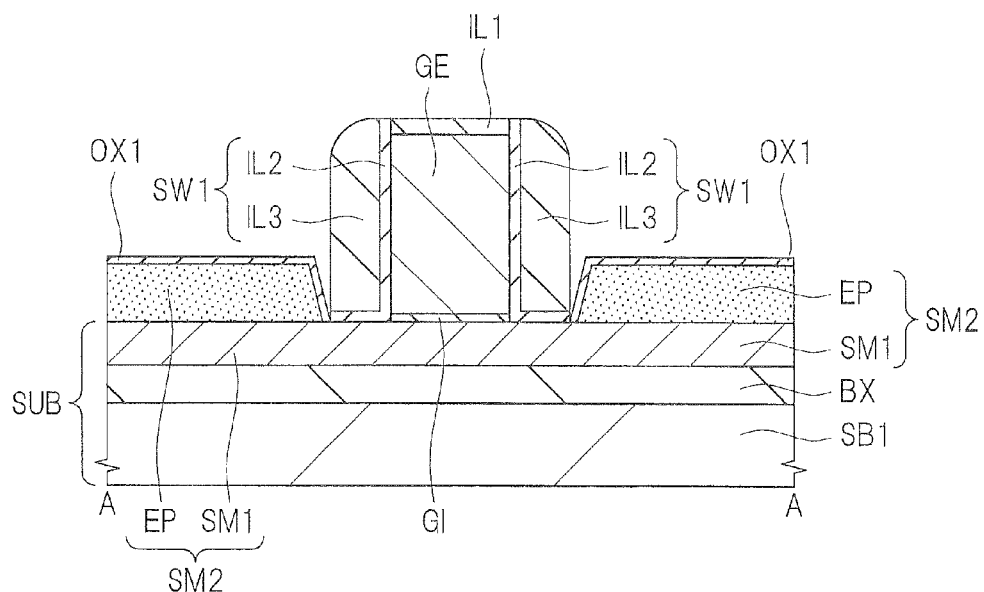
FIG. 17 is a cross-sectional view A-A during steps of manufacturing the semiconductor device, continued from FIG. 15.
Figure 18:
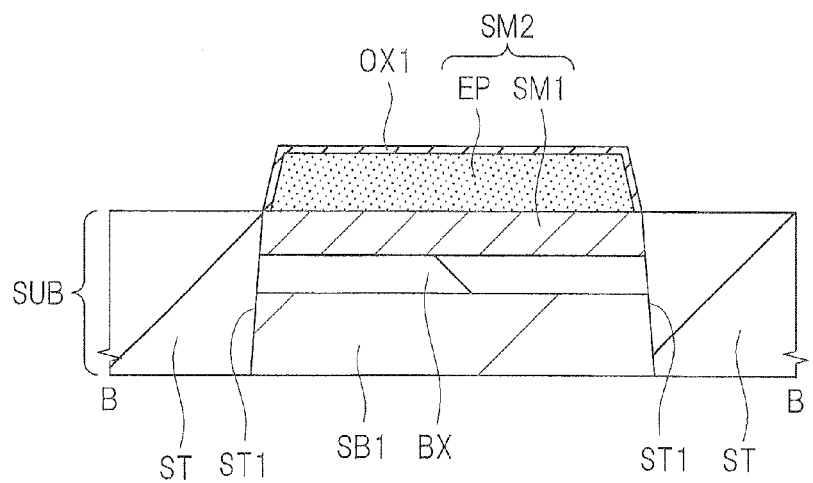
FIG. 18 is a cross-sectional view B-B during steps of manufacturing the semiconductor device as the same as FIG. 17.

Next, as illustrated in FIG. 17 (the cross-sectional view A-A) and FIG. 18 (the cross-sectional view B-B), the surface of the semiconductor layer EP is oxidized to form an oxide film OX1 on the surface (exposed surface) of the semiconductor layer EP (step S6 of FIG. 1).

The oxidation process of step S6 can be preferably performed by thermal oxidation, and dry oxidation (dry thermal oxidation) can be suitably used. In one cited example of an oxidation condition, the oxide film OX1 is formed by oxidizing the surface of the semiconductor layer EP by heating the SOI substrate SUB at a thermal process temperature of, for example, about 800° C. under an oxygen atmosphere (which may also contain inert gas).

The oxide film OX1 is a film that is formed by oxidation of a surface layer portion (a region in vicinity of the surface) of the semiconductor layer EP, and is a film made of an oxide made of a material making up the semiconductor layer EP. When the semiconductor layer EP is formed of a silicon layer, the oxide film OX1 that is formed on the surface of the semiconductor layer EP is formed of a silicon oxide film. A thickness of the oxide film OX1 is preferably about 2 to 5 nm.

In step S6, while the exposed surface of the semiconductor layer EP is oxidized to form the oxide film OX1, the upper surface of the gate electrode GE is covered with the insulating film IL1 and its side surfaces (side walls) are covered with the sidewall spacer SW1. Therefore, the gate electrode is not exposed at the stage of performing the oxidation process in step S6, so that the gate electrode GE is not oxidized in step S6. Further, in step S6, the insulating film IL1 and the insulating film IL3 forming the sidewall spacer SW1 are not oxidized.

In step S6, it is preferable to cause a state in which the oxide film OX1 is formed over the entire exposed surface of the semiconductor layer EP so as not to form the exposed portions (exposed surfaces) on the semiconductor layer EP. In this manner, it can be more accurately prevented or suppressed to etch the semiconductor layer EP in the etching step in step S7 described later.

Further, as described above, the side walls (EP1, EP2) of the semiconductor layer EP can have the substantially-vertical case to the main surface of the SOI substrate SUB and the inclined case thereto (corresponding to FIG. 15 and FIG. 16).

As illustrated in FIG. 15 and FIG. 16, in the case that the side walls (EP1, EP2) of the semiconductor layer EP are inclined with respect to the main surface of the SOI substrate SUE (in this case, the angle formed between the side walls of the semiconductor layer EP and the upper surface of the semiconductor layer SM1 is an acute angle), the oxide film OX1 can be formed on the entire upper surface of the semiconductor layer EP and the entire side walls (EP1, EP2) of the semiconductor layer EP as illustrated in FIG. 17 and FIG. 18. On the other hand, in the case that the side walls (EP1, EP2) of the semiconductor layer EP are substantially vertical with respect to the main surface of the SOI substrate SUB, the oxide film OX1 can be formed on the entire upper surface of the semiconductor layer EP and the side wall EP1. However, when the side surface (side wall) EP2 of the semiconductor layer EP is in contact with (adheres to) the sidewall spacer SW1, the oxide film OX1 may be not formed on the side surface (side wall) EP2 of the semiconductor layer EP. Here, the side wall (side surface) EP1 of the semiconductor layer EP corresponds to a side wall (side surface) that is adjacent to the element isolation region ST when seen in a plan view, and the side wall (side surface) EP2 of the semiconductor layer EP corresponds to the side surface (side wall) on a side that is opposite to the gate electrode GE (thus, a side that is opposite to the sidewall spacer SW1 at a stage of the growth of the semiconductor layer EP).

That is, regardless of whether the substantially vertical case of the side walls (EP1, EP2) of the semiconductor layer EP with respect to the main surface of the SOI substrate SUB or the inclined case thereto, the oxide film OX1 is formed on the upper surface and the side wall EP1 of the semiconductor layer EP in step S6. When the side surface (side wall) EP2 of the semiconductor layer EP is separated from the sidewall spacer SW1, that is, when there is a space between the side surface EP2 of the semiconductor layer EP and the sidewall spacer SW1, the oxide film OX1 is formed also on the side surface EP2 of the semiconductor layer EP in step S6. On the other hand, when the side surface (side wall) EP2 of the semiconductor layer EP is in contact with or adheres to the sidewall spacer SW1, that is, when there is no space between the side surface EP2 of the semiconductor layer EP and the sidewall spacer SW1, the oxide film OX1 may be not formed on the side surface EP2 of the semiconductor layer EP in step S6.

Figure 19:
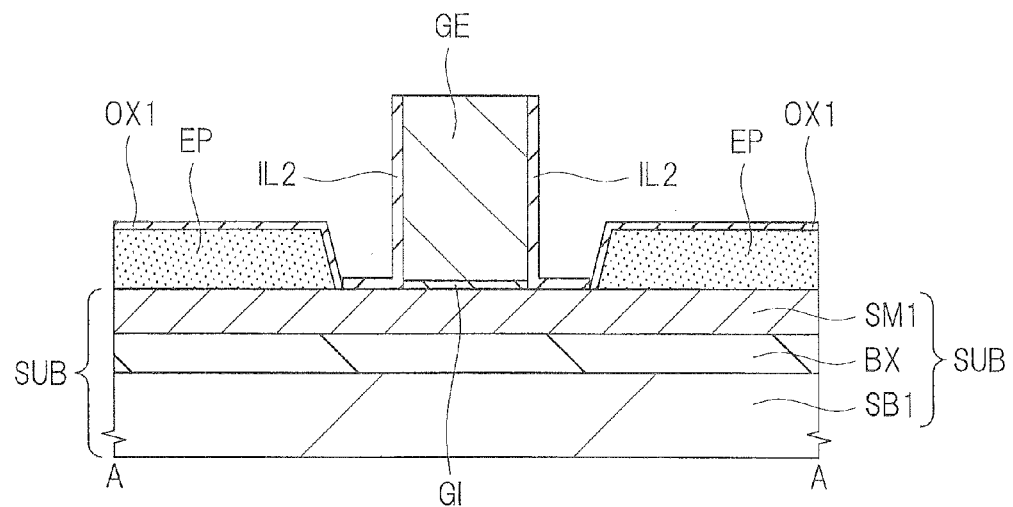
FIG. 19 is a cross-sectional view A-A during steps of manufacturing the semiconductor device, continued from FIG. 17.
Figure 20:
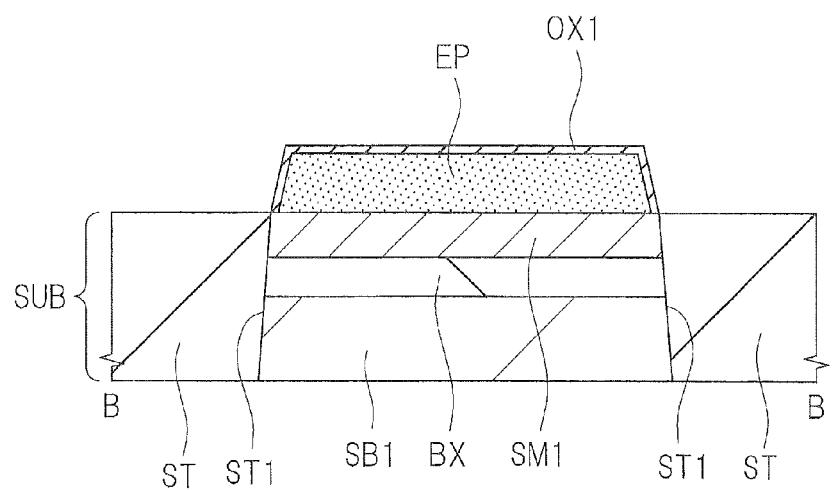
FIG. 20 is a cross-sectional view B-B during steps of manufacturing the semiconductor device as the same as FIG. 19.

Next, as illustrated in FIG. 19 (the cross-sectional view A-A) and FIG. 20 (the cross-sectional view B-B), the insulating film IL3 forming the sidewall spacer SW1 is removed by etching (step S7 of FIG. 1). By the etching in step S7, the insulating film IL3 forming the sidewall spacer SW1 is removed, so that the insulating film IL2 forming the sidewall spacer SW1 is exposed.

In step S7, the etching is performed under such a condition (etching condition) as causing an etching speed of the insulating film IL2 to be smaller (slower) than an etching speed of the insulating film IL3. In other words, in step S7, the etching is performed under such a condition (etching condition) as causing the etching speed of the insulating film IL3 to be larger (faster) than the etching speed of the insulating film IL2. That is, in step S7, the etching is performed under such an etching condition as causing the etching for the insulating film IL2 to be more difficult than the etching for the insulating film IL3. Since the insulating film IL2 and the insulating film IL3 are formed of different materials from each other, an etching selectivity of the insulating film IL3 with respect to the insulating film IL2 can be secured.

Therefore, in the etching step of step S7, the insulating film IL3 forming the sidewall spacer SW1 can be removed, and the insulating film IL2 forming the sidewall spacer SW1 can be functioned as an etching stopper film. In this manner, in step S7, the insulating film IL2 forming the sidewall spacer SW1 is not removed but remains.

Further, in step S7, the etching is performed under such a condition (etching condition) as causing the etching speed of the oxide film OX1 to be smaller (slower) than the etching speed of the insulating film IL3. In other words, the etching is performed under such a condition as causing the etching speed of the insulating film IL3 to be larger (faster) than the etching speed of the oxide film OX1. That is, in step S7, the etching is performed under such an etching condition as causing the etching for the oxide film OX1 to be more difficult than the etching for the insulating film IL3. Therefore, by forming the oxide film OX1 and the insulating film IL3 of different materials from each other, the etching selectivity of the insulating film IL3 with respect to the oxide film OX is secured.

Therefore, in the etching step of step S7, while the insulating film IL3 forming the sidewall spacer SW1 is removed, the oxide film OX1 can be functioned as the etching protecting film for the semiconductor layer EP. In this manner, the etching for the semiconductor layer EP in step S7 can be prevented or suppressed.

Therefore, in step S7, the etching is performed under such an etching condition as causing the etching for the insulating film IL2 and the oxide film OX1 to be more difficult than the etching for the insulating film IL3. Therefore, it is required to form the insulating film IL3 by a material that is different from those of both of the insulating film IL2 and the oxide film OX1. The etching with a large etching selectivity can be performed for the silicon nitride film and the silicon oxide film. That is, while the etching for either the silicon nitride film or the silicon oxide film is suppressed, the etching can be performed selectively to the other. Therefore, it is more preferable to form the insulating film IL3 of a silicon nitride film and to form the insulating film IL2 of a silicon oxide film. It is further preferable that the oxide film OX1 is a silicon oxide film. In this manner, when such an etching condition as causing the etching for the silicon oxide film (insulating film IL2 and oxide film OX1) to be more difficult than the etching for the silicon nitride film (insulating film IL3) is used in step S7, the etching can be performed selectively for the insulating film IL3 formed of the silicon nitride film while the etching for the insulating film IL2 and the oxide film OX1 formed of the silicon oxide film.

Note that, even in a case that the surface layer portion (upper layer portion) of the insulating film IL2 that is exposed by removing the insulating film IL3 forming the sidewall spacer SW1 is removed by the etching depending on the etching condition of step S7, it is preferable that etching conditions in step S7, it is preferable to set the etching condition so that the insulating film IL2 is not completely removed but that the insulating film IL2 remains to be layered. That is, while the thicknesses of the insulating film IL2 before and after step S7 are the same as each other or the thickness of the insulating film IL2 after step S7 is smaller than the thickness thereof before step S7, it is preferable to leave the insulating film IL2 to be layered even after step S7 so as not to expose the portions of the semiconductor layer SM1 and the side walls of the gate electrode GE which are covered with the insulating film IL2 forming the sidewall spacer SW1. In this manner, even when the insulating film IL3 forming the sidewall spacer SW1 is removed in step S7, the state in which the insulating film IL2 successively extends (to be layered) from the portion on the side walls of the gate electrode GE to the portion on the semiconductor layer SM1 is maintained.

Further, depending on each thickness of the insulating film IL3 and the oxide film OX1 and the etching condition in step S7, the oxide film OX1 may be removed by the etching during removing the insulating film IL3 forming the sidewall spacer SW1 in step S7 so that the surface of the semiconductor layer EP is exposed at a stage of end of the etching in step S7. Even in such a case, the etching for the semiconductor layer EP in step S7 can be suppressed more than the case without the formation of the oxide film OX1 (in the case, the oxidation step of step S6 is eliminated).

However, in step S7, it is more preferable that the oxide film OX1 remains on the surface of the semiconductor layer EP without completely removing the oxide film OX1 at the stage of the end of the etching in step S7, and it is still more preferable that the oxide film OX1 remains to be layered on the surface of the semiconductor layer EP. In this manner, the exposure of the surface of the semiconductor layer EP during the etching in step S7 so as to etch the semiconductor layer EP can be more accurately prevented or suppressed.

Further, in step S7, it is more preferable to perform the etching under such a condition (etching condition) as causing the etching speed of the semiconductor layer EP to be smaller (slower) than the etching speed of the insulating film IL3. That is, in step S7, it is still more preferable to perform the etching under such an etching condition as causing the etching for the semiconductor layer EP to be more difficult than the etching for the insulating film IL3. In this manner, even when the oxide film OX1 is removed and the semiconductor layer EP is exposed during the etching in step S7, the etching for the exposed semiconductor layer EP can be suppressed.

Further, in step S7, it is more preferable to perform the etching under such a condition (etching condition) as causing the etching speed of the oxide film OX1 to be smaller (slower) than the etching speed of the semiconductor layer EP. That is, in step S7, it is more preferable to perform the etching under such an etching condition as causing the etching for the oxide film OX1 to be more difficult than the etching for the semiconductor layer EP. In this manner, the etching in step S7 is performed in the state in which the oxide film OX1 which is more difficult to be etched (thus, has a higher etching resistance) than the semiconductor layer EP is formed on the surface of the semiconductor layer EP, and therefore, a benefit of an effect caused by forming the oxide film OX1 as the etching protecting film can be accurately obtained.

In this manner, in step S7, it is preferable to use an etching method capable of selectively etching the insulating film IL3, and wet etching is preferable. In silicon nitride, the high etching selectivity can be achieved with respect to silicon oxide and silicon, and wet etching can be suitably used in this case. Therefore, when the insulating film IL3 is formed of silicon nitride and the insulating film IL2 is formed of silicon oxide, the insulating film IL3 can be etched and removed by the wet etching, and the etching for the insulating film IL2 and the oxide film OX1 can be accurately suppressed or prevented. As etching liquid to be used when the insulating film IL3 is formed of silicon nitride and the insulating film IL2 is formed of silicon oxide, for example, a phosphoric acid chemical solution or others can be suitably used. Therefore, while the insulating film IL2 and the insulating film IL3 are made of different materials from each other, combination of the insulating film IL2 formed of the silicon oxide film and the insulating film IL3 formed of the silicon nitride film can be suitably used.

That is, it is preferable to select respective materials of the insulating film IL2 and the insulating film IL3 so that the high etching selectivity of the insulating film IL3 with respect to the oxide film OX1 and the insulating film IL2 is secured. In this viewpoint, it is suitable to form the insulating film IL2 to be the silicon oxide film and the insulating film IL3 to be the silicon nitride film. It is also suitable to form the semiconductor layer EP to be the silicon layer and the oxide film OX1 to be the silicon oxide film.

Further, it is more preferable that the oxide film OX1 formed in step S6 has a thickness of 2 nm or larger. In this manner, the oxide film OX1 can be accurately functioned as the etching protecting film in step S7, and the effect of preventing or suppressing the etching for the semiconductor layer EP in step S7 can be accurately obtained.

Further, it is more preferable that the thickness of the oxide film OX1 formed in step S6 is 5 nm or smaller. In this manner, it is easier to remove the oxide film OX1 later (than step S7). Also, it is easier to prevent the oxidation of the surface of the insulating film IL3 forming the sidewall spacer SW1 in the formation of the oxide film OX1 in step S6.

Accordingly, 2 to 5 nm is particularly suitable for the thickness of the oxide film OX1 formed in step S6.

By forming the insulating film IL1 on the gate electrode GE by using the same material as that of the insulating film IL3, the insulating film IL3 forming the sidewall spacer SW1 can be removed by the etching in step S7, and the insulating film IL1 on the gate electrode GE can be also removed by the etching. For example, by forming the insulating film IL1 by silicon nitride when the insulating film IL3 is formed of silicon nitride, not only the insulating film IL3 forming the sidewall spacer SW1 but also the insulating film IL1 on the gate electrode GE can be removed by the etching in step S7. When the insulating film IL1 on the gate electrode GE is removed in step S7, the upper surface of the gate electrode GE is exposed while the side walls (side surfaces) of the gate electrode GE is not exposed since they are covered with the insulating film IL2. By removing the insulating film IL1 from the upper portion of the gate electrode GE, a metal silicide layer MS can be formed on the upper portion of the gate electrode GE in step S12 described later.

Also, in the present embodiment, after the semiconductor layer EP is formed on portions of the semiconductor layer SM1 which are not covered with the gate electrode GE and the sidewall spacer SW1 in step S5, the surface of the semiconductor layer EP is oxidized in step S6, and then, the insulating film IL3 forming the sidewall spacer SW1 is removed in step S7. Therefore, the semiconductor layer SM1 does not rise up over the insulating film IL2 that remains after step S7 (the insulating film IL2 forming the sidewall spacer SW1). That is, while the semiconductor layer EP is formed on the portions of the semiconductor layer SM1 which are exposed from the insulating film IL2, the semiconductor layer EP does not rise up over the insulating film IL2. That is, while the side surface of the semiconductor layer EP is adjacent to (or is close to) an end portion of the insulating film IL2, the semiconductor layer EP is not formed on the portions of the insulating film IL2 which extend on the semiconductor layer SM1.

Further, in the present embodiment, in step S7, a part of the sidewall spacer SW1 (here, the insulating film IL3) is removed, and the other part (here, the insulating film IL2) is left. In step S7, It is also considered to remove all of the sidewall spacer SW1. However, as compared to the case of the removal of all of the sidewall spacer SW1 in step S7, the case in which a part of the sidewall spacer SW1 (here, the insulating film IL3) is removed in step S7 and the other part (here, the insulating film IL2) is left can obtain the following advantages.

That is, exposure of the gate electrode GE to cause overetching is can be prevented. Further, a portion (here, the insulating film IL2) of the sidewall spacer SW1 which is not removed in step S7 but remains on the side walls of the gate electrode GE can be functioned as an ion implantation preventing mask together with the gate electrode GE in step S8 described later. That is, the insulating film IL2 remaining on the side walls of the gate electrode GE can be functioned as an offset spacer in step 8 described later. Therefore, an overlapping amount of the n⁻ type semiconductor region EX with the gate electrode GE can be controlled. In order to remove a part (here, the insulating film IL3) of the sidewall spacer SW1 and to leave the other part (here, the insulating film IL2) thereof in step S7, it is preferable to form the sidewall spacer SW1 of the laminated film LM including the insulating films IL2, IL3, so that it is easier to accurately set the removing part (insulating film IL3) and the remaining part (insulating film IL2) of the sidewall spacer SW1 in step S7.

Figure 21:
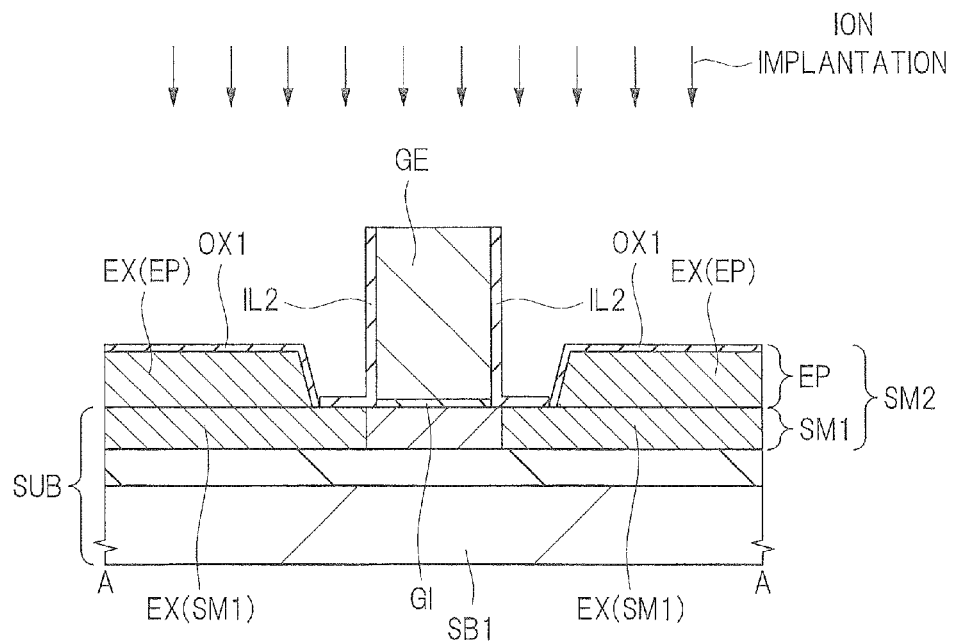
FIG. 21 is a cross-sectional view A-A during steps of manufacturing the semiconductor device, continued from FIG. 19.
Figure 22:
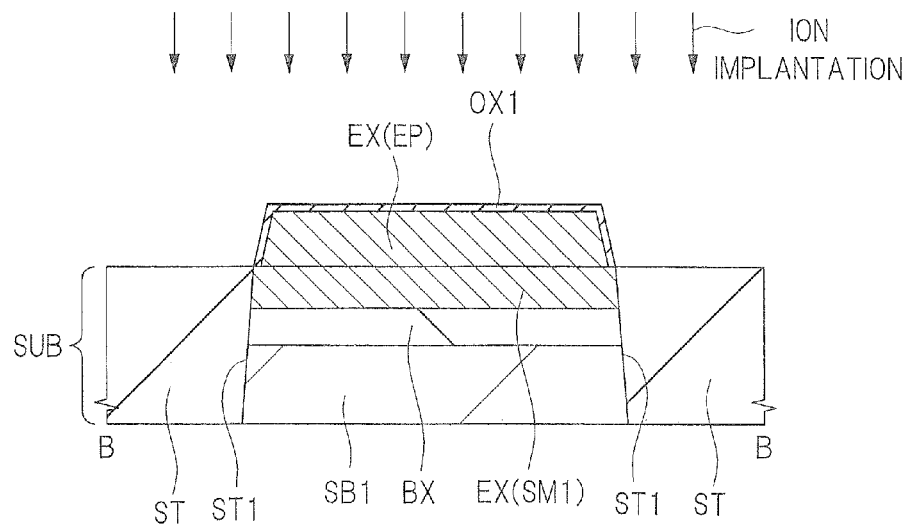
FIG. 22 is a cross-sectional view B-B during steps of manufacturing the semiconductor device as the same as FIG. 21.

Next, as illustrated in FIG. 21 (the cross-sectional view A-A) and FIG. 22 (the cross-sectional view B-B), an n⁻ type semiconductor region (extension region, LDD region) EX is formed by ion implantation of an n type impurity such as phosphorus (P) or arsenic (As) to regions on both sides of the gate electrode GE on the semiconductor layer SM2 (that is the semiconductor layers SM1, EP) (step S8 in FIG. 2).

Note that FIG. 21 and FIG. 22 schematically illustrate ion implantation with arrows. Further, in FIG. 21 and FIG. 22, the same hatching is provided to the entire region (that is, the n⁻ type semiconductor region EX) to which the impurity (dopant) is introduced by ion implantation in step S8 for understanding the region (that is, the n⁻ type semiconductor region EX) to which the impurity (dopant) by the ion implantation in step S8. Further, in FIG. 23, FIG. 24, FIG. 26 and FIG. 27 described later, for easily seeing the drawing, the hatching indicating the n⁻ type semiconductor region EX is omitted, hatching with dots (the same hatching as the semiconductor layer EP in FIG. 15 to FIG. 20) is provided to the entire semiconductor layer EP, and hatching with slashes (the same hatching as the semiconductor layer SM1 in FIG. 3, FIG. 4, FIG. 6, FIG. 7 and FIG. 9 to FIG. 20) is provided to the entire semiconductor layer SM1. However, practically, also in FIG. 23, FIG. 24, FIG. 26 and FIG. 27 described later, the n⁻ type semiconductor region EX is formed in regions which are almost the same as those of FIG. 21 and FIG. 22.

In performing ion implantation in step S8 (ion implantation for forming the n⁻ type semiconductor region EX), the gate electrode GE can be functioned as a mask (ion implantation preventing mask). Further, portions of the insulating film IL2 which extend on the side walls of the gate electrode GE can be also functioned as a mask (ion implantation preventing mask). The impurity ion can pass through the portions of the insulating film IL2 which extend on the semiconductor layer SM1 because of having a small thickness (thickness in a direction that is substantially vertical with respect to the main surface of the SOI substrate SUB) (that is, an implantation energy of ion implantation is set to a value with which the implanted ion can pass through the portions of the insulating film IL2 which extend on the semiconductor layer SM1).

Therefore, by the ion implantation in step S8, the n⁻ type semiconductor region EX is formed on (a laminated body of) the semiconductor layer SM1 and the semiconductor layer EP so as to be self-aligned with the portion of the insulating film IL2 which extend on the side walls of the gate electrode GE.

Further, since the oxide film OX1 covers the surface of the semiconductor layer EP, damage on the semiconductor layer EP can be reduced to be lower than that in a case of direct ion implantation to the semiconductor layer EP. That is, the oxide film OX1 also is functioned as a protecting film in the formation of the n⁻ type semiconductor region EX. In the present embodiment, since the oxide film OX1 can be concurrently used as a protecting film in the ion implantation, it is not required to newly form such a protecting film, and the manufacturing processes can be simplified.

Therefore, in the present embodiment, the surface of the semiconductor layer EP is oxidized in step S6, and the insulating film IL3 that constituted the sidewall spacer SW1 is removed in step S7. However, it is preferable to perform the ion implantation in step S8 in a state in which the oxide film OX1 exists on the semiconductor layer EP. In this manner, in step S8, the impurity is ion-implanted to the semiconductor layer EP and the semiconductor layer SM1 in a state in which the oxide film OX1 exists on the semiconductor layer EP. When the impurity is ion-implanted to the semiconductor layer EP in the state in which the oxide film OX1 exists on the semiconductor layer EP, the oxide film OX1 can be functioned as the protecting film of the semiconductor layer EP, and therefore, the damage on the semiconductor layer EP can be reduced to be lower than the case in which the impurity is ion-implanted to the semiconductor layer EP in a state in which the oxide film OX1 does not exist on the semiconductor layer EP.

Further, in the present embodiment, since the ion implantation of step S8 is performed in a state in which the insulating film IL2 is formed on the side walls of the gate electrode GE for forming the n⁻ type semiconductor region EX, the insulating film IL2 on the side walls of the gate electrode GE can be functioned as an offset spacer. The overlapping amount of the n⁻ type semiconductor region EX with the gate electrode GE can be controlled by the thickness of the insulating film IL2 in the portions extending on the side walls of the gate electrode GE. Here, the overlapping amount of the n⁻ type semiconductor region EX with the gate electrode GE corresponds to a dimension of a portion positioned immediately below the gate electrode GE (dimension in the gate length direction) of the n⁻ type semiconductor region EX.

When the oxide film OX1 remains on the surface of the semiconductor layer EP in performing step S7, the remaining oxide film OX1 is removed by various steps or processes that are performed after step S7 in some cases. For example, the oxide film OX1 is removed in some cases by a cleaning process after the ion implantation in step S8, an etch back process performed in step S9 described later, a cleaning process after the ion implantation in step S10 described later, an etching step for the patterning in formation of a silicide block film before a step for forming the metal film ME in step S12 described later, a cleaning process performed before forming the metal film ME in step S12 described later, and others. Here, the silicide block film is an insulating film (such as a silicon oxide film) that is selectively formed in a region where the metal silicide layer MS is not desired to be formed.

Figure 23:
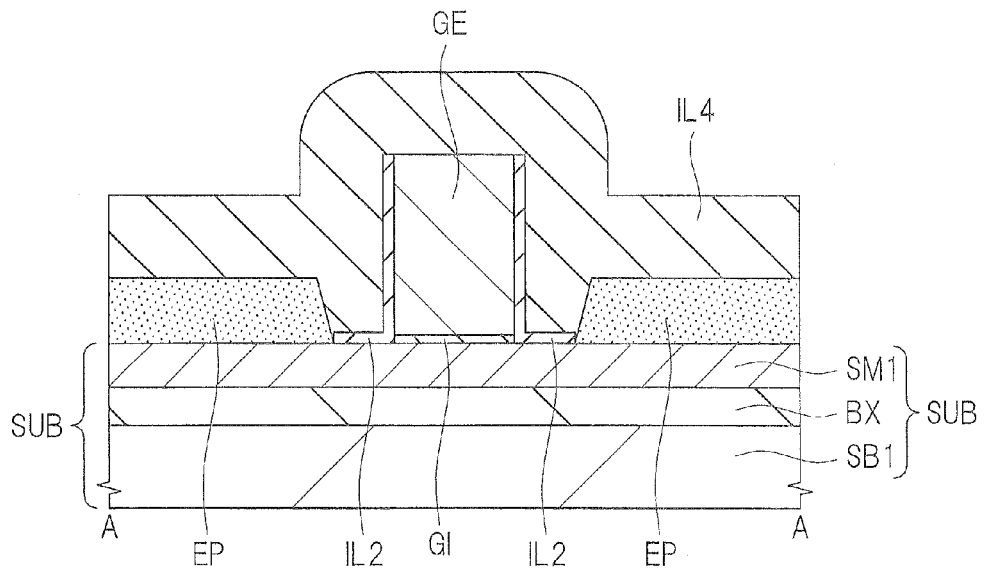
FIG. 23 is a cross-sectional view A-A during steps of manufacturing the semiconductor device, continued from FIG. 21.

Here, although FIG. 23 and drawings after FIG. 23 does not illustrate the oxide film OX1 based on the removal of the oxide film OX1 on the surface of the semiconductor layer EP in the cleaning process after the ion implantation in step S8, the oxide film OX1 remains on the surface of the semiconductor layer EP in some cases. However, in step S12 described later, it is required to form the metal film ME in a state in which the surface of the semiconductor layer EP in the portions that are not covered with the sidewall spacer SW2 is exposed. Therefore, when the oxide film OX1 remains on the surface of the semiconductor layer EP in performing step S7, the oxide film OX1 is removed from the surface of the semiconductor layer EP by the time of the formation of the metal film ME in step S12 described later, and the metal film ME described later is formed in a state in which the surface of the semiconductor layer EP in the portions that are not covered with the sidewall spacer SW2 is exposed. However, when an insulating film IL4 is formed in step S9 described later in the state in which the oxide film OX1 remains on the surface of the semiconductor layer EP, the oxide film OX1 is interposed between the semiconductor layer EP and the sidewall spacer SW2 described later, and the oxide film OX1 between the semiconductor layer EP and the sidewall spacer SW2 can remain without being removed even at the stage of the formation of the metal film ME described later.

Next, sidewall spacers (side walls, side wall insulating films) SW2, SW3 are formed as a side wall insulating film on the side walls of the gate electrode GE and on the side wall of the semiconductor layer EP (step S9 of FIG. 2). Each of the sidewall spacers SW2 and SW3 is formed of an insulating film, and can be regarded as a side wall insulating film.

A step of forming the sidewall spacers SW2 and SW3 in step S9 can be performed as follows.

Figure 24:
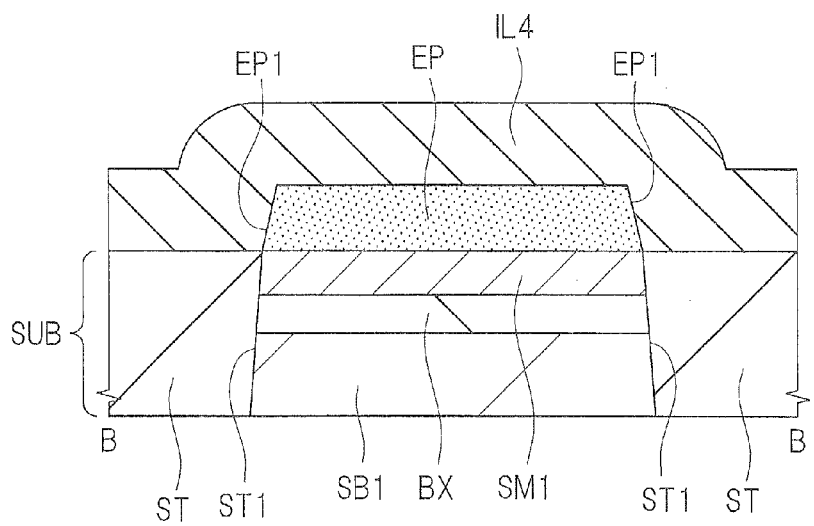
FIG. 24 is a cross-sectional view B-B during steps of manufacturing the semiconductor device as the same as FIG. 23.
Figure 25:
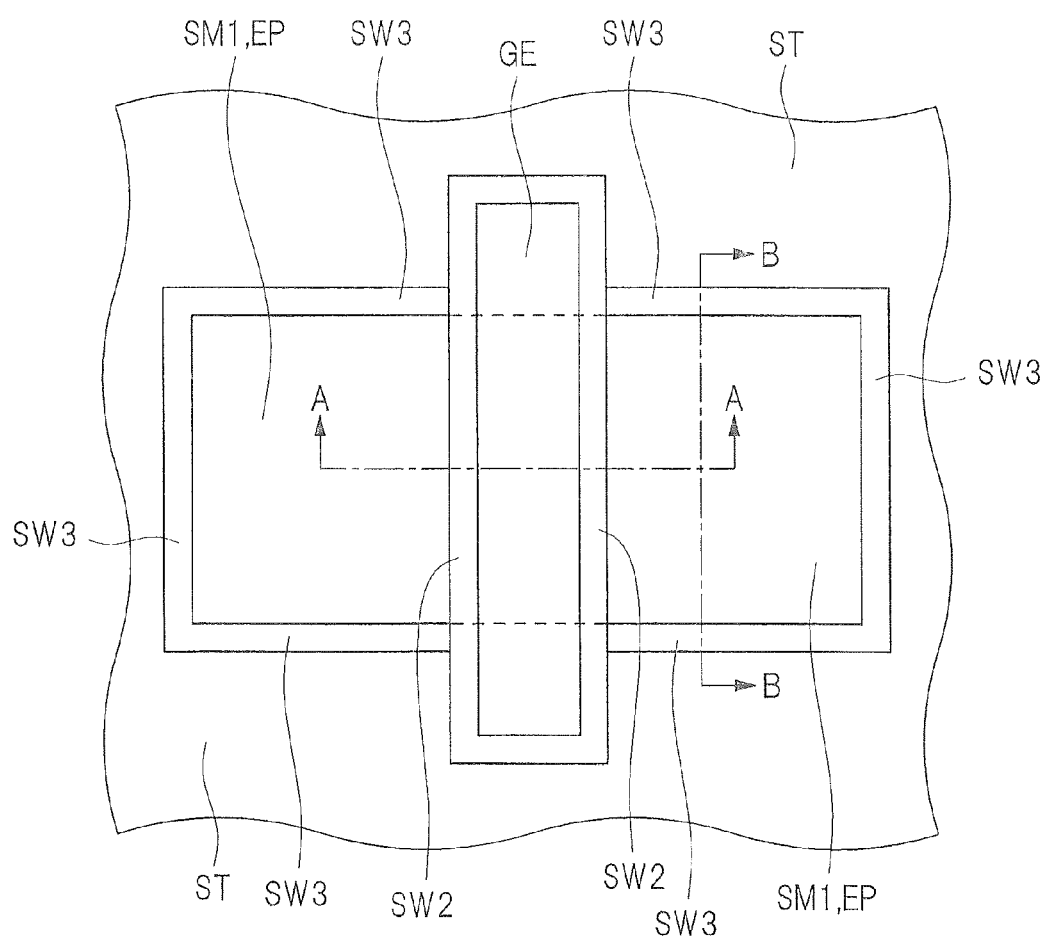
FIG. 25 is a plan view of a principal part during steps of manufacturing the semiconductor device, continued from FIG. 23.

First, as illustrated in FIG. 23 (the cross-sectional view A-A) and FIG. 24 (the cross-sectional view B-B), the insulating film IL4 for forming the sidewall spacers SW2 and SW3 is formed on the main surface (entire main surface) of the SOI substrate SUB so as to cover the gate electrode GE and the semiconductor layer EP. The insulating film IL4 for forming the sidewall spacers SW2 and SW3 can be an insulating film of single layer (single-layered film) or an insulating film of multiple layers (laminated film). For example, a single-layered film of a silicon nitride film can be used in the case of the single layer, and, for example, a laminated film of a silicon oxide film and a silicon nitride film on the silicon oxide film can be used in the case of the multiple layers. Then, as illustrated in FIG. 25 (the plan view of the principal part), FIG. 26 (the cross-sectional view A-A) and FIG. 27 (the cross-sectional view B-B), the insulating film IL4 is etched back (etched, dry-etched, anisotropically etched) by using an anisotropic etching technique, so that the sidewall spacer SW2 is formed on the side walls of the gate electrode GE, and besides, the sidewall spacer SW3 is formed on the side walls of the semiconductor layer EP.

In the etch back step, by anisotropically etching (etching back) the insulating film IL4 by only a thickness of the deposited film of the insulating film IL4, the insulating film IL4 is left on the side walls of the gate electrode GE to be the sidewall spacer SW2, the insulating film IL4 is left on the side wall of the semiconductor layer EP to be the sidewall spacer SW3, and the insulating film IL4 in other regions is removed.

Since the insulating film IL2 had been formed on the side walls of the gate electrode GE at the stage immediately before step S9, the sidewall spacer SW2 is formed on the side walls of the gate electrode GE via the insulating film IL2 in step S9. That is, the sidewall spacer SW2 is not in contact with (the side walls of) the gate electrode GE, and the insulating film IL2 is interposed between the sidewall spacer SW2 and (the side walls of) the gate electrode GE. Further, the sidewall spacer SW2 is not in contact with the semiconductor layer SM1, and the insulating film IL2 is interposed between the sidewall spacer SW2 and the semiconductor layer SM1. Therefore, when the sidewall spacer SW2 is formed, the insulating film IL2 extends over both of the region between the semiconductor layer SM1 and the sidewall spacer SW2 and the region between the gate electrode GE and the sidewall spacer SW2. Further, while the sidewall spacer SW2 is formed above the n⁻ type semiconductor region EX that is formed on the semiconductor layer SM2 (that is, the semiconductor layers SM1 and EP), the insulating film IL2 is interposed between the sidewall spacer SW2 and the n-type semiconductor region EX.

The sidewall spacer SW2 that is partially formed in step S9 rises up over the semiconductor layer EP. That is, the sidewall spacer SW2 partially exists (is positioned) on the semiconductor layer EP.

More specifically, an outer end portion of the sidewall spacer SW2 in the gate length direction is positioned on the semiconductor layer EP. Here, the outer end portion of the sidewall spacer SW2 in the gate length direction is an end portion in a direction along (in parallel to) the gate length direction (gate length direction of the gate electrode GE having the sidewall spacer SW2 formed on the side walls thereof), and corresponds to an end portion on an opposite side which is adjacent to the gate electrode GE. In other words, the end portion of the sidewall spacer SW2 on the opposite side of the side which is adjacent to the gate electrode GE is positioned on the semiconductor layer EP. That is, while the side of the sidewall spacer SW2 which is closer to the gate electrode GE is not positioned on the gate electrode EP, the side thereof which is farther from the gate electrode GE rises up over the semiconductor layer EP. From another point of view, the sidewall spacer SW2 partially rises up over a portion in vicinity of the end portion of the semiconductor layer EP (end portion on an opposite side of the gate electrode GE).

In order to cause the sidewall spacer SW2 to partially rise up over the semiconductor layer EP, a thickness T2 of the sidewall spacer SW2 formed in step S9 is made to be larger (thicker) than a thickness T1 of the insulating film IL3 (that is, the insulating film IL3 removed in the above-described step S7) forming the above-described sidewall spacer SW1 (that is, T1<T2).

Figure 26:
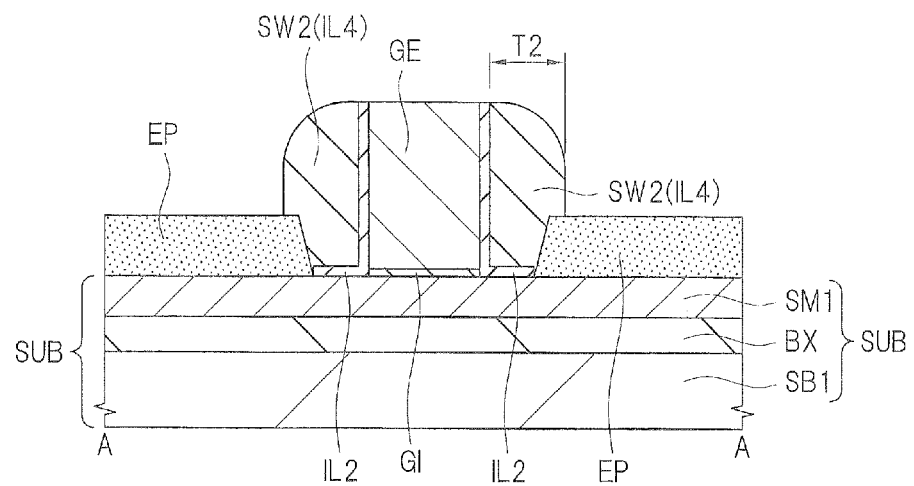
FIG. 26 is a cross-sectional view A-A during steps of manufacturing the semiconductor device as the same as FIG. 25.

Here, the thickness T2 of the sidewall spacer SW2 corresponds to a thickness (dimension) in a direction along the gate length direction (corresponding to the gate length direction of the gate electrode GE having the sidewall spacer SW2 formed on the side walls thereof), and is illustrated in FIG. 26. The thickness T2 of the sidewall spacer SW2 can be controlled by adjusting a film thickness (deposited film thickness) in the film formation of the insulating film IL4 for forming the sidewall spacers SW2 and SW3. Further, the thickness T1 of the insulating film IL3 forming the sidewall spacer SW1 corresponds to a thickness (dimension) in a direction along the gate length direction (corresponding to the gate length direction of the gate electrode GE having the sidewall spacer SW1 formed on the side walls thereof), and is illustrated in FIG. 13 described above. Therefore, a measuring direction of the thickness T2 is the same as a measuring direction of the thickness T1. The thickness T1 of the insulating film IL3 forming the sidewall spacer SW1 can be controlled by adjusting a film thickness (deposited film thickness) of the insulating film IL3 in the film formation of the insulating film IL3. Accordingly, it is preferable to set the film thickness (deposited film thickness) in the film formation of the insulating film IL4 for forming the sidewall spacers SW2 and SW3 to be larger (thicker) than the film thickness (deposited film thickness) in the film formation of the insulating film IL3.

Further, in the SOI substrate SUB, the semiconductor layer SM1 is divided into a plurality of sections (that is, active regions) by forming the element isolation region ST, and periphery of the semiconductor layer SM1 forming each of the active regions is surrounded by the element isolation region ST. Then, the MISFET is formed on the semiconductor layer SM1 forming each of the active regions by the above-described steps and later-described steps.

In step S5, the semiconductor layer EP grows on the semiconductor layer SM1 but not on the element isolation region ST, and therefore, the side wall (side surface) EP1 of the semiconductor layer EP is formed at a boundary between the semiconductor layer SM1 and the element isolation region ST (boundary when viewed in plan view). The side wall (side surface) EP1 of the semiconductor layer EP is the side wall (side surface) that is adjacent to the element isolation region ST when viewed in a plan view. In step S9, the sidewall spacer SW3 is formed on the side wall EP1 of the semiconductor layer EP. Since the side wall EP1 of the semiconductor layer EP is adjacent to the element isolation region ST when viewed in a plan view, a bottom surface (lower surface) of the sidewall spacer SW3 that is formed on the side wall EP1 of the semiconductor layer EP is positioned on the element isolation region ST. That is, the sidewall spacer SW3 is formed on the side wall EP1 of the semiconductor layer EP and is positioned on the element isolation region ST. That is, the sidewall spacer SW3 is positioned on the element isolation region ST and also is adjacent to the side wall EP1 of the semiconductor layer EP. Therefore, the sidewall spacer SW3 has a side surface that is opposite to the side wall EP1 of the semiconductor layer EP and a bottom surface that is opposite to the element isolation region ST.

Figure 27:
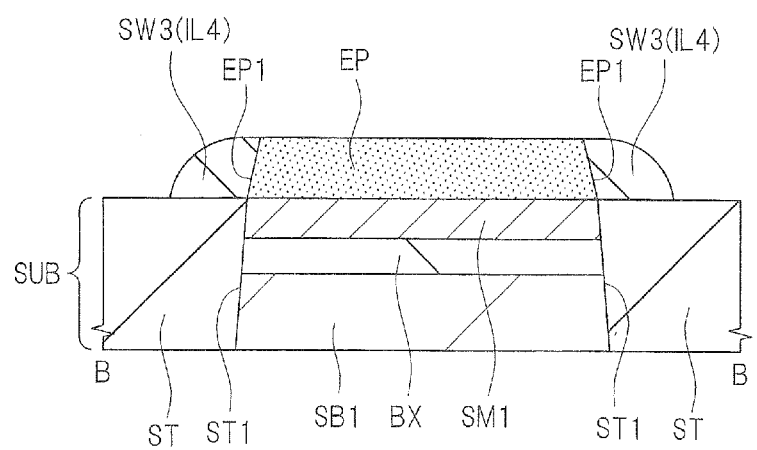
FIG. 27 is a cross-sectional view B-B during steps of manufacturing the semiconductor device as the same as FIG. 25.
Figure 43:
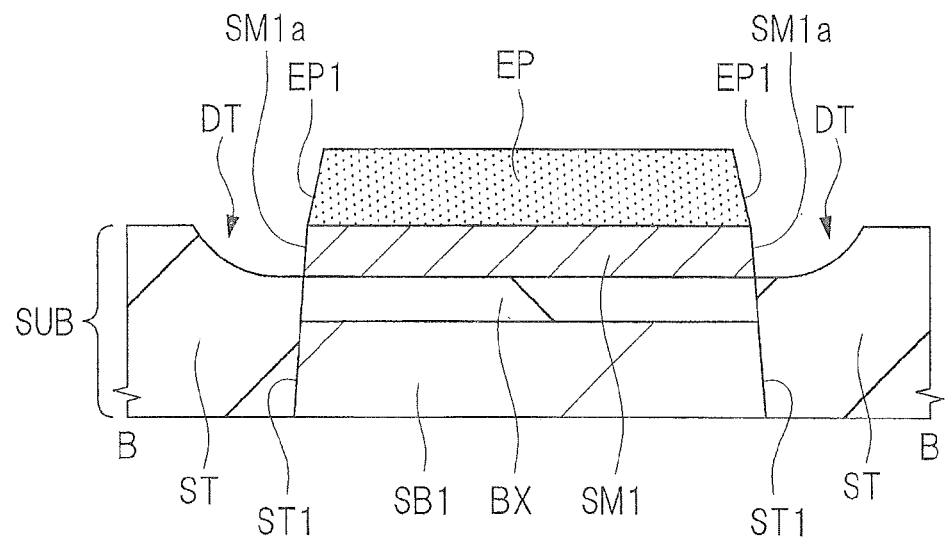
FIG. 43 is a cross-sectional view of a principal part during steps of manufacturing the semiconductor device according to the second study example, continued from FIG. 42.
Figure 46:
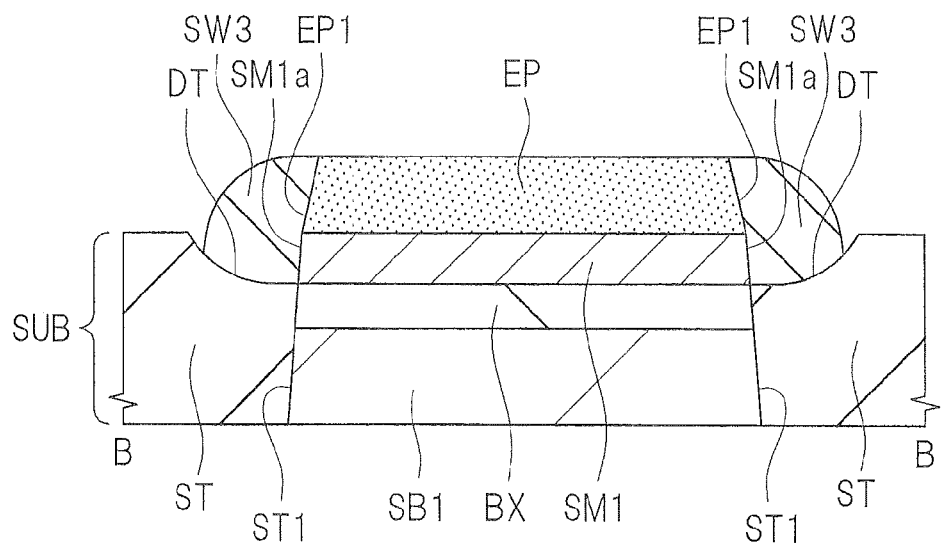
FIG. 46 is a cross-sectional view of a principal part during steps of manufacturing the semiconductor device according to one embodiment.

The side wall EP1 of the semiconductor layer EP is located at a position that is adjacent to the element separating region ST, and the sidewall spacer SW3 is formed on the side wall EP1 of the semiconductor layer EP, and the sidewall spacer SW3 is formed on the side wall EP1 of the semiconductor layer EP and is also positioned on the element isolation region ST as in FIG. 27. However, when a divot (DT) which is a dent portion is generated on the element isolation region ST as illustrated in FIG. 43 described later, not only the side wall EP1 of the semiconductor layer EP but also a side surface SM1a of the semiconductor layer SM1 are exposed in regions which are adjacent to the divot (DT) (this will be explained again later). In this case, when the sidewall spacer SW3 is formed on the side wall EP1 of the semiconductor layer EP, the sidewall spacer SW3 is formed on the side wall EP1 of the semiconductor layer EP, is also positioned on the element isolation region ST, and covers the side surface SM1a of the semiconductor layer SM1 in regions which are adjacent to the divot (DT) of the element isolation region ST as illustrated in FIG. 46 described later. By covering the side surface SM1a of the semiconductor layer SM1 with the sidewall spacer SW3, the formation of the metal silicide layer MS in step S12 described later is prevented.

The sidewall spacer SW2 and the sidewall spacer SW3 are formed in the same step as each other using the same insulating film IL4. Therefore, when the sidewall spacer SW2 is formed of the single-layered insulating film, the sidewall spacer SW3 is also formed of the single-layered insulating film of the same material. When the sidewall spacer SW2 is formed of the laminated insulating film, the sidewall spacer SW3 is also formed of the same laminated insulating film. For example, when the sidewall spacer SW2 is formed of a silicon nitride film, the sidewall spacer SW3 is also formed of the silicon nitride film. When the sidewall spacer SW2 is formed of a laminated film of a silicon oxide film and a silicon nitride film, the sidewall spacer SW3 is also formed of the laminated film of a silicon oxide film and a silicon nitride film.

In the present embodiment, note that the sidewall spacer SW2 and the sidewall spacer SW3 are explained so as to be distinguished from each other for easily understanding the invention. However, they are formed to be an integrated film. That is, the sidewall spacer SW2 and the sidewall spacer SW3 are connected to each other on side walls of the gate electrode GE and others on the element isolation region ST of FIG. 25.

Further, although omitted in FIG. 26, the sidewall spacer SW3 is formed also on the side wall EP1 of the semiconductor layer EP in the gate length direction (on an extension line of a cross section A-A of FIG. 25). That is, the sidewall spacer SW3 is formed so as to surround the semiconductor layer EP formed in the active region (semiconductor layer SM1 surrounded by the element isolation region ST). In other words, the sidewall spacer SW3 is formed on the side wall EP1 of the semiconductor layer EP in the gate length direction and a gate width direction.

Figure 28:
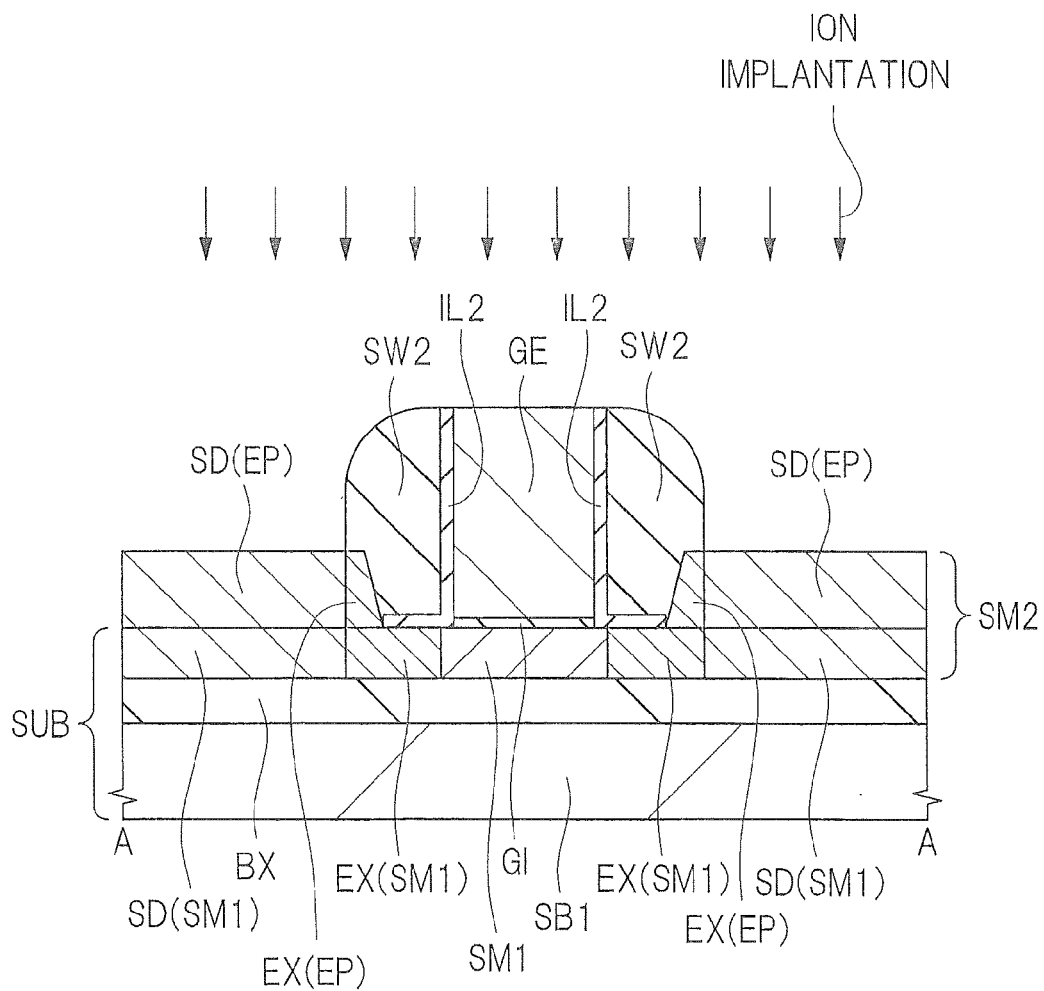
FIG. 28 is a cross-sectional view A-A during steps of manufacturing the semiconductor device, continued from FIGS. 25 to 27.
Figure 29:
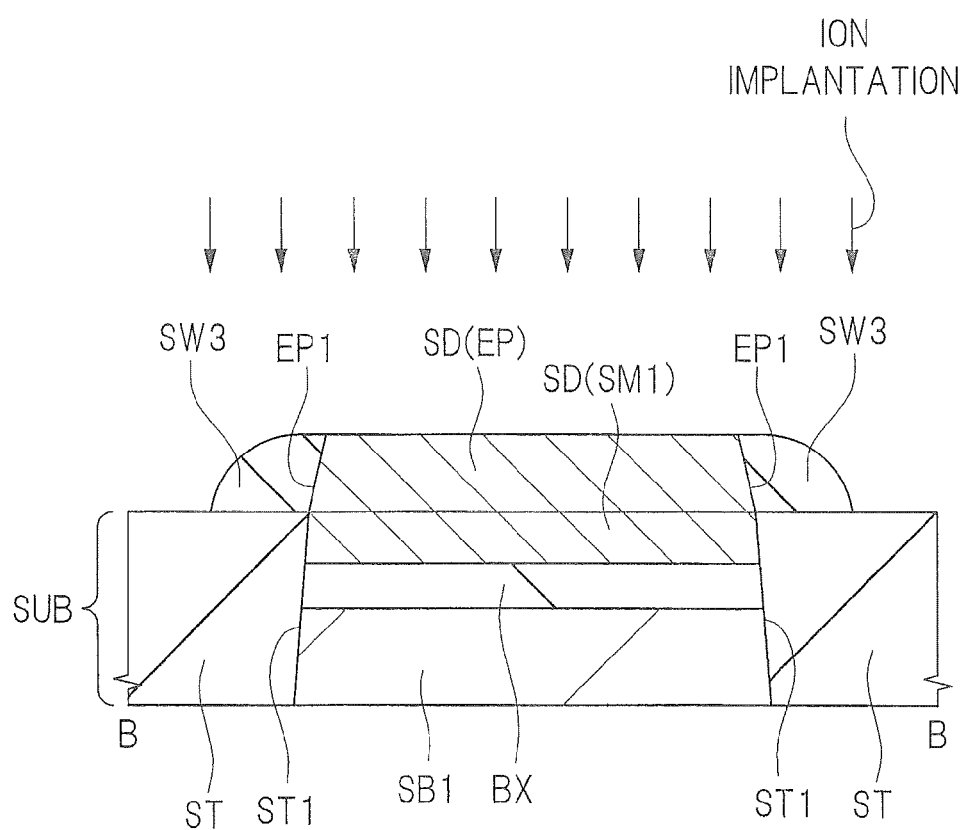
FIG. 29 is a cross-sectional view B-B during steps of manufacturing the semiconductor device as the same as FIG. 28.

Next, as illustrated in FIG. 28 (the cross-sectional view A-A) and FIG. 29 (the cross-sectional view B-B), an $n^+$ type semiconductor region SD is formed by ion implanting an n type impurity such as phosphorous (P) or arsenic (As) to regions on both sides of the gate electrode GE and the sidewall spacer SW2 on the semiconductor layer SM2 (that is, the semiconductor layers SM1 and EP) (step S10 of FIG. 2).

Note that the ion implantation is schematically illustrated by arrows in FIG. 28 and FIG. 29. Further, in FIG. 28 and FIG. 29, for understanding the region (that is, the $n^+$ type semiconductor region SD) to which the impurity (dopant) is implanted by the ion implantation in step S10, the same hatching is provided to the entire region (that is, the $n^+$ type semiconductor region SD) to which the impurity (dopant) is implanted by the ion implantation in step S10. Further, in FIG. 28 and FIG. 29, another same hatching (hatching indicating the $n^-$ type semiconductor region EX) is provided to the entire region to which the impurity (dopant) is not implanted by the ion implantation in step S10 but in which the $n^-$ type semiconductor region EX remains. Further, in FIG. 30 to FIG. 39 described later, for easily seeing the drawing, the hatching illustrating the $n^-$ type semiconductor region EX and the hatching illustrating the $n^+$ type semiconductor region SD are omitted. Further, in FIG. 30 to FIG. 39 described later, hatching with dots (the same hatching as that of the semiconductor layer EP in FIG. 15 to FIG. 20, FIG. 23, FIG. 24, FIG. 26 and FIG. 27) is provided to the entire semiconductor layer EP, and hatching with slashes (the same hatching as that of the semiconductor layer SM1 in FIG. 3, FIG. 4, FIG. 6, FIG. 7, FIG. 9 to FIG. 20, FIG. 23, FIG. 24, FIG. 26 and FIG. 27) is provided to the entire semiconductor layer SM1. However, practically, also in FIG. 30 to FIG. 39 described later, the $n^-$ type semiconductor region EX and the $n^+$ type semiconductor region SD are formed in regions which are almost the same as those of FIG. 28 and FIG. 29.

In the ion implantation (ion implantation for forming the $n^+$ type semiconductor region SD) in step S10, the gate electrode GE and the sidewall spacer SW2 (and besides, the insulating film IL2 between the gate electrode GE and the sidewall spacer SW2) can be functioned as a mask (ion implantation preventing mask). Therefore, by the ion implantation in step S10, the $n^+$ type semiconductor region SD is formed so as to be self-aligned with the sidewall spacer SW2. The $n^+$ type semiconductor region SD has a higher impurity concentration than that of the $n^-$ type semiconductor region EX.

In the ion implantation (ion implantation for forming the $n^-$ type semiconductor region EX) in step S8, an n type impurity is implanted to portions of the semiconductor layer SM2 (SM1, EP) which are not covered with the gate electrode GE. In the ion implantation (ion implantation for forming the $n^+$ type semiconductor region SD) in step S10, an n type impurity is implanted to portions of the semiconductor layer SM2 (SM1, EP) which are not covered with the gate electrode GE and the sidewall spacer SW2.

Before forming the sidewall spacer SW2 in step S9, the ion implantation is performed for forming the $n^-$ type semiconductor region EX (step S8), and the sidewall spacer SW2 in step S9 is formed, and then, the ion implantation is performed (step S10) for forming the $n^+$ type semiconductor region SD.

Therefore, when steps up to step S10 are performed, the n⁻ type semiconductor region EX is formed on a portion of the semiconductor SM2 (SM1, EP) immediately below the sidewall spacer SW2. Accordingly, the n⁻ type semiconductor region EX is formed on the semiconductor layer SM2 so as to be adjacent to a channel forming region (a portion of the semiconductor layer SM1 which is positioned immediately below the gate electrode GE), and the n⁺ type semiconductor region SD is formed at a position on the semiconductor layer SM2 which is separated from the channel forming region by the amount of the n⁻ type semiconductor region EX and which is also contact in (adjacent to) the n⁻ type semiconductor region EX. Note that the portion of the semiconductor layer SM1 which is positioned immediately below the gate electrode GE is to be a region (channel forming region) where a channel of a MISFET is formed.

When viewed in a thickness direction of the SOI substrate SUB, the n⁻ type semiconductor region EX is formed to extend from the semiconductor layer EP to the semiconductor layer SM1, and the n⁺ type semiconductor region SD is also formed to extend from the semiconductor layer EP to the semiconductor layer SM1.

Since a semiconductor region for the source or the drain (corresponding to the n⁻ type semiconductor region EX or the n⁺ type semiconductor region SD) is formed in the semiconductor layer EP, the semiconductor layer EP can be regarded as a semiconductor layer (epitaxial semiconductor layer) for the source/drain (for forming the source/drain).

By forming the n⁻ type semiconductor region EX and the n⁺ type semiconductor region SD in steps S8 and S10, a semiconductor region for the source or drain of the MISFET is formed on the semiconductor layer SM2 (SM1, EP) on both sides of the gate electrode GE (on both sides in the gate length direction). The semiconductor region for the source or drain is formed of an n⁻ type semiconductor region EX and an n⁺ type semiconductor region SD that has a higher impurity concentration than the n⁻ type semiconductor region EX, and has a LDD (Light Doped Drain) structure. That is, in a region of the semiconductor layer SM2 (SM1, EP), a (pair of) n⁻ type semiconductor regions (extension regions, LDD regions) EX are in regions which are separated from each other so as to sandwich the channel forming region therebetween, and a (pair of) n⁺ type semiconductor regions SD for the source/drain having an impurity concentration that is higher than that of the n⁻ type semiconductor region EX are formed outside of the n⁻ type semiconductor region EX (side separated from the channel forming region).

Next, activation annealing which is a thermal process for activating the impurity introduced to the n⁺ type semiconductor region SD or the n⁻ type semiconductor region EX and others is performed (step S11 of FIG. 2). Further, when a state of the ion-implanted region is made to be amorphous, the region can be crystallized in the activation annealing in this step S11.

Next, a low resistant metal silicide layer MS is formed on the surface (upper layer portion) of the n⁺ type semiconductor region SD, that is, the surface (upper layer portion) of the semiconductor layer EP by a salicide (Self Aligned Silicide) technique (step S12 of FIG. 2).

The metal silicide layer MS is a reaction layer (compound layer) of metal and (the semiconductor layer EP forming) the n⁺ type semiconductor region SD, and is formed on the upper portion (surface layer portion) of the n⁺ type semiconductor region SD. The metal silicide layer MS is a compound layer of metal and a chemical element forming the semiconductor layer EP, and is formed on the upper portion (surface layer portion) of the semiconductor layer EP. The step of forming the metal silicide layer MS in step S12 can be performed as specifically follows.

Figure 30:
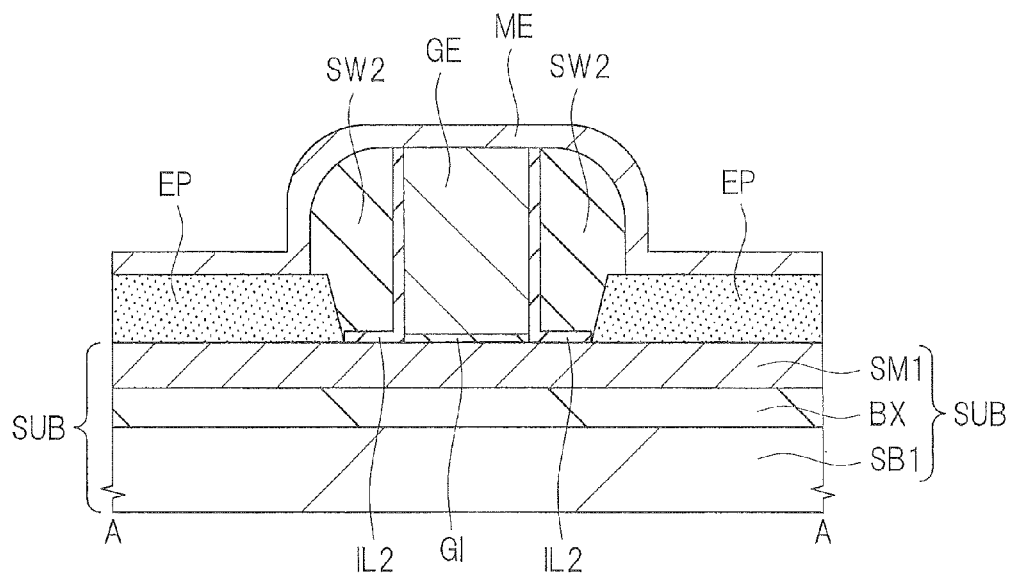
FIG. 30 is a cross-sectional view A-A during steps of manufacturing the semiconductor device, continued from FIG. 28.
Figure 31:
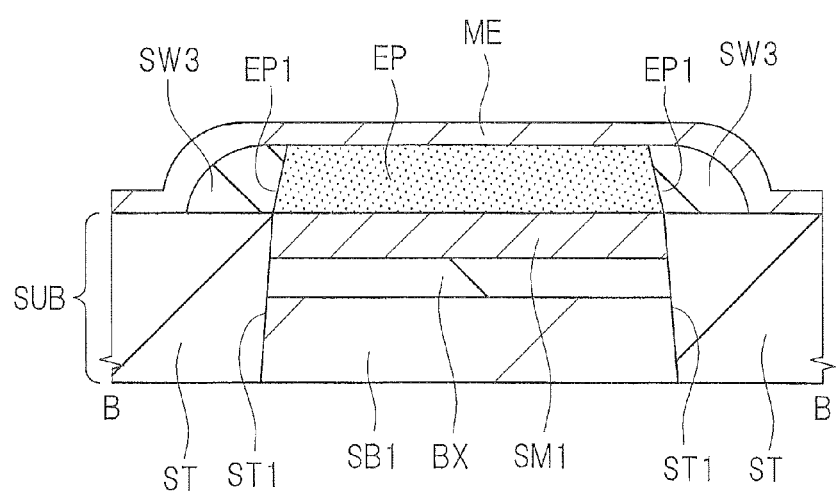
FIG. 31 is a cross-sectional view B-B during steps of manufacturing the semiconductor device as the same as FIG. 30.
Figure 32:
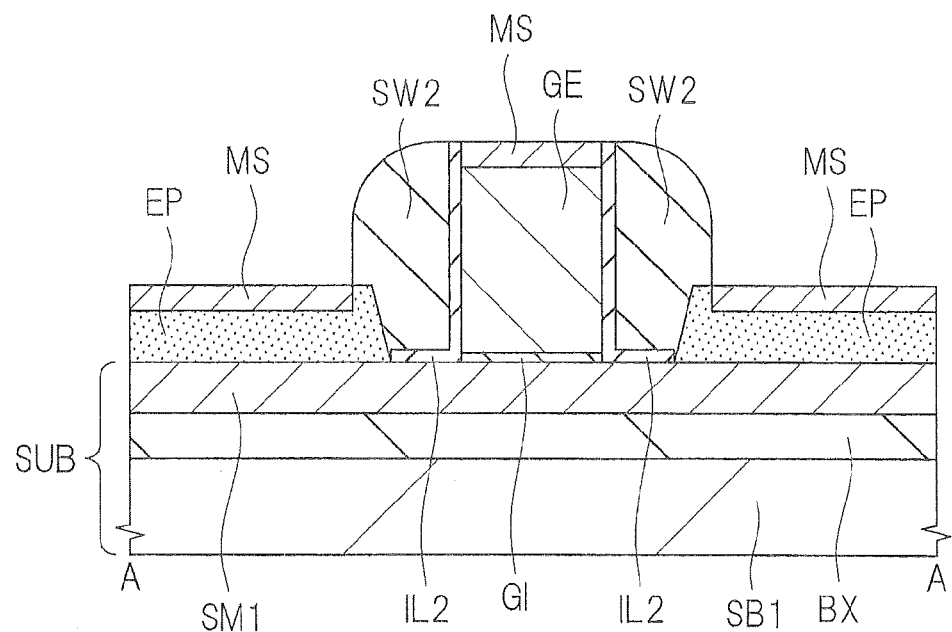
FIG. 32 is a cross-sectional view A-A during steps of manufacturing the semiconductor device, continued from FIG. 30.
Figure 33:
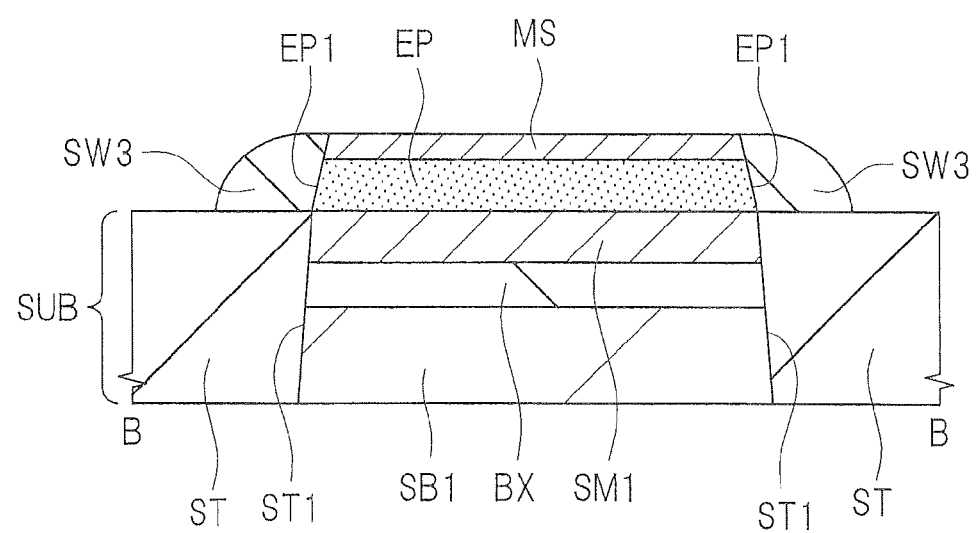
FIG. 33 is a cross-sectional view B-B during steps of manufacturing the semiconductor device as the same as FIG. 32.

That is, first, the surface of the n⁺ type semiconductor region SD (specifically, the surface of the semiconductor layer EP in portions that are not covered with the gate electrode GE, the insulating film IL2 and the sidewall spacer SW2) is exposed. When the oxide film OX1 remains on the surface of the semiconductor layer EP, the oxide film OX1 is removed to expose the surface of the semiconductor layer EP. Then, as illustrated in FIG. 30 (the cross-sectional view A-A) and FIG. 31 (the cross-sectional view B-B), the metal film ME is formed on the main surface (entire surface) of the SOI substrate SUB so as to cover the gate electrode GE, the insulating film IL2, the sidewall spacers SW2 and SW3, and the n⁺ type semiconductor region SD. The metal film ME is formed of, for example, a cobalt (Co) film, a nickel (Ni) film, a nickel platinum alloy film, or others, and can be formed by using a spattering method or others. Then, the metal film ME and (the semiconductor layer EP forming) the n⁺ type semiconductor region SD are reacted with each other by thermal process. In this manner, as illustrated in FIG. 32 (the cross-sectional view A-A) and FIG. 33 (the cross-sectional view B-B), the metal silicide layer MS which is the reaction layer of the metal film ME and (the semiconductor layer EP forming) the n⁺ type semiconductor region SD (a reaction layer of metal and semiconductor) is formed on the surface of the n⁺ type semiconductor region SD (that is, the surface of the semiconductor layer EP). Then, an unreacted metal film ME is removed, and FIG. 32 (the cross-sectional view A-A) and FIG. 33 (the cross-sectional view B-B) illustrate this stage.

When the semiconductor layer EP is a silicon layer and the metal film ME is a cobalt film, the metal silicide layer MS is to be a cobalt silicide layer. When the semiconductor layer EP is a silicon layer and the metal film ME is a nickel film, the metal silicide layer MS is to be a nickel silicide layer. When the semiconductor layer EP is a silicon layer and the metal film ME is a nickel platinum alloy film, the metal silicide layer MS is to be a nickel platinum silicide layer. By forming the metal silicide layer MS, resistances such as diffusion resistance or contact resistance of the n⁺ type semiconductor region SD can be lowered.

While the metal silicide layer MS is formed on the surface (upper layer portion) of the n⁺ type semiconductor region SD, the metal silicide layer MS formed on the surface of the n⁺ type semiconductor region SD is mainly formed on the semiconductor layer EP. Further, since the side wall EP1 of the semiconductor layer EP is covered with the sidewall spacer SW3, the formation of the metal silicide layer MS on the side wall EP1 of the semiconductor layer EP can be prevented.

Further, when the above-described metal film ME is formed in a state in which the gate electrode GE is formed of a silicon film such as a polysilicon film and the upper surface of the gate electrode GE is exposed (that is, a state in which the above-described insulating film IL1 is removed from the gate electrode GE), the metal silicide layer MS is formed also on the gate electrode GE by the reaction of Si forming the gate electrode GE and the metal film ME in step S12. Since the side walls of the gate electrode GE are covered with the insulating film IL2 and the sidewall spacer SW2, the metal silicide layer MS is not formed on the side walls of the gate electrodes GE.

In step S12, a metal compound layer which is a compound layer (reaction layer) of the metal and (the chemical element forming) the semiconductor layer EP, which is the metal silicide layer MS here, is formed on the semiconductor layer EP. When the semiconductor layer EP is a silicon (Si) layer, the metal silicide layer MS is formed on the semiconductor layer EP. However, when the semiconductor layer EP is a SiGe (silicon germanium) layer, a metal silicon germanide layer is formed instead of the metal silicide layer MS. Also, when the semiconductor layer EP is a Ge (germanium) layer, a metal germanide layer is formed instead of the metal silicide layer MS.

Figure 34:
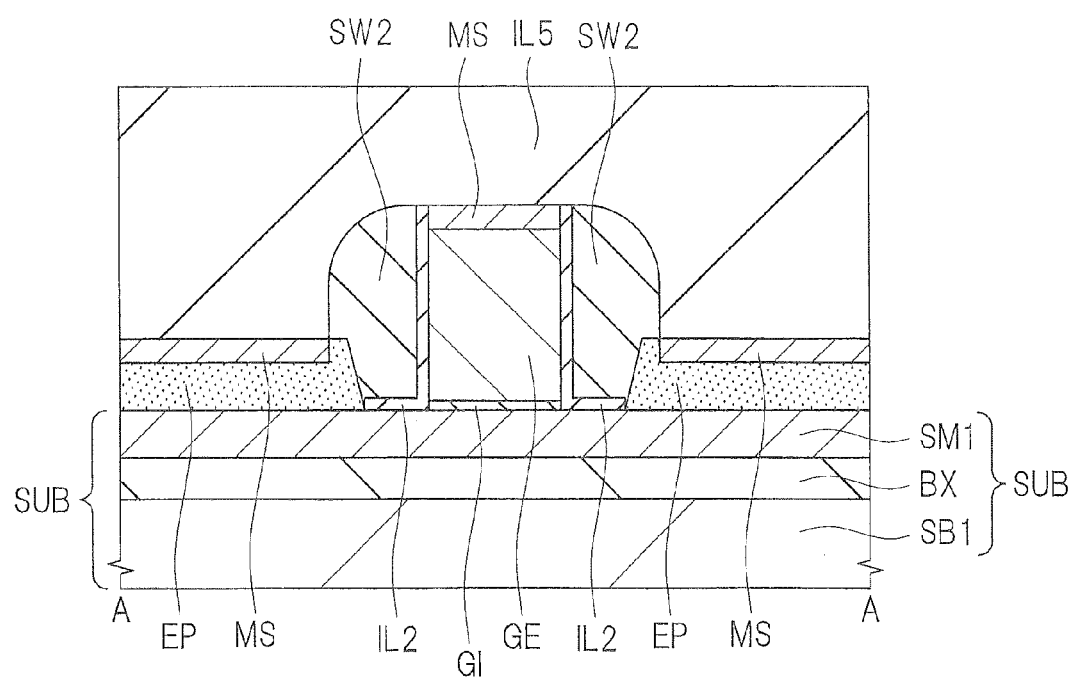
FIG. 34 is a cross-sectional view A-A during steps of manufacturing the semiconductor device, continued from FIG. 32.
Figure 35:
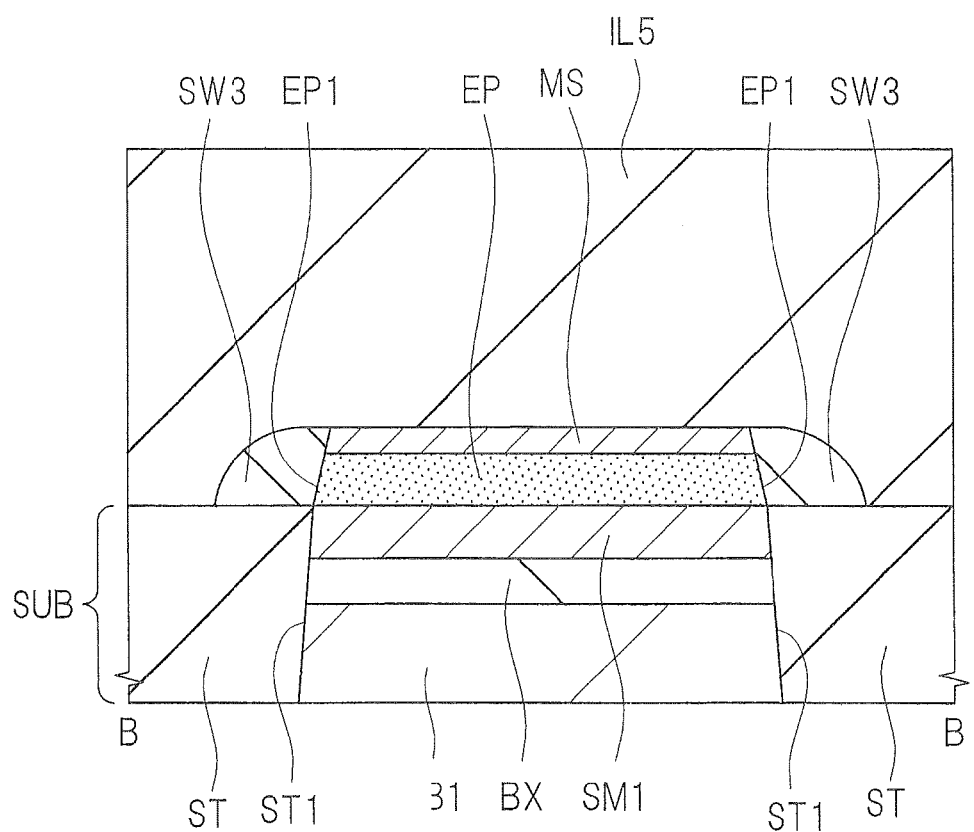
FIG. 35 is a cross-sectional view B-B during steps of manufacturing the semiconductor device as the same as FIG. 34.

Next, as illustrated in FIG. 34 (the cross-sectional view A-A) and FIG. 35 (the cross-sectional view B-B), an insulating film (interlayer insulating film) IL5 is formed on the main surface (entire main surface) of the SOI substrate SUB as an interlayer insulating film (step S13 of FIG. 2). That is, the insulating film IL5 is formed on the main surface of the SOI substrate SUB so as to cover the gate electrode GE, the semiconductor layer EP, the sidewall spacers SW2 and SW3 and the metal silicide layer MS.

As the insulating film IL5, it is possible to use, for example, a laminated film of a silicon nitride film and a silicon oxide film on the silicon nitride film (silicon oxide film that is thicker than the silicon nitride film), a single film of a silicon oxide film, or others. In the silicon oxide film for the insulating film IL5, silicon oxide is mainly contained, and one or more types of carbon (C), fluorine (F), nitrogen (N), boron (B) and phosphorous (P) can be further contained.

After forming the insulating film IL5, flatness of an upper surface of the insulating film IL5 can be enhanced by polishing the upper surface of the insulating film IL5 by a CMP method or others.

Figure 36:
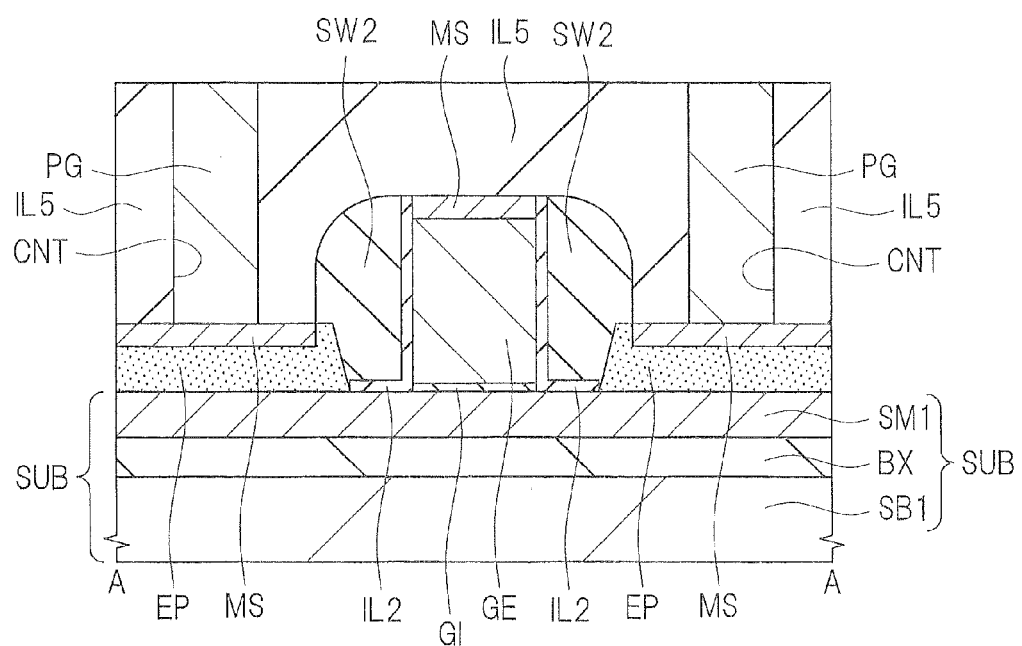
FIG. 36 is a cross-sectional view A-A during steps of manufacturing the semiconductor device, continued from FIG. 34.
Figure 37:
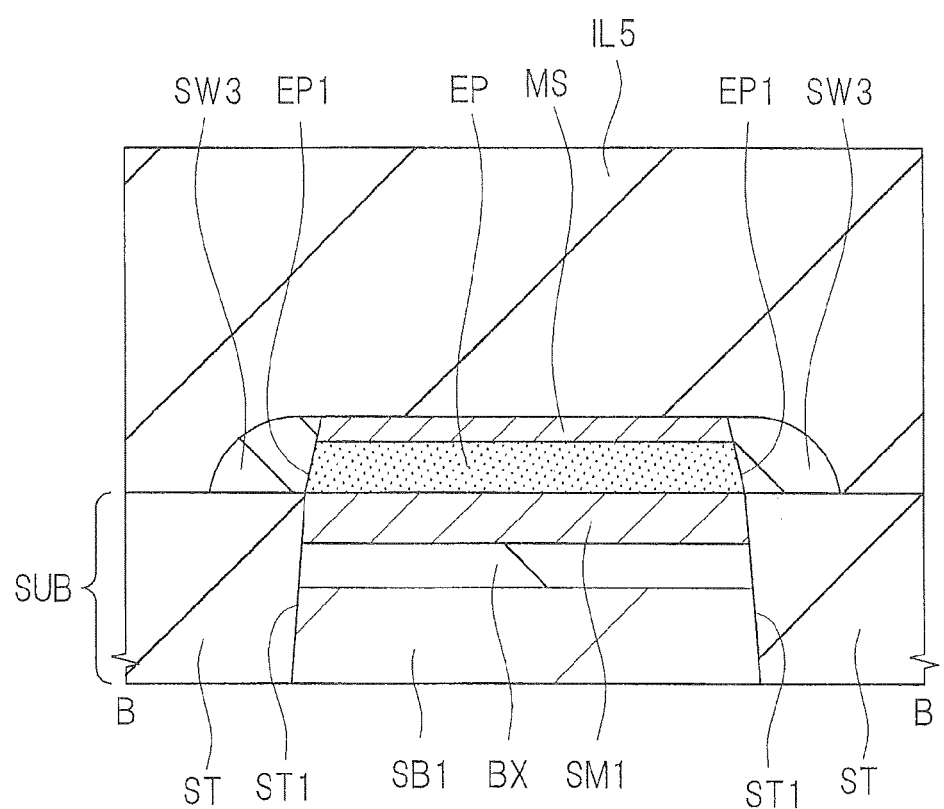
FIG. 37 is a cross-sectional view B-B during steps of manufacturing the semiconductor device as the same as FIG. 36.

Next, as illustrated in FIG. 36 (the cross-sectional view A-A) and FIG. 37 (the cross-sectional view B-B), a contact hole (through hole, hole) CNT is formed in the insulating film IL5 by dry etching of the insulating film IL5 using a photoresist pattern (not illustrated) formed on the insulating film IL5 as an etching mask. The contact hole CNT is formed so as to penetrate through the insulating film IL5.

The contact hole CNT is formed on, for example, an upper portion of the $n^+$ type semiconductor region SD (that is, an upper portion of the metal silicide layer MS formed on an upper layer portion of the semiconductor layer EP) or others. At a bottom portion of the contact hole CNT formed on the upper portion of the semiconductor layer EP, the metal silicide layer MS on the semiconductor layer EP is exposed.

Next, a conductive plug PG formed of tungsten (W) or others is formed (embedded) inside the contact hole CNT as a conductive portion for connection. The plug PG can be formed as follows.

For forming the plug PG, first, a barrier conductive film (such as a titanium film, a titanium nitride film or a laminated film of them) is formed on the insulating film IL5 including an inner portion of the contact hole CNT (bottom portion and side wall) by a spattering method or a plasma CVD method. Then, a main conductive film formed of a tungsten film or others is formed on the barrier conductive film by a CVD method or others so as to fill the contact hole CNT. Then, unnecessary portions of the main conductive film and the barrier conductive film on an outer portion of the contact hole CNT (on the insulating film IL5) are removed by a CMP method, an etch back method, or others. In this manner, the upper surface of the insulating film IL5 is exposed, and the plug PG is formed of the barrier conductive film and the main conductive film embedded and remaining inside the contact hole CNT of the insulating film IL5. Note that FIG. 36 illustrates the barrier conductive film and the main conductive film forming the plug PG so as to be an integrated form for simplifying the drawing.

The plug PG embedded in the contact hole CNT formed on the upper portion of the $n^+$ type semiconductor region SD (that is, the upper portion of the semiconductor layer EP) is, at its bottom portion, adjacent to and electrically connected to the metal silicide layer MS on the surface of the $n^+$ type semiconductor region SD (semiconductor layer EP). Therefore, from a later-described wiring M1 through the plug PG, a desired electric potential (source potential or drain potential) can be supplied to the metal silicide layer MS on the surface of the $n^+$ type semiconductor region SD (semiconductor layer EP) (and thus, to the $n^+$ type semiconductor region SD below the metal silicide layer MS and to the $n^-$ type semiconductor region EX electrically connected to the $n^+$ type semiconductor region SD).

Further, although not illustrated, when the contact hole CNT and the plug PG embedded therein are formed also on the gate electrode GE, the plug PG is, at the bottom portion of the plug PG, in contact with and electrically connected to the gate electrode GE (or the metal silicide layer MS when the metal silicide layer MS is formed on the gate electrode GE).

Figure 38:
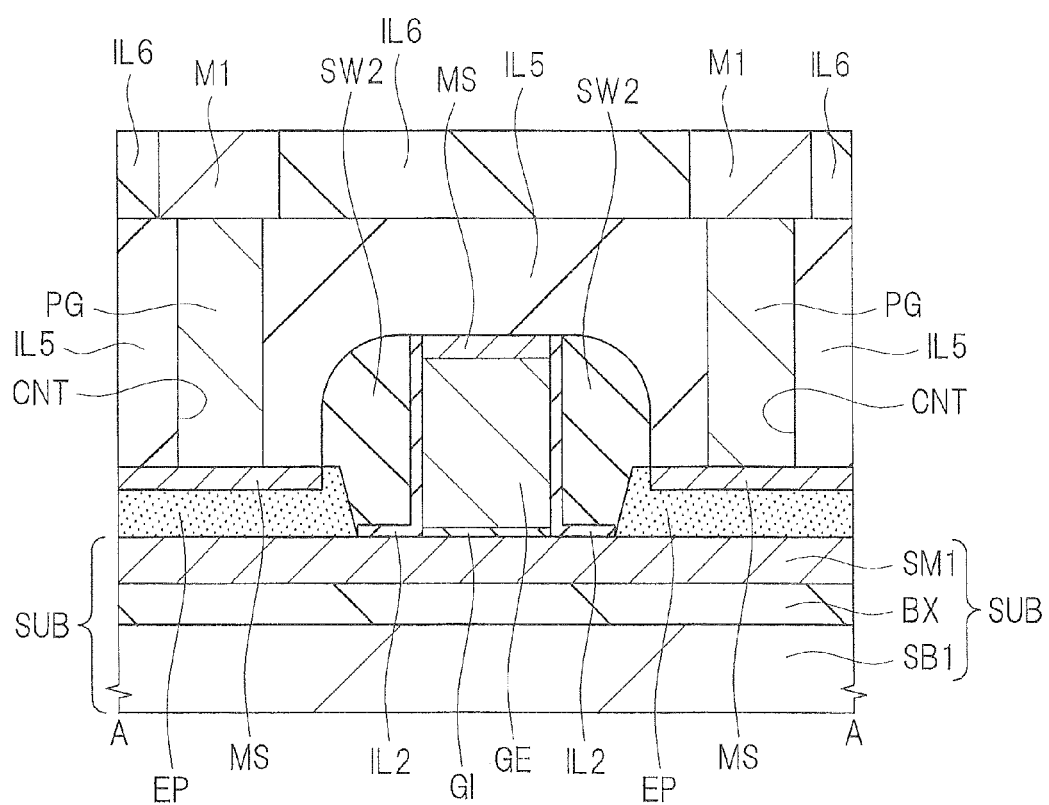
FIG. 38 is a cross-sectional view A-A during steps of manufacturing the semiconductor device, continued from FIG. 36.
Figure 39:
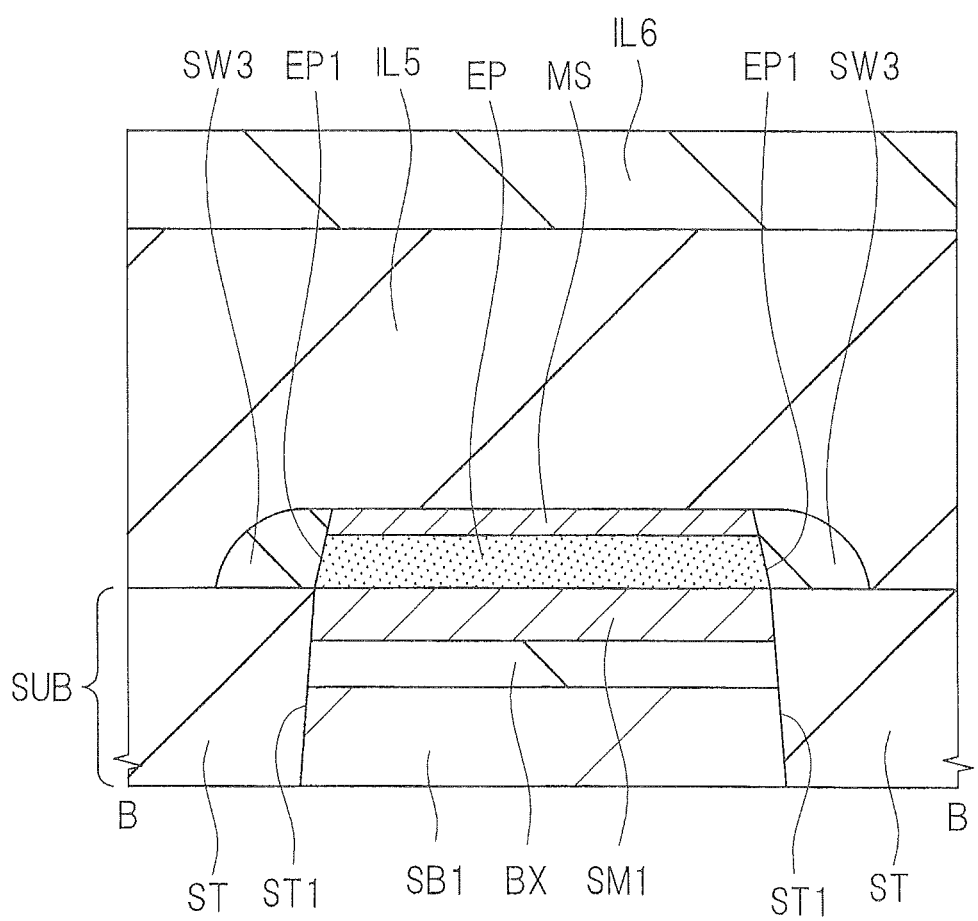
FIG. 39 is a cross-sectional view B-B during steps of manufacturing the semiconductor device as the same as FIG. 38.

Next, as illustrated in FIG. 38 (the cross-sectional view A-A) and FIG. 39 (the cross-sectional view B-B), an insulating film IL6 for forming wirings is formed on the insulating film IL5 in which the plug PG is embedded. The insulating film IL6 can be a single film (single insulating film) or a laminated film (laminated insulating film).

Next, a wiring of a first layer is formed by a single damascene method. First, a wiring trench (trench for embedding the wiring M1 therein) is formed in a specified region of the insulating film IL6 by dry etching using a photoresist pattern (not illustrated) as a mask, and then, a barrier conductive film (barrier metal film) is formed on the main surface of the SOI substrate SUB (that is, on the insulating film IL6 including a bottom portion and a side wall of the wiring trench). As the barrier conductive film, for example, a titanium nitride film, a tantalum film, a tantalum nitride film, or others can be used. Subsequently, a copper seed layer is formed on the barrier conductive film by a CVD method, a spattering method, or others, and a copper plating film (main conductive film) is further formed on the seed layer by using an electroplating method or others. The copper plating film fills an inner portion of the wiring trench. Then, the copper plating film, the seed layer and the barrier metal film in other region than the wiring trench are removed by a CMP method, and the wiring M1 of the first layer containing copper as a main conductive material is formed inside the wiring trench. Note that FIG. 38 illustrates the copper plating film, the seed layer and the barrier metal film forming the wiring M1 so as to be an integrated form for simplifying the drawing. The wiring M1 is connected to the plug PG and is electrically connected to the $n^+$ type semiconductor region SD and others via the plug PG. Therefore, a predetermined voltage (source voltage or drain voltage) can be supplied to the $n^+$ type semiconductor region SD from the wiring M1 through the plug PG and the metal silicide layer MS (metal silicide layer MS that is formed on the $n^+$ type semiconductor region SD and that is in contact with the plug PG).

Then, wirings of the second and subsequent layers are formed by a dual damascene method. However, its illustration and explanation are omitted here. The wiring M1 and wirings of the second and subsequent layers are not limited to damascene wirings but can also be formed by patterning a conductive film for the wiring. For example, it can be a tungsten wiring or an aluminum wiring.

Further, in the present embodiment, the case of the formation of the n-channel type MISFET as the MISFET has been explained. However, the conductive type is reversed, and a p-channel type MISFET can be also formed. Also, both of the n-channel type MISFET and the p-channel type MISFET can be formed on the same SOI substrate SUB.

<Main Feature and Effect>

In the method of manufacturing the semiconductor device according to the present embodiment, in step S1, an SOI substrate SUB is prepared as a semiconductor substrate. In step S3, a gate electrode GE is formed on the SOI substrate SUB via a gate insulating film GI. Then, in step S4, a laminated film LM including an insulating film IL2 and an insulating film IL3 on the insulating film IL2 is formed on the SOI substrate SUB so as to cover the gate electrode GE, and then, the laminated film LM is etched back to form a sidewall spacer SW1 (side wall insulating film) formed of the laminated film LM on side walls of the gate electrode GE. Then, in step S5, a semiconductor layer EP is epitaxially grown on portions of a semiconductor layer SM1 on the SOI substrate SUB which are not covered with the gate electrode GE and the sidewall spacer SW1 but are exposed. Then, in step S6, the surface of the semiconductor layer EP is oxidized to form an oxide film OX1 on the surface of the semiconductor layer EP. Then, in step S7, the insulating film IL3 forming the sidewall spacer SW1 is removed.

One of the main features of the present embodiment is to perform step S6 (step of forming the oxide film OX1) between step S5 (step of forming the semiconductor layer EP) and step S7 (step of removing the insulating film IL3). A purpose of this step S6 (step of forming the oxide film OX1) will be explained with reference to FIG. 40 and FIG. 41.

Figure 40:
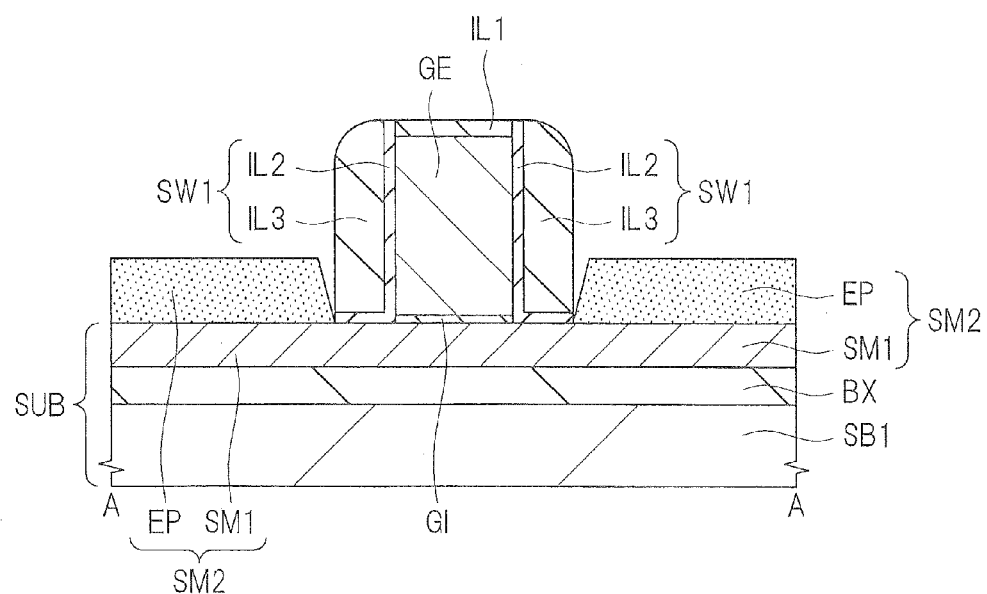
FIG. 40 is a cross-sectional view of a principal part during steps of manufacturing a semiconductor device according to a first study example.
Figure 41:
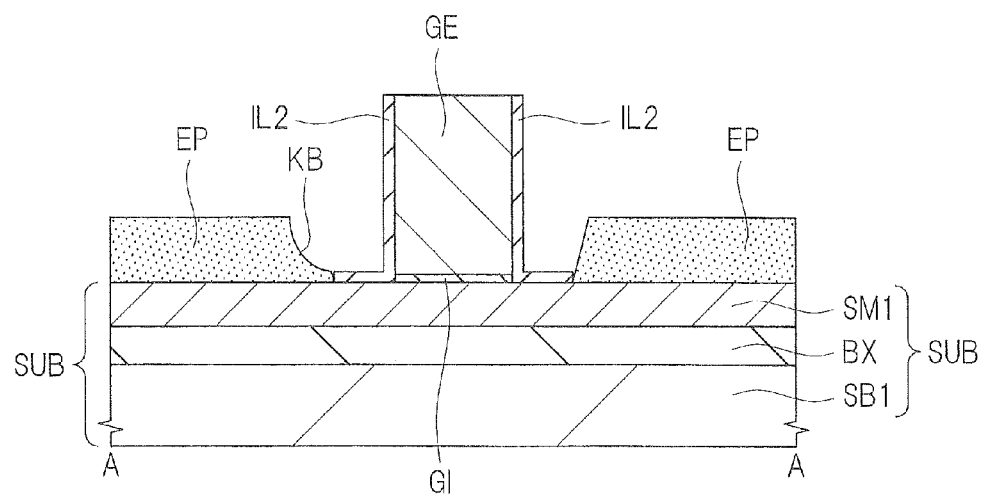
FIG. 41 is a cross-sectional view of a principal part during steps of manufacturing the semiconductor device according to the first study example, continued from FIG. 40.

FIG. 40 and FIG. 41 are cross-sectional views of a principal part during a step of manufacturing the semiconductor device of a first study example studied by the inventor.

FIG. 40 corresponds to a stage at which steps up to the step of forming the semiconductor layer EP in step S5 in the present embodiment have been completed so as to form the same structure as that of FIG. 15.

In the first study example, after forming the semiconductor layer EP by an epitaxial method, the above-described step S6 (step of forming the oxide film OX1) is not performed but a step of removing the insulating film IL3 corresponding to the above-described step S7 is performed as different from the present embodiment as illustrated in FIG. 40, and FIG. 41 illustrates a stage at which the step of removing the insulating film IL3 has been completed. In the first study example, the insulating film IL2 is formed of a silicon oxide film, the insulating film IL3 is formed of a silicon nitride film, and the insulating film IL3 (silicon nitride film) forming the sidewall spacer SW1 is selectively etched and removed by wet etching.

In the first study example, the above-described step S6 (step of forming the oxide film OX1) has not been performed as different from the present embodiment, and therefore, there is a risk that the semiconductor layer EP is etched and cut off by etching liquid because the semiconductor layer EP is exposed to the etching liquid during the removal of the insulating film IL3 forming the sidewall spacer SW1 by the etching. As one example, FIG. 41 illustrates a state in which the semiconductor layer EP is cut off so as to form a dent portion KB during the removal of the insulating film IL3 forming the sidewall spacer SW1 by the etching.

For example, the wet etching using a phosphoric acid solution is suitable for etching a silicon nitride film, and a silicon oxide film has a high resistance to the phosphoric acid solution. However, a resistance of a semiconductor layer such as a single crystalline silicon layer to the phosphoric acid solution is lower than that of the silicon oxide film. Almost the same goes for other etching solutions so that the silicon oxide film has a high resistance to solution suitable for etching the silicon nitride film, the semiconductor layer such as the single crystal silicon layer has a low resistance thereto.

There is a risk of occurrence of various inconveniences when the semiconductor layer EP is affected and cut off by the etching during the removal of the insulating film IL3 forming the sidewall spacer SW1 by the etching. For example, when a thinned portion is caused by cutting off the semiconductor layer EP, this leads to occurrence of a thinned portion in the source/drain region ($n^+$ type semiconductor region SD), and therefore, this leads to increase in a resistance of the source/drain region. This reduces the performance of the semiconductor device. Also, this reduces the manufacturing yield of the semiconductor device. When the semiconductor layer EP is cut off, unevenness is generated on the surface of the semiconductor layer EP, shapes of the semiconductor layer EP differ from each other for each active region (and thus each MISFET element), and therefore, there is a risk that a property of the MISFET element is different depending on each element. This leads to reduction in the performance of the semiconductor device. Also, this reduces the manufacturing yield of the semiconductor device. When the contact hole CT is formed on the thinned portion caused by cutting off the semiconductor layer EP, the contact hole CNT penetrates through the semiconductor layer EP and the semiconductor layer SM1, and reaches the insulating layer BX since the semiconductor layer EP is thin, and there is a risk of leakage between the above-described plug PG and the substrate SB1. This reduces the performance of the semiconductor device. Also, this reduces the manufacturing yield of the semiconductor device.

Therefore, it is desired to prevent the semiconductor layer EP from being affected by the etching as much as possible during the removal of the insulating film IL3 forming the sidewall spacer SW1 by the etching.

On the other hand, in the present embodiment, after epitaxially growing the semiconductor layer EP in step S5, the surface of the semiconductor layer EP is oxidized in step S6 to form an oxide film OX1 on the surface of the semiconductor layer EP, and then, the insulating film IL3 forming the sidewall spacer SW1 is removed in step S7.

Therefore, step S7 (step of removing the insulating film IL3) can be performed in a state in which the oxide film OX1 is formed on the surface of the semiconductor layer EP. Therefore, in step S7, while removing the insulating film IL3 forming the sidewall spacer SW1, the oxide film OX1 can be functioned as a protecting film of the semiconductor layer EP. In this manner, the etching of the semiconductor layer EP in step S7 can be prevented or suppressed. Therefore, the performance of the semiconductor device can be improved. Also, the manufacturing yield of the semiconductor device can be improved.

Further, in step S7 in the present embodiment, in a viewpoint that the insulating film IL3 forming the sidewall spacer SW1 is selectively removed and that the oxide film OX1 is functioned as the protecting film of the semiconductor layer EP, the following devises are made in selecting etching conditions and materials of the respective films.

That is, in step S7, it is preferable that etching is performed under such a condition as causing the etching for the oxide film OX1 to be more difficult than the etching for the insulating film IL3 and to remove the insulating film IL3 forming the sidewall spacer SW1. In this manner, the etching of the semiconductor layer EP can be prevented or suppressed although the insulating film IL3 in step S7 is accurately removed.

Further, in step S7, it is preferable that etching is performed under such a condition as causing the etching for the insulating film IL2 to be more difficult than the etching for the insulating film IL3, and to remove the insulating film IL3 forming the sidewall spacer SW1. In this manner, the etching of the insulating film IL2 can be prevented or suppressed although the insulating film IL3 in step S7 is accurately removed.

Accordingly, in step S7, it is more preferable that etching is performed under such a condition as causing the etching for the insulating film IL2 and the oxide film OX1 to be more difficult than the etching for the insulating film IL3 and to remove the insulating film IL3 forming the sidewall spacer SW1. In this manner, the insulating film IL3 can be selectively removed in step S7.

Further, in step S7, it is further preferable that etching is performed under such a condition as causing the etching for the oxide film OX1 to be more difficult than the etching for the semiconductor layer EP. In this manner, etching is performed in step S7 in a state in which the oxide film OX1 which is more difficult to be etched (and thus has a higher etching resistance) than the semiconductor layer EP is formed on the surface of the semiconductor layer EP, and therefore, a benefit of the effects caused by forming the oxide film OX1 as the etching protecting film can be accurately obtained. That is, compared to the benefit of the effects of preventing or suppressing the etching of the semiconductor layer EP by the function of the oxide film OX1 as the etching protecting film in step S7 can be more accurately obtained in a case in which the oxide film OX1 is formed with performing step S6 than a case in which the oxide film OX1 is not formed without performing step S6.

In step S7, it is preferable to use wet etching. It is also preferable to form the insulating film IL3 of silicon nitride and to form the insulating film IL2 of silicon oxide. In this manner, the insulating film 113 can be more accurately selectively removed in step S7.

In the present embodiment, since it is possible to prevent or suppress the cutting off of the semiconductor layer EP because of being affected by the etching during the removal of the insulating film IL3 forming the sidewall spacer SW1 by the etching in step S7, various inconveniences that have been explained in the above-described study example can be prevented or suppressed. For example, since the cutting off and thinning of the semiconductor layer EP can be prevented or suppressed, the increase in the resistance of the source/drain region due to the fact that the thickness of the semiconductor layer EP is reduced. Further, since the difference in the shape of the semiconductor layer EP for each active region (and thus each MISFET element) due to the fact that the semiconductor layer EP is cut off can be prevented or suppressed, the variation of the property of the MISFET element for each element can be prevented or suppressed. The occurrence of the leakage between the above-described plug PG and the substrate SB1 due to the cutting off and thinning of the semiconductor layer EP can be prevented or suppressed. Accordingly, the performance of the semiconductor device can be improved. Also, the manufacturing yield of the semiconductor device can be improved.

Further, as different from the present embodiment, it is considered to form a nitride film (silicon nitride film) on the surface of the semiconductor layer EP in step S6 by not an oxidation process but a nitriding process. In this case, it is preferable to form the insulating film IL3 of a silicon oxide film and the insulating film IL2 of a silicon nitride film. However, when a nitride film is formed on the surface of the semiconductor layer EP instead of an oxide film, it is concerned that the similar inconveniences to the case of the cutting off of the semiconductor layer EP in step S7 are caused since the semiconductor layer EP which is the base is cut off if the nitride film is removed from the surface of the semiconductor layer EP. Even if so, when the above-described metal film ME is formed with the nitride film being formed on the surface of the semiconductor layer EP, the above-described metal silicide layer MS cannot be formed on the surface of the semiconductor layer EP.

On the other hand, in the present embodiment, the oxidation process is performed instead of the nitriding process in step S6 to form the oxide film OX1 on the surface of the semiconductor layer EP instead of the nitride film in step S6. The oxide film OX1 can be etched at a higher selectivity with respect to the semiconductor layer EP which is the base (for example, a silicon layer) than that of the nitride film. That is, when the nitride film is formed on the surface of the semiconductor layer EP by the nitriding process, the semiconductor layer EP which is the base is easier to be cut off when the nitride film is removed. Compared with this, when the oxide film OX1 is formed on the surface of the semiconductor layer EP by the oxidation process, the oxide film OX1 can be selectively removed while preventing or suppressing the cutting off of the semiconductor layer EP which is the base.

Therefore, in the present embodiment, the oxide film OX1 that can be removed at a high selectivity with respect to the semiconductor layer EP is formed on the surface of the semiconductor layer EP in step S6, and the insulating film IL3 is removed while using the oxide film OX1 as the protecting film of the semiconductor layer EP in step S7. Therefore, the insulating film IL3 can be selectively removed while protecting the semiconductor layer EP with the oxide film OX1 in step 7, and besides, to the oxide film OX1 on the surface of the semiconductor layer EP can be easily and accurately removed while preventing or suppressing the cutting off of the semiconductor layer EP which is the base until the step of forming above-described metal film ME is performed after step S7. In this manner, the above-described metal film ME can be formed in a state in which the portion of the surface of the semiconductor layer EP which is not covered with the above-described sidewall spacer SW2 is exposed, and therefore, the above-described metal silicide layer MS which is the reaction layer of the semiconductor layer EP and the metal film ME can be accurately formed on the upper portion of the semiconductor layer EP. And, since the oxide film OX1 on the surface of the semiconductor layer EP can be removed while preventing or suppressing the cutting off of the semiconductor layer EP which is the base, it is possible to prevent or suppress generation of inconveniences due to the cutting off of the semiconductor layer EP. Therefore, the performance of the semiconductor device can be improved. Also, the manufacturing yield of the semiconductor device can be improved.

Further, in the present embodiment, the case of the usage of the SOI substrate SUB as the semiconductor substrate has been explained. As another embodiment, a single crystalline silicon substrate or others can be used instead of the SOI substrate SUB as the semiconductor substrate. Steps of manufacturing the semiconductor device are basically the same as the manufacturing steps in the above-described present embodiment also in the case of the usage of the single crystalline silicon substrate instead of the SOI substrate SUB. This is briefly described as follows.

That is, first, in the above-described step S1, a single crystalline silicon substrate is prepared as the semiconductor substrate. Then, in the above-described step S2, an element isolation region ST is formed on the single crystalline silicon substrate by a STI (Shallow Trench Isolation) method or others. While the step S2 is the same between the case of the usage of the single crystalline silicon substrate as the semiconductor substrate and the case of the usage of the SOI substrate SUB as the semiconductor substrate, the element isolation region ST is formed of an insulating film embedded in a trench (element isolation trench) formed on the single crystalline silicon substrate.

Then, a p-type well is formed by ion implantation of a p-type impurity (such as boron) to the single crystalline substrate in a region where an n-channel type MISFET is to be formed. Then, in the above-described step S3, a gate electrode GE is formed via a gate insulating film GI on a main surface of the single crystalline silicon substrate (specifically on a p-type well). While the step S3 is the same between the case of the usage of the single crystalline silicon substrate as the semiconductor substrate and the case of the usage of the SOI substrate SUB as the semiconductor substrate, the gate electrode GE is formed on not the above-described semiconductor layer SM1 but the main surface of the single crystalline substrate (specifically the p-type well) via the gate insulating film GI.

Then, in the above-described step S4, a sidewall spacer SW1 is formed on side walls of the gate electrode GE. The step S4 is the same between the case of the usage of the single crystalline silicon substrate as the semiconductor substrate and the case of the usage of the SOI substrate SUB as the semiconductor substrate. Then, in the above-described step S5, a semiconductor layer EP is epitaxially grown. While the step S5 is the same between the case of the usage of the single crystalline silicon substrate as the semiconductor substrate and the case of the usage of the SOI substrate SUB as the semiconductor substrate, the semiconductor layer EP grows on not the semiconductor layer SM1 but the single crystalline silicon substrate SUB. That is, the semiconductor layer EP epitaxially grows on portions of the single crystalline silicon substrate are not covered with the gate electrode GE and the sidewall spacer SW1 but exposed.

Then, in the above-described step S6, the surface of the semiconductor layer EP is oxidized to form an oxide film OX1 on the surface of the semiconductor layer EP. Then, in the above-described step S7, an insulating film IL3 forming the sidewall spacer SW1 is removed by etching. The steps S6 and S7 are the same between the case of the usage of the single crystalline silicon substrate as the semiconductor substrate and the case of the usage of the SOI substrate SUB as the semiconductor substrate.

Then, in the above-described step S8, an n⁻ type semiconductor region EX is formed by ion implantation. While the step S8 is the same between the case of the usage of the single crystalline silicon substrate as the semiconductor substrate and the case of the usage of the SOI substrate SUB as the semiconductor substrate, the n⁻ type semiconductor region EX is formed on not the semiconductor layer SM1 but the single crystalline silicon substrate.

Then, in the above-described step S9, sidewall spacers SW2 and SW3 are formed on a side wall of the gate electrode GE and a side wall of the semiconductor layer EP. The step S9 is the same between the case of the usage of the single crystalline silicon substrate as the semiconductor substrate and the case of the usage of the SOI substrate SUB as the semiconductor substrate.

Then, in the above-described step S10, an n⁺ type semiconductor region SD is formed by ion implantation. While the step S10 is the same between the case of the usage of the single crystalline silicon substrate as the semiconductor substrate and the case of the usage of the SOI substrate SUB as the semiconductor substrate, the n⁺ type semiconductor region SD is formed on not the semiconductor layer EP and the semiconductor layer SM1 but the semiconductor layer EP and the single crystalline silicon substrate.

Then, activation annealing (thermal process) is performed in the above-described step S11, and a metal silicide layer MS is formed by a silicide technique in the above-described step S12. The steps S11 and S12 are the same between the case of the usage of the single crystalline silicon substrate as the semiconductor substrate and the case of the usage of the SOI substrate SUB as the semiconductor substrate.

Then, the above-described insulating film IL5 is formed, the above-described contact hole CNT is formed, the above-described plug PG is formed, the above-described insulating film IL6 is formed and the above-described wiring M1 is formed. These steps are the same between the case of the usage of the single crystalline silicon substrate as the semiconductor substrate and the case of the usage of the SOI substrate SUB as the semiconductor substrate.

Even when the single crystalline silicon substrate is used instead of the SOI substrate SUB, the step S7 (step of removing the insulating film IL3) can be performed in a state in which the oxide film OX1 is formed on the surface of the semiconductor layer EP by oxidizing the surface of the semiconductor layer EP to form the oxide film OX1 on the surface of the semiconductor layer EP after step S5 (step of forming the semiconductor layer EP) but before step S7 (step of removing the insulating film IL3). Therefore, in step S7, while removing the insulating film IL3 forming the sidewall spacer SW1, the oxide film OX1 can be functioned as the protecting film of the semiconductor layer EP. In this manner, the etching of the semiconductor layer EP in step S7 can be prevented or suppressed.

Accordingly, even when the single crystalline silicon substrate is used instead of the SOI substrate SUB as the semiconductor substrate, inconveniences due to the cut off of the semiconductor layer EP by the etching in step S7 can be prevented or suppressed. Therefore, the present embodiment is effective in not only the case of the usage of the SOI substrate SUB but also the case of the usage of the single crystalline substrate or others as the semiconductor substrate.

However, in the present embodiment, a particularly large effect is obtained in the case of the usage of the SOI substrate SUB as the semiconductor substrate. This is because the inconveniences due to the cut off of the semiconductor layer EP by the etching in step S7 are particularly easier to occur in the case of the usage of the SOI substrate SUB than the case of the usage of the single crystalline silicon substrate as the semiconductor substrate.

That is, when the thinned portion is generated by cutting off the semiconductor layer EP, this leads to generation of the thinned portion in the source/drain region (n⁺ type semiconductor region SD), and therefore, this leads to the increase in the resistance of the source/drain region. Here, in the case of the usage of the the SOI substrate SUB as the semiconductor substrate, the thickness of the semiconductor layer SM1 is small, and therefore, generation of the thinned portion by cutting off the semiconductor layer EP tends to the increase in the resistance of the source/drain region. Further, the cut off of the semiconductor layer EP leads to making the difference in the shape of the semiconductor layer EP among the MISFET elements, and therefore, there is a risk of variation of properties of the MISFET elements for each element. Here, in the case of the usage of the SOI substrate SUB as the semiconductor substrate, the thickness of the semiconductor layer SM1 is small, and therefore, the properties of the MISFET elements are easier to vary for each element when the semiconductor layer EP is cut off. Further, it is concerned that a leakage is generated between the above-described plug PG and the substrate SB1 when the above-described contact hole CNT is formed at the thinned portion generated by cutting off the semiconductor layer EP. This concern is a problem that could be caused in the case of the usage of the SOI substrate SUB as the semiconductor substrate.

Therefore, while the present embodiment is effective for not only the case of the usage of the SOI substrate SUB as the semiconductor substrate but also a case of usage of other semiconductor substrates such as the single crystalline silicon substrate, a particularly large effect is obtained when the present embodiment is applied to the case of the usage of the SOI substrate SUB as the semiconductor substrate.

Further, as described above, side walls (EP1, EP2) of the semiconductor layer EP that are formed in step S5 can take the substantially vertical case and the inclined case (corresponding to FIG. 15 and FIG. 16, respectively) with respect to the main surface of the SOI substrate SUB, and the present embodiment is effective for both cases.

However, by forming the oxide film OX1 on not only the upper surface of the semiconductor layer EP and the side wall EP1 but also the side surface EP2 of the semiconductor layer EP, the side surface EP2 of the semiconductor layer EP can be protected by the oxide film OX1 in step S7, the side surface EP2 having a risk of exposure by removing the insulating film IL3 forming the sidewall spacer SW1.

Thus, it is more preferable to form the oxide film OX1 on not only the upper surface of the semiconductor layer EP and the side wall EP1 but also the side surface EP2 of the semiconductor layer EP in step S6 in the present embodiment. Therefore, a larger effect can be obtained by applying the present embodiment to a case in which the side walls (EP1, EP2) of the semiconductor layer EP that have been formed in step S5 are inclined with respect to the main surface of the SOI substrate SUB (in this case, an angle formed between the side walls of the semiconductor layer EP and the upper surface of the semiconductor layer SM1 is an acute angle).

Features and effects of the present embodiment related to execution of the above-described step S6 have been described above, and therefore, other features and effects will be explained below.

165<Other Features and Effects>

Figure 42:
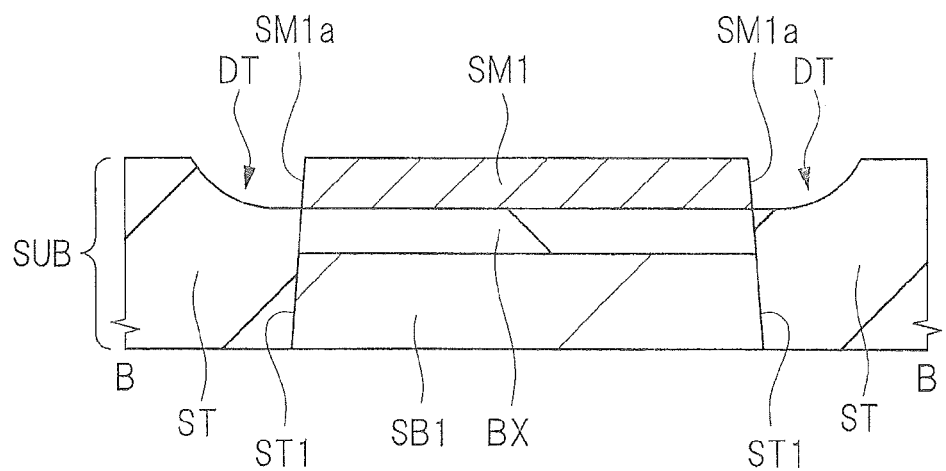
FIG. 42 is a cross-sectional view of a principal part during steps of manufacturing a semiconductor device according to a second study example.

In the present embodiment, it is possible to prevent inconveniences due to the exposure of the side wall (EP1) of the semiconductor layer EP can be prevented or suppressed by forming the sidewall spacer (side wall insulating film) SW3 on the side wall (EP1) of the semiconductor layer EP. For example, when the contact hole CNT is formed as illustrated in above-described FIG. 36, it might be that the position of the contact hole CNT bridges over both of the semiconductor layer EP and the element isolation region ST by mask shift or others in some cases. At this time, there is a risk that the element isolation region ST is etched so as to reach the substrate SB1 by the etching for forming the contact hole CNT. This becomes a more severe problem if the divot DT as illustrated in FIG. 42 described later occurs. Thus, by forming the side wall spacer (side wall insulating film) SW3 on the side wall (EP1) of the semiconductor layer EP as described in the present embodiment, an etching margin can be increased by the film thickness of the side wall spacer SW3. Accordingly, the performance of the semiconductor device can be improved.

Further, in the present embodiment, it is preferable to form a compound layer (here, the metal silicide layer MS) of metal and a chemical element forming the semiconductor layer EP on the upper portion of the semiconductor layer EP which is an epitaxial semiconductor layer for the source/drain.

By forming the sidewall spacer (side wall insulating film) SW3 on the side wall (EP1) of the semiconductor layer EP and forming the compound layer (here, the metal silicide layer MS) of the metal and the chemical element forming the semiconductor layer EP on the upper portion of the semiconductor layer EP, the formation of the metal silicide layer MS on the side wall of the semiconductor layer EP which is covered with the sidewall spacer SW3 can be prevented or suppressed. Therefore, it can be prevented or suppressed to cause inconveniences of abnormal growth of the metal silicide layer MS, which is formed on the side wall of the semiconductor layer EP, towards the insulating layer BX side (for example, leakage or short circuit between the semiconductor layer SM1 and the substrate SB1 through the abnormally-grown metal silicide layer MS).

Further, the present embodiment includes the element isolation region ST that is formed on the SOI substrate SUB and that penetrates through the semiconductor layer SM1 and the insulating layer BX and reaches the substrate SB1 which is the supporting substrate at its bottom portion, and the sidewall spacer SW3 is formed on the side wall EP1 of the semiconductor layer EP and is positioned on the element isolation region ST.

Since the sidewall spacer SW3 is formed on the side wall (EP1) of the semiconductor layer EP and is positioned on the element isolation region ST, the side wall (EP1) of the semiconductor layer EP that is adjacent to the element isolation region ST can be covered with the sidewall spacer SW3. Therefore, it can be prevented or suppressed to cause the inconveniences due to the abnormal growth of the metal silicide layer MS, which is formed on the side wall (EP1) of the semiconductor layer EP at the position which is adjacent to the element isolation region ST, towards the insulating layer BX side (for example, the leakage or the short circuit between the semiconductor layer SM1 and the substrate SB1 through the abnormally-grown metal silicide layer MS). Further, even if the divot (concave portion, dent portion) occurs in the element isolation region ST, the inconveniences due to the divot can be prevented or suppressed by the existence of the sidewall spacer SW3. For example, even if the side surface of the semiconductor layer SM1 is exposed at a position which is adjacent to the divot on the element isolation region ST, the exposed side surface can be covered with the sidewall spacer SW3. Therefore, the formation of the metal silicide layer MS on the side surface of the semiconductor layer SM1 at the position which is adjacent to the divot of the element isolation region ST can be prevented or suppressed, and the leakage or the short circuit between the semiconductor layer SM1 and the substrate SB1 caused due to the abnormal growth of the metal silicide layer MS can be prevented or suppressed. Accordingly, the performance of the semiconductor device can be improved. Also, the reliability of the semiconductor device can be improved.

Further, in the present embodiment, it is preferable to form the sidewall spacer SW3 on the side wall (EP1) of the semiconductor layer EP, and to position the sidewall spacer on the element isolation region ST, and also covers the side surface (SM1a) of the semiconductor layer SM1.

When the divot (concave portion, dent portion) or others occurs on the element isolation region ST, the side surface (SM1a) of the semiconductor layer SM1 is exposed at a position which is adjacent to the divot. However, since the sidewall spacer SW3 formed on the side wall (EP1) of the semiconductor layer EP is positioned on the element isolation region ST and also covers the side surface (SM1a) of the semiconductor layer SM1, it can be prevented or suppressed to form the metal silicide layer MS on the side wall (EP1) of the semiconductor layer EP and on the side surface (SM1a) of the semiconductor layer SM1 at a position which is adjacent to the element isolation region ST (position which is adjacent to the divot). Therefore, it can be prevented or suppressed to cause the inconveniences that are caused due to the abnormal growth of the metal silicide layer MS formed on the side wall (EP1) of the semiconductor layer EP and on the side surface (SM1a) of the semiconductor layer SM towards the insulating layer BX side (for example, the leakage or the short circuit between the semiconductor layer SM1 and the substrate SB1 through the abnormally-grown metal silicide layer MS). Accordingly, the performance of the semiconductor device can be improved. Also, the reliability of the semiconductor device can be improved.

Further, in the present embodiment, the sidewall spacer SW2 is preferably partially positioned on the semiconductor layer EP.

Since the sidewall spacer SW2 is partially positioned on the semiconductor layer EP, the formation of the metal silicide layer MS can be difficult on a portion of the surface of the semiconductor layer EP which is covered with the sidewall spacer SW2. Therefore, it can be prevented or suppressed to thin the effective thickness of the semiconductor region on the semiconductor layer SM1 due to the growing of the metal silicide layer MS formed on the surface of the semiconductor layer EP so as to reach inside of the semiconductor layer SM1. Therefore, the performance of the semiconductor device can be improved. Also, the reliability of the semiconductor device can be improved.

Hereinafter, other features of the present embodiment will be more specifically explained with reference to a second study example (FIG. 42 to FIG. 45) and a third study example (FIG. 49 and FIG. 50) which have been studied by the present inventor.

When a semiconductor device is manufactured by using the SOI substrate, a semiconductor layer for a source/drain is epitaxially grown on a semiconductor layer of the SOI substrate. In this manner, while, for example, causing a depth of a source/drain diffusion layer to be shallow, the resistance can be reduced, and a thickness of the semiconductor layer that is suitable for forming the metal silicide layer by the salicide process can be secured. Such a semiconductor device has been studied.

Figure 47:
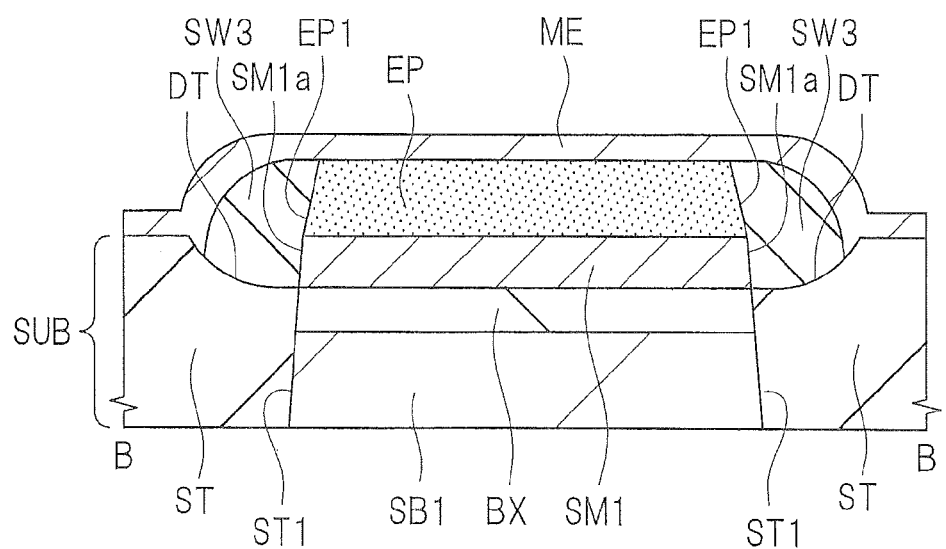
FIG. 47 is a cross-sectional view of a principal part during steps of manufacturing the semiconductor device according to one embodiment.
Figure 48:
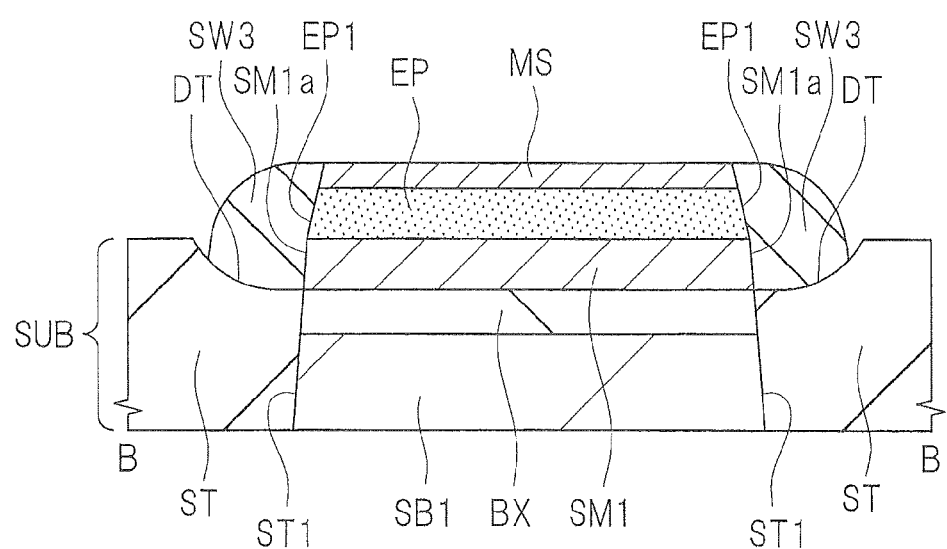
FIG. 48 is a cross-sectional view of a principal part during steps of manufacturing the semiconductor device according to one embodiment.

FIG. 42 to FIG. 45 are cross-sectional views of a principal part during steps of manufacturing the semiconductor device according to the second study example that has been studied by the present inventor. FIG. 46 to FIG. 48 are cross-sectional views of a principal part during steps of manufacturing the semiconductor device according to the present embodiment. Note that FIG. 46 corresponds to a cross-sectional view B-B at the stage of the formation the sidewall spacers SW2, SW3 in the above-described step S9 (that is, the stage of the step corresponding to the above-described FIG. 27). Further, FIG. 47 corresponds to the cross-sectional view B-B of the formation of the metal film ME in the above-described step S12 (that is, the stage of the step corresponding to the above-described FIG. 31). Further, FIG. 48 corresponds to the cross-sectional view B-B at a stage of the formation of the metal silicide layer MS in the above-described step S12 (that is, the stage of the step corresponding to the above-described FIG. 33).

When a semiconductor element such as a MISFET is formed on the SOI substrate SUB having the element isolation region ST formed thereon, there is a risk that the divot (concave portion, dent portion) DT which is a dent portion is generated in the element isolation region ST as illustrated in FIG. 42 by various steps (for example, by a chemical solution used in the cleaning step or the etching step). When the divot DT is generated in a region (an outer peripheral portion on an upper surface of the element isolation region ST) of the element isolation region ST which is adjacent to the semiconductor layer SM1, the side surface SM1a of the semiconductor layer SM1 which is adjacent to the divot DT is exposed. When the semiconductor layer EP is formed on the semiconductor layer SM1 as described above, the side wall EP1 of the semiconductor layer EP and the side surface (side wall) SM1a of the semiconductor layer SM1 are exposed in a region which is adjacent to the divot DT of the element isolation region ST as illustrated in FIG. 43 in a laminated structure of the semiconductor layer SM1 and the semiconductor layer EP on the semiconductor layer SM1. The phenomenon of the exposure of the side wall EP1 of the semiconductor layer EP and the side surface SM1a of the semiconductor layer SM1 in the region which is adjacent to the divot DT of the element isolation region ST can be caused in not only the case of the formation of the divot DT on the element isolation region ST before the formation of the semiconductor layer EP but also the case of the formation of the divot DT on the element isolation region ST after the formation of the semiconductor layer EP.

Figure 44:
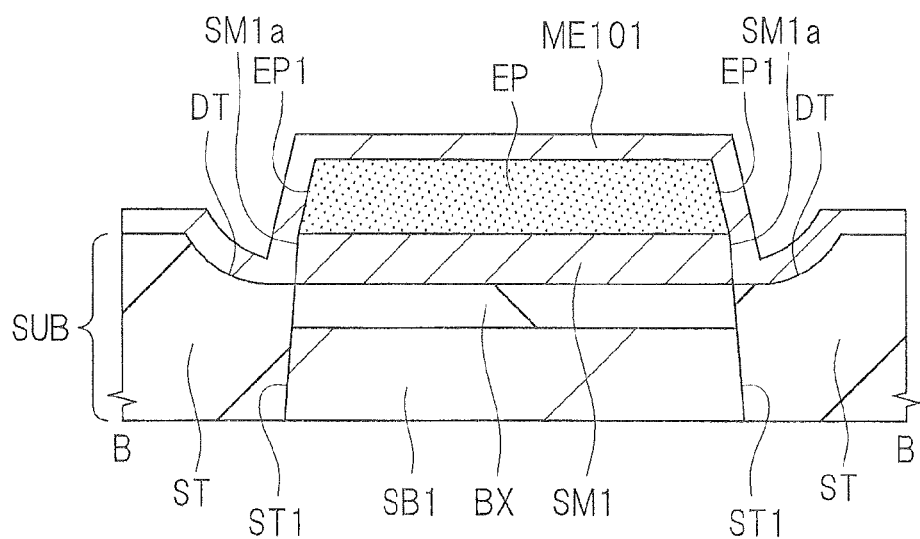
FIG. 44 is a cross-sectional view of a principal part during steps of manufacturing the semiconductor device according to the second study example, continued from FIG. 43.
Figure 45:
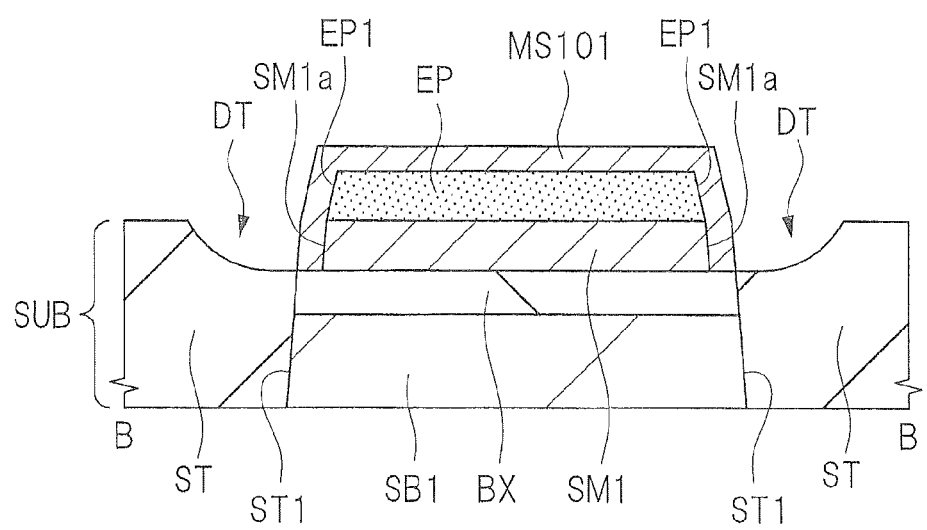
FIG. 45 is a cross-sectional view of a principal part during steps of manufacturing the semiconductor device according to the second study example, continued from FIG. 44.

FIG. 44 and FIG. 45 illustrate a case in which the salicide step is performed in a state of the formation of the divot DT on the element isolation region ST and the exposure of the side wall EP1 of the semiconductor layer EP and the side surface SM1a of the semiconductor layer SM1 in the region which is adjacent to the divot DT. In this case, as illustrated in FIG. 44, when a metal film ME101 corresponding to the above-described metal film ME is formed on the main surface of the SOI substrate SUB, the metal film ME101 is in contact with the side wall EP1 of the semiconductor layer EP and the side surface SM1a of the semiconductor layer SM1 in the region which is adjacent to the divot DT.

FIG. 45 illustrates a state in which a metal silicide layer MS101 corresponding to the above-described metal silicide layer MS is formed by performing the thermal process with the above-described state so as to make the metal film ME101 react with the semiconductor layer EP (however, after the thermal process, unreacted portions of the metal film ME101 are removed). Since the side surface SM1a of the semiconductor layer SM1 is also in contact with the metal film ME101, the metal silicide layer MS101 is formed by the reaction of the metal film ME101 and the semiconductor layers EP, SM1 on not only the upper surface of the semiconductor layer EP but also the side wall EP1 of the semiconductor layer EP and the side surface SM1a of the semiconductor layer SM1.

When a semiconductor device is manufactured by using an SOI substrate SUB having a semiconductor layer SM1 formed via an insulating layer BX on a substrate SB1 which is a supporting substrate, there is a risk that a short circuit or a leakage (leakage current) is generated between the substrate SB1 and the semiconductor layer SM1 due to a divot DT in an element isolation region ST formed on the SOI substrate SUB. The easier occurrence of the risk is, the smaller the thickness of the insulating layer BX becomes (for example, the risk particularly becomes remarkable when the thickness of the insulating layer BX is, for example, about 10 nm or smaller). When the divot DT is generated on the element isolation region ST, the side surface SM1a of the semiconductor layer SM1 is exposed in the region which is adjacent to the divot DT as illustrated in FIG. 42 or FIG. 43, and the metal silicide layer MS101 is formed also on the side surface SM1a of the semiconductor layer SM1 in the salicide step as illustrated in FIG. 44 and FIG. 45, so that this state is a cause of the short circuit or the leakage between the substrate SB1 and the semiconductor layer SM1. For example, the metal silicide layer MS101 formed on the side surface SM1a of the semiconductor layer SM1 abnormally grows towards the insulating layer BX side or others, and therefore, the short circuit or the leakage is caused between the substrate SB1 and the semiconductor layer SM1 via this metal silicide layer MS101. This leads to reduction in the performance of the semiconductor substrate. Also, this leads to reduction in the reliability of the semiconductor device.

On the other hand, in the present embodiment, the sidewall spacer SW3 is formed on the side wall EP1 of the semiconductor device EP. Therefore, as illustrated in FIG. 43, even if the side wall EP1 of the semiconductor layer EP and the side surface SM1a of the semiconductor layer SM1 are exposed in the region which is adjacent to the divot DT in the element isolation region ST, the side wall EP1 of the semiconductor layer EP and the side surface SM1a of the semiconductor layer SM1 are not exposed after the formation of the sidewall spacer SW3 on the side wall EP1 of the semiconductor layer EP as illustrated in FIG. 46.

That is, in the present embodiment, the sidewall spacer SW3 is formed on the side wall EP1 of the semiconductor layer EP, the sidewall spacer SW3 is formed on the side wall EP1 of the semiconductor layer EP and is also positioned on the element isolation region ST. When the divot DT is generated in the element isolation region ST as in FIG. 43, the side surface SM1a of the semiconductor layer SM1 is also exposed in the region which is adjacent to the divot DT, and therefore, by forming the sidewall spacer SW3, the sidewall spacer SW3 is formed on the side wall EP1 of the semiconductor layer EP, and is also positioned on the element isolation region ST, and besides, covers the side surface SM1a of the semiconductor layer SM1 as illustrated in FIG. 46.

Therefore, in the present embodiment, when the metal film ME is formed in the salicide step as illustrated in FIG. 47 after forming the sidewall spacer SW3, the contact of the metal film ME with the side wall EP1 of the semiconductor layer EP and the side surface SM1a of the semiconductor layer SM1 can be prevented or suppressed. Particularly, the contact of the metal film ME with the side surface SM1a of the semiconductor layer SM1 can be prevented. That is, since the side surface SM1a of the semiconductor layer SM1 in the region which is adjacent to the divot DT is also covered with the sidewall spacer SW3 that is formed on the side wall EP1 of the semiconductor layer EP, the sidewall spacer SW3 is interposed between the side surface SM1a of the semiconductor layer SM1 and the metal film ME, so that the contact of the side surface SM1a of the semiconductor layer SM1 with the metal film ME can be prevented.

Therefore, in the present embodiment, when the metal silicide layer MS is formed by performing the thermal process to make the metal film ME and the semiconductor layer EP react, the metal silicide layer MS is formed on the upper surface of the semiconductor layer EP as illustrated in FIG. 48, whereas the formation of the metal silicide layer MS on the side wall EP1 of the semiconductor layer EP and the side surface SM1a of the semiconductor layer SM1 can be prevented since they are not in contact with the metal film ME. Particularly, the formation of the metal silicide layer MS on the side surface SM1a of the semiconductor layer SM1 can be prevented. Note that FIG. 48 illustrates a stage in which unreacted portions of the metal film ME are removed after the thermal process.

Accordingly, in the present embodiment, even if the divot DT is generated in the element isolation region ST formed on the SOI substrate SUB, the short circuit or the leakage (leakage current) between the substrate SB1 and the semiconductor layer SM1 due to the divot DT can be prevented or suppressed. That is, even if the side surface SM1a of the semiconductor layer SM1 is exposed in the region which is adjacent to the divot DT due to generation of the divot DT in the element isolation region ST as illustrated in FIG. 43, the sidewall spacer SW3 formed on the side wall EP1 of the semiconductor layer EP also covers the side surface SM1a of the semiconductor layer SM1 as illustrated in FIG. 46. Therefore, as illustrated in FIG. 47 and FIG. 48, even if the metal silicide layer MS is formed in the salicide step, the formation of the metal silicide layer MS can be prevented on the side surface SM1a of the semiconductor layer SM1, and therefore, the short circuit or the leakage between the substrate SB1 and the semiconductor layer SM1 via the metal silicide layer MS can be prevented or suppressed. Further, even if the metal silicide layer MS abnormally grows, the phenomenon of the abnormal growth of the metal silicide layer MS formed on the side surface SM1a of the semiconductor layer SM1 towards the insulating layer BX side is not generated since the metal silicide layer MS is not formed on the side surface SM1a of the semiconductor layer SM1, and therefore, the short circuit or the leakage between the substrate SB1 and the semiconductor layer SM1 via the abnormally-grown metal silicide layer MS can be prevented or suppressed. Accordingly, the performance of the semiconductor device can be improved. Also, the reliability of the semiconductor device can be improved.

Further, in the present embodiment, even if the side surface SM1a of the semiconductor layer SM1 is exposed due to other cause than the divot DT in the element isolation region ST, the exposed side surface SM1a of the semiconductor layer SM1 can be covered with the sidewall spacer SW3. In this manner, the formation of the metal silicide layer MS on the side surface SM1a of the semiconductor layer SM1 can be prevented, and the performance of the semiconductor device can be improved. Also, the reliability of the semiconductor device can be improved.

Figure 49:
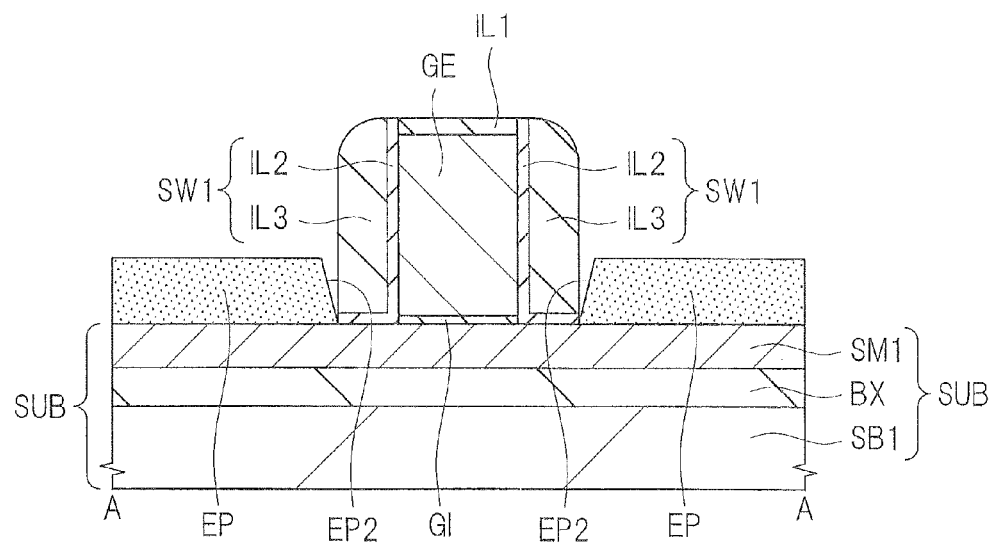
FIG. 49 is a cross-sectional view of a principal part during steps of manufacturing a semiconductor device according to a third study example.
Figure 50:
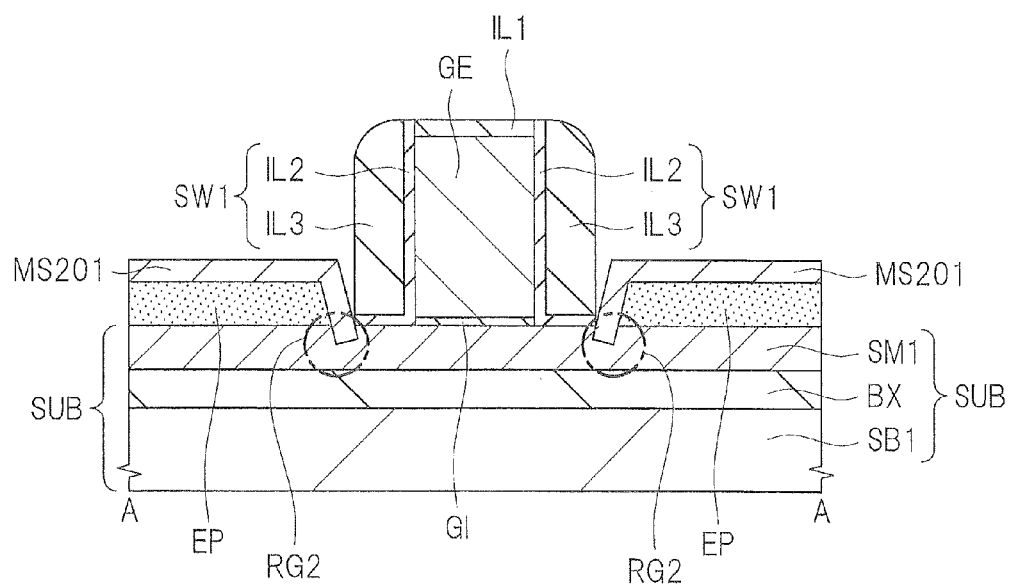
FIG. 50 is a cross-sectional view of a principal part during steps of manufacturing the semiconductor device according to the third study example, continued from FIG. 49.

FIG. 49 and FIG. 50 are cross-sectional views of a principal part during steps of manufacturing the semiconductor device according to the third study example that has been studied by the present inventor.

In the third study example, a semiconductor layer EP for a source/drain is formed in a state in which a sidewall spacer SW1 is formed on side walls of a gate electrode GE as illustrated in FIG. 49. Then, in the third study example, as different from the present embodiment, the salicide step is performed as illustrated in FIG. 50 without the removal of the insulating film IL3 of the sidewall spacer SW1, and besides, without the formation of the sidewall spacer SW2, so as to from a metal silicide layer MS201 (corresponding to the above-described metal silicide layer MS) on an upper portion of the semiconductor layer EP.

Therefore, in the third study example of FIG. 49 and FIG. 50, the sidewall spacer SW1 formed on the side walls of the gate electrode GE does not rise up over the semiconductor layer EP, and the metal silicide layer MS201 is formed in this state, and therefore, the metal silicide layer MS201 is easy to be formed on not only the upper surface of the semiconductor layer EP but also the side surface (side wall) EP2 of the semiconductor layer EP on the gate electrode GE side. Here, the side surface EP2 of the semiconductor layer EP corresponds to the side surface (side wall) on a side which is opposite to the gate electrode GE (and thus, a side which is opposite to the sidewall spacer SW1 at the stage of growing the semiconductor layer EP).

When the metal silicide layer MS201 is formed on the side surface EP2 of the semiconductor layer EP, there is a risk of occurrence of a region having the thinned effective thickness of the semiconductor region of the semiconductor layer SM1 due to the abnormal growth of the metal silicide layer MS201 formed on the side surface EP2 of the semiconductor layer EP towards the semiconductor layer SM1 side or others. For example, in a region RG2 illustrated in FIG. 50, the effective thickness of the semiconductor layer SM1 is thinned since the metal silicide layer MS201 formed on the side surface EP2 of the semiconductor layer EP grows so as to reach inside of the semiconductor layer SM1, This leads to a risk of reduction in the performance of the semiconductor device because a current path is narrowed to increase a resistance component (parasitic resistance). Therefore, in order to achieve further improvement in the performance of the semiconductor device, it is desired to suppress or prevent the formation of the metal silicide layer MS201 on the side surface EP2 of the semiconductor device EP.

On the other hand, in the present embodiment, the sidewall spacer SW2 is partially positioned on (rises up over) the semiconductor layer EP. In forming the metal silicide layer MS in the salicide step, the metal silicide layer MS can be formed on the exposed portion of the surface of the semiconductor layer EP without being covered with the sidewall spacer SW2 by contacting the metal film ME. On the other hand, the metal silicide layer MS is difficult to be formed on the covered portion of the surface of the semiconductor layer EP covered with the sidewall spacer SW2 because the covered portion is not in contact with the metal film ME. Therefore, when the sidewall spacer SW2 partially rises up over the semiconductor layer EP as in the present embodiment, it is difficult to form the metal silicide layer MS on of the covered portion of the surface of the semiconductor layer EP covered with the sidewall spacer SW2, and it is difficult to form the metal silicide layer MS on the side surface EP2 (particularly below the side surface EP2) of the semiconductor layer EP. In this manner, the formation of the metal silicide layer MS on the side surface EP2 of the semiconductor layer EP so as to grow to reach the inside of the semiconductor layer SM1 can be prevented or suppressed. Accordingly, the thinned effective thickness of the semiconductor region in the semiconductor layer SM1 can be prevented or suppressed. Therefore, the performance of the semiconductor device can be improved.

The problem explained with reference to the above-described FIG. 49 and FIG. 50 (third study example) tends to occur when the side surface EP2 of the semiconductor layer EP is inclined (in this case, an angle formed between the side surface EP2 of the semiconductor layer EP and the upper surface of the semiconductor layer SM1 is an acute angle). Therefore, when the side surface EP2 of the semiconductor layer EP is inclined, effects are large when a manner in which the sidewall spacer SW2 is partially positioned on (rises up over) the semiconductor layer EP as in the present embodiment. Further, the problem explained with reference to the above-described FIG. 44 and FIG. 45 (second study example) could be caused in both of the substantially vertical case of the side wall EP1 of the semiconductor layer EP with respect to the main surface of the SOI substrate SUB and the inclined case of the side wall EP1 of the semiconductor layer EP thereto. Therefore, effects can be achieved by applying the formation of the sidewall spacer SW3 on the side wall EP1 of the semiconductor layer EP as in the present embodiment to either of the case substantially vertical of the side wall EP1 of the semiconductor layer EP with respect to the main surface of the SOI substrate SUB and the inclined case of the side wall EP1 of the semiconductor layer EP thereto.

Further, in the present embodiment, ion implantation for forming an $n^+$ type semiconductor region SD (corresponding to step S10) is performed in the state in which the sidewall spacer SW2 is partially positioned on (rises up over) the semiconductor layer EP. Therefore, even in the inclined case of the side surface EP2 of the semiconductor layer EP, a thinned portion of the semiconductor layer EP because of the inclination of the side surface EP2 can be covered with the sidewall spacer SW2, it is difficult to implant ions to the thinned portion by the ion implantation for forming the $n^+$ type semiconductor region SD. The ion implantation for the source/drain (corresponding to the ion implantation for forming an $n^+$ type semiconductor region SD) is performed at a high dose amount, and there is a risk that, if the semiconductor layer to be ion-implanted has the thinned region, a state of the region becomes firmly an amorphous state due to implanting damages. On the other hand, in the present embodiment, since the sidewall spacer SW2 is partially positioned on (rises up over) the semiconductor layer EP, the thinned portion of the semiconductor layer EP can be covered with the sidewall spacer SW2, and it can be suppressed or prevented to cause the amorphous state of the portion due to the implantation damage thereon by the ion implantation (corresponding to step S10) for forming the $n^+$ type semiconductor region SD.

Further, in the present embodiment, the sidewall spacer SW2 partially is positioned on (rises up over) the semiconductor layer EP. Therefore, in the substantially vertical case of the side surface EP2 of the semiconductor layer EP with respect to the main surface of the SOI substrate SUB, the sidewall spacer SW2 partially is positioned on (rises up over) the upper surface of the semiconductor layer EP so as to extend beyond the side surface EP2. That is, an outer end portion of the sidewall spacer SW2 in a gate length direction is positioned on the upper surface of the semiconductor layer EP. On the other hand, in the inclined case of the side surface EP2 of the semiconductor layer EP thereto, the outer end portion of the sidewall spacer SW2 in the gate length direction is positioned on either the side surface EP2 of the semiconductor layer EP or the upper surface of the semiconductor layer EP so as to extend beyond the side surface EP2 (in this case, the entire side surface EP2 is covered with the sidewall spacer SW2). And, the latter is more preferable, and the above-described effects can be enhanced by this arrangement.

Further, in the present embodiment, the sidewall spacer SW2 is formed on the side walls of the gate electrode GE and the sidewall spacer SW3 is formed on the side wall (EP1) of the semiconductor layer EP in step S9. Since the sidewall spacer SW2 and the sidewall spacer SW3 are formed of the same insulating film (IL4) as each other in the same step, the number of steps of manufacturing the semiconductor device can be suppressed.

Further, in the present embodiment, the sidewall spacer SW1 is formed on the side walls of the gate electrode GE in step S4, and then, the semiconductor layer EP is formed in step S5, and the oxide film OX1 is formed on the surface of the semiconductor layer EP in step S6. Then, at least a part of the sidewall spacer SW1 (here, the insulating film IL3 forming the sidewall spacer SW1) is removed in step S7, and then, the sidewall spacer SW2 is formed on the side walls of the gate electrode GE in step S9.

When the semiconductor layer EP is formed without forming the sidewall spacer SW1 as different from the present embodiment, the semiconductor layer EP is adjacent to the gate electrode GE, and there is a risk that the leakage current is generated between the semiconductor layer EP and the gate electrode GE or that the short circuit due to the contact of the semiconductor layer EP and the gate electrode GE is generated therebetween.

On the other hand, in the present embodiment, the sidewall spacer SW1 is formed on the side walls of the gate electrode GE in step S4, and then, the semiconductor layer EP is formed in step S5. Therefore, the position of forming the semiconductor layer EP can be separated from the gate electrode GE in the gate length direction by the thickness of the sidewall spacer SW1 (thickness in the gate length direction). Therefore, the leakage current generated between the semiconductor layer EP and the gate electrode GE or the contact of the semiconductor layer EP and the gate electrode GE to cause the short circuit therebetween can be accurately prevented. Accordingly, the performance of the semiconductor device can be improved. Further, the reliability of the semiconductor device can be improved.

When the step of forming the sidewall spacer SW2 is performed without removing the sidewall spacer SW1 at all after forming the semiconductor layer EP as different from the present embodiment, the position of forming the n$^+$ type semiconductor region SD and the position of forming the metal silicide layer MS are separated from the gate electrode GE (in the gate length direction) by total of the thickness of the sidewall spacer SW1 and the thickness of the sidewall spacer SW2. In this case, there is a risk that the positions of forming the n$^+$ type semiconductor region SD or the metal silicide layer MS are too far from a channel forming region.

On the other hand, in the present embodiment, at least a part of the sidewall spacer SW1 (here, the insulating film IL3 forming the sidewall spacer SW2) is removed after forming the semiconductor layer EP, and then, the step of forming the sidewall spacer SW2 is performed. Therefore, the positions of forming the n$^+$ type semiconductor region SD and the metal silicide layer MS are not too far from the channel forming region, so that the positions thereof can be optimized. That is, the position of forming of the semiconductor layer EP can be controlled to be at an optimum position by the thickness of the sidewall spacer SW1 (thickness in the gate length direction), and the positions of forming of the n$^+$ type semiconductor region SD and the metal silicide layer MS can be controlled at optimum positions by the thickness of the sidewall spacer SW2 (thickness in the gate length direction) without being affected by the thickness of the sidewall spacer SW1. Therefore, each of the position of forming the semiconductor layer EP and the positions of forming of the n$^+$ type semiconductor region SD and the metal silicide layer MS can be optimized.

Further, in the present embodiment, the ion implantation step for forming the n+ type semiconductor region EX of step S8 is performed after removing at least a part of the sidewall spacer SW1 (here, the insulating film IL3 forming the sidewall spacer SW1) in step S7 but before forming the sidewall spacer SW2 in step S9. As another aspect, an ion implanting step for forming the n$^-$ type semiconductor region EX corresponding to step S8 can be performed after forming the gate electrode GE in step S3 but before forming the sidewall spacer SW1 in step S4. In this case, the gate electrode GE is functioned as a mask (ion implantation preventing mask), and an n-type impurity is ion-implanted to regions on both sides of the gate electrode GE on the semiconductor layer SM1 so as to form the n$^-$ type semiconductor region EX.

However, as compared with a case in which the ion implantation for forming the n$^-$ type semiconductor region EX is performed before forming the sidewall spacer SW1 in step S4, the case of the present embodiment in which step S8 (ion implantation step for forming the n$^-$ type semiconductor region EX) is performed between step S7 and step S9 has the following advantages. That is, when the impurity concentration of the semiconductor region which is the base is high, an epitaxial layer tends to be difficult to grow, and its growing speed tends to be slow. In the present embodiment, the ion implantation step for forming the n$^-$ type semiconductor region EX is not performed before forming the sidewall spacer SW1 in step S4, but the ion implantation step for forming the n$^-$ type semiconductor region EX is performed in step S8 after forming the semiconductor layer EP in step S5. Therefore, the semiconductor layer EP can be epitaxially grown in step S5 on the semiconductor layer SM1 without performing the ion implantation step for forming the n$^-$ type semiconductor region EX. Therefore, the impurity concentration of the semiconductor layer SM1 which is the base of the semiconductor layer EP can be reduced when the semiconductor layer EP is epitaxially grown in step S5, and therefore, it is easier to grow the semiconductor layer EP, so that the growing speed of the semiconductor layer EP can be enhanced. In this manner, the semiconductor layer EP can be accurately formed, so that the performance of the semiconductor device can be improved. Further, the time required for the step of forming the semiconductor layer EP can be shortened, so that the throughput of the semiconductor device can be improved.

When the step of forming the sidewall spacer SW2 is performed after forming the semiconductor layer EP without removing the sidewall spacer SW1 at all as different from the present embodiment, the ion implantation for forming the n type semiconductor region EX is performed without forming the sidewall spacer SW1 on the side walls of the gate electrode GE. In this case, the sidewall spacer SW1 is functioned as a mask (ion implantation preventing mask), and therefore, it is difficult to form the n$^-$ type semiconductor region EX at a position which is adjacent to the channel forming region.

On the other hand, in the present embodiment, at least a part (here, the insulating film IL3 forming the sidewall spacer SW1) of the sidewall spacer SW1 is removed after forming the semiconductor layer EP, and then, the step of forming the sidewall spacer SW2 is performed. Therefore, the ion implanting step for forming the n$^-$ type semiconductor region EX can be performed in step S8 with removing at least the part (here, the insulating film IL3 forming the sidewall spacer SW1) of the sidewall spacer SW1. Therefore, the n$^-$ type semiconductor region EX can be accurately formed at the position which is adjacent to the channel forming region. Further, an overlapping amount between the n$^-$ type semiconductor region EX and the gate electrode GE can be controlled by a thickness of a remaining portion (here, a thickness of an insulating film IL2 remaining on the side walls of the gate electrode GE after step S7) when at least the part SW1 (here, the insulating film IL3 forming the sidewall spacer SW1) of the sidewall spacer is removed in step S7.

In the foregoing, the invention made by the present inventor has been concretely described based on the embodiments. However, it is needless to say that the present invention is not limited to the foregoing embodiments and various modifications and alterations can be made within the scope of the present invention.

What is claimed is:
1. A method of manufacturing a semiconductor device, the method comprising:
 preparing a semiconductor substrate;
 forming a gate electrode on the semiconductor substrate via a gate insulating film;
 forming a laminated film on the semiconductor substrate so as to cover the gate electrode, the laminated film including a first insulating film and a second insulating film disposed on the first insulating film;

forming a first side wall insulating film, comprising the laminated film, on a side wall of the gate electrode by etching back the laminated film;

epitaxially growing an epitaxial semiconductor layer on a portion of an exposed surface of the semiconductor substrate which is not covered with the gate electrode such that an edge of a bottom surface of the first insulating film of the first side wall insulating film is exposed outside the epitaxial semiconductor layer, said edge of the bottom surface of the second insulating film facing the epitaxial semiconductor layer;

forming an oxide film on a surface of the epitaxial semiconductor layer by oxidizing the surface of the epitaxial semiconductor layer;

after the forming of the oxide film, removing the second insulating film forming the first side wall insulating film;

after the forming of the oxide film, removing the oxide film;

after the removing the oxide film, forming a third insulating film on the semiconductor substrate so as to cover the gate electrode and the epitaxial semiconductor layer; and forming the second side wall insulating film formed of the third insulating film on the side wall of the gate electrode via the first insulating film by etching back the third insulating film.

2. The method of manufacturing the semiconductor device according to claim 1, wherein, in the removing the second insulating film, the second insulating film forming the first side wall insulating film is removed by performing etching under such a condition as causing the first insulating film and the oxide film to be more difficult to be etched than the second insulating film.

3. The method of manufacturing the semiconductor device according to claim 2, wherein, in the removing the second insulating film, the second insulating film forming the first side wall insulating film is removed by performing etching under such a condition as causing the oxide film to be more difficult to be etched than the epitaxial semiconductor layer.

4. The method of manufacturing the semiconductor device according to claim 3, wherein, in the removing the second insulating film, wet etching is used.

5. The method of manufacturing the semiconductor device according to claim 4, wherein the first insulating film comprises silicon oxide.

6. The method of manufacturing the semiconductor device according to claim 5, wherein the second insulating film comprises silicon nitride.

7. The method of manufacturing the semiconductor device according to claim 6, wherein the epitaxial semiconductor layer comprises a silicon layer, and
wherein the oxide film comprises silicon oxide.

8. The method of manufacturing the semiconductor device according to claim 1, wherein, in the removing the second insulating film, the first insulating film forming the first side wall insulating film remains to be layered.

9. The method of manufacturing the semiconductor device according to claim 1, wherein a thickness of the oxide film formed in the faulting of the oxide film is 2 nm or larger.

10. The method of manufacturing the semiconductor device according to claim 9, wherein the thickness of the oxide film Ruined in the forming of the oxide film is 5 nm or smaller.

11. The method of manufacturing the semiconductor device according to claim 1, wherein, in the removing the second insulating film, the oxide film remains on the surface of the epitaxial semiconductor layer.

12. The method of manufacturing the semiconductor device according to claim 1, wherein the second side wall insulating film formed in the forming the second side wall insulating film is partially positioned on the epitaxial semiconductor layer.

13. The method of manufacturing the semiconductor device according to claim 1, wherein, in the forming the second side wall insulating film, a third side wall insulating film formed of the third insulating film is formed on a side wall of the epitaxial semiconductor layer.

14. The method of manufacturing the semiconductor device according to claim 1, wherein the epitaxial semiconductor layer comprises a semiconductor layer for source/drain.

15. The method of manufacturing the semiconductor device according to claim 1, wherein, in the preparing of the semiconductor substrate, the semiconductor substrate including a supporting substrate, an insulating layer on the supporting substrate, and a first semiconductor layer on the insulating layer is prepared,
wherein, in the forming the gate electrode, the gate electrode is formed on the first semiconductor layer of the semiconductor substrate via the gate insulating film, and
wherein, in the epitaxially growing the epitaxial semiconductor layer, the epitaxial semiconductor layer is epitaxially grown on a portion of the first semiconductor layer which is not covered with the gate electrode and the first side wall insulating film but is exposed.

16. The method of manufacturing the semiconductor device according to claim 1, further comprising:
after the forming the second side wall insulating film, forming a reaction layer of metal and the epitaxial semiconductor layer on the epitaxial semiconductor layer.

17. The method of manufacturing the semiconductor device according to claim 1,
wherein, in the forming the gate electrode, a third insulating film is formed on the gate electrode, and
wherein, in the removing the second insulating film, the third insulating film on the gate electrode is removed.

18. The method of manufacturing the semiconductor device according to claim 1, further comprising:
after the removing the second insulating film, ion-implanting an impurity to the epitaxial semiconductor layer in a state of existence of the oxide film on the epitaxial semiconductor layer.

19. The method of manufacturing the semiconductor device according to claim 1, wherein an edge of a bottom surface of the first insulating film of the first side wall insulating film is exposed outside the epitaxial semiconductor layer.

20. The method of manufacturing the semiconductor device according to claim 19, wherein said edge of the bottom surface of the second insulating film faces the epitaxial semiconductor layer.

* * * * *